(12) United States Patent
Chuang et al.

(10) Patent No.: US 12,520,543 B2
(45) Date of Patent: Jan. 6, 2026

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Tsung-Han Chuang, Tainan (TW); Zhi-Chang Lin, Zhubei (TW); Shih-Cheng Chen, New Taipei (TW); Jung-Hung Chang, Changhua County (TW); Chien Ning Yao, Hsinchu (TW); Kai-Lin Chuang, Chia-Yi (TW); Kuo-Cheng Chiang, Zhubei (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 673 days.

(21) Appl. No.: 17/663,463

(22) Filed: May 16, 2022

(65) Prior Publication Data

US 2023/0178600 A1 Jun. 8, 2023

Related U.S. Application Data

(60) Provisional application No. 63/265,114, filed on Dec. 8, 2021.

(51) Int. Cl.
*H10D 62/10* (2025.01)
*H10D 30/01* (2025.01)
*H10D 30/67* (2025.01)
*H10D 64/01* (2025.01)
(Continued)

(52) U.S. Cl.
CPC ......... *H10D 62/118* (2025.01); *H10D 30/031* (2025.01); *H10D 30/6713* (2025.01); *H10D 30/6757* (2025.01); *H10D 64/017* (2025.01); *H10D 64/018* (2025.01);
(Continued)

(58) Field of Classification Search
CPC ....... H01L 21/823431; H01L 29/42392; H01L 29/66787; H01L 29/0673; H01L 29/0669; H01L 21/823481; H01L 21/823878; H01L 29/78696
See application file for complete search history.

(56) References Cited

U.S. PATENT DOCUMENTS

2018/0301564 A1* 10/2018 Kwon ................. H01L 29/0653
2019/0067125 A1* 2/2019 Chiang ............... H01L 29/0653
2019/0109052 A1* 4/2019 Reznicek ........ H01L 21/823431
(Continued)

FOREIGN PATENT DOCUMENTS

TW 202145570 A 12/2021

*Primary Examiner* — Steven B Gauthier
*Assistant Examiner* — E. Rhett Cheek
(74) *Attorney, Agent, or Firm* — Slater Matsil, LLP

(57) ABSTRACT

A method for forming a semiconductor device structure is provided. The semiconductor device structure includes a plurality of first nanostructures stacked over a substrate in a vertical direction. The semiconductor device structure includes a first bottom layer formed adjacent to the first nanostructures, and a first insulating layer formed over the first bottom layer. The semiconductor device structure includes a first source/drain (S/D) structure formed over the first insulating layer, and the first insulating layer is in direct contact with one of the first nanostructures.

20 Claims, 60 Drawing Sheets

(51) Int. Cl.
    *H10D 84/01*     (2025.01)
    *H10D 84/03*     (2025.01)

(52) U.S. Cl.
    CPC ....... *H10D 84/0128* (2025.01); *H10D 84/013* (2025.01); *H10D 84/0158* (2025.01); *H10D 84/038* (2025.01)

(56) References Cited

U.S. PATENT DOCUMENTS

| | | | |
|---|---|---|---|
| 2020/0006333 A1* | 1/2020 | Noh | H01L 29/78696 |
| 2020/0328208 A1* | 10/2020 | Chiang | H01L 21/823431 |
| 2022/0310456 A1* | 9/2022 | Hall | H01L 21/823807 |

* cited by examiner

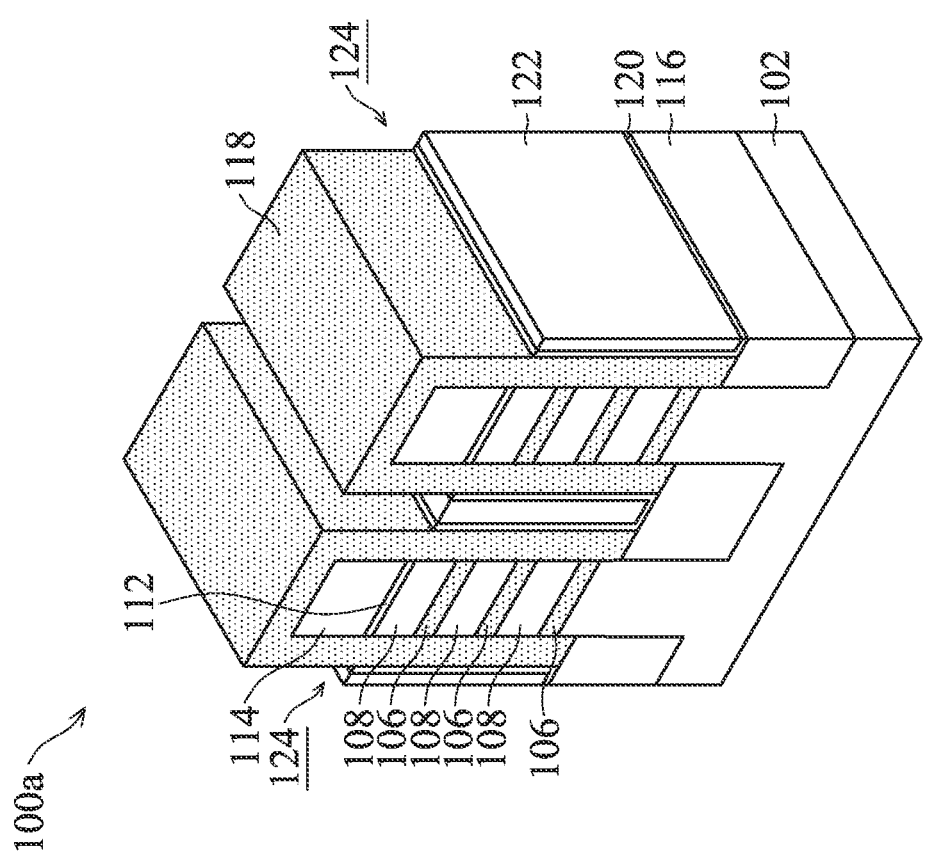
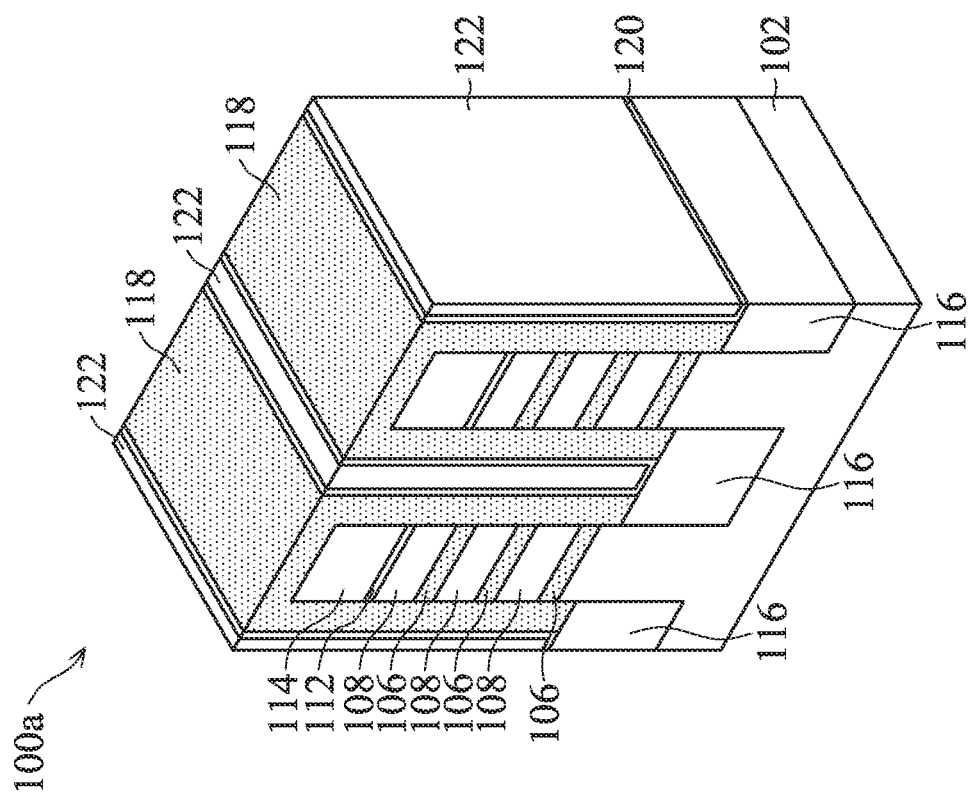
FIG. 2H
FIG. 2G

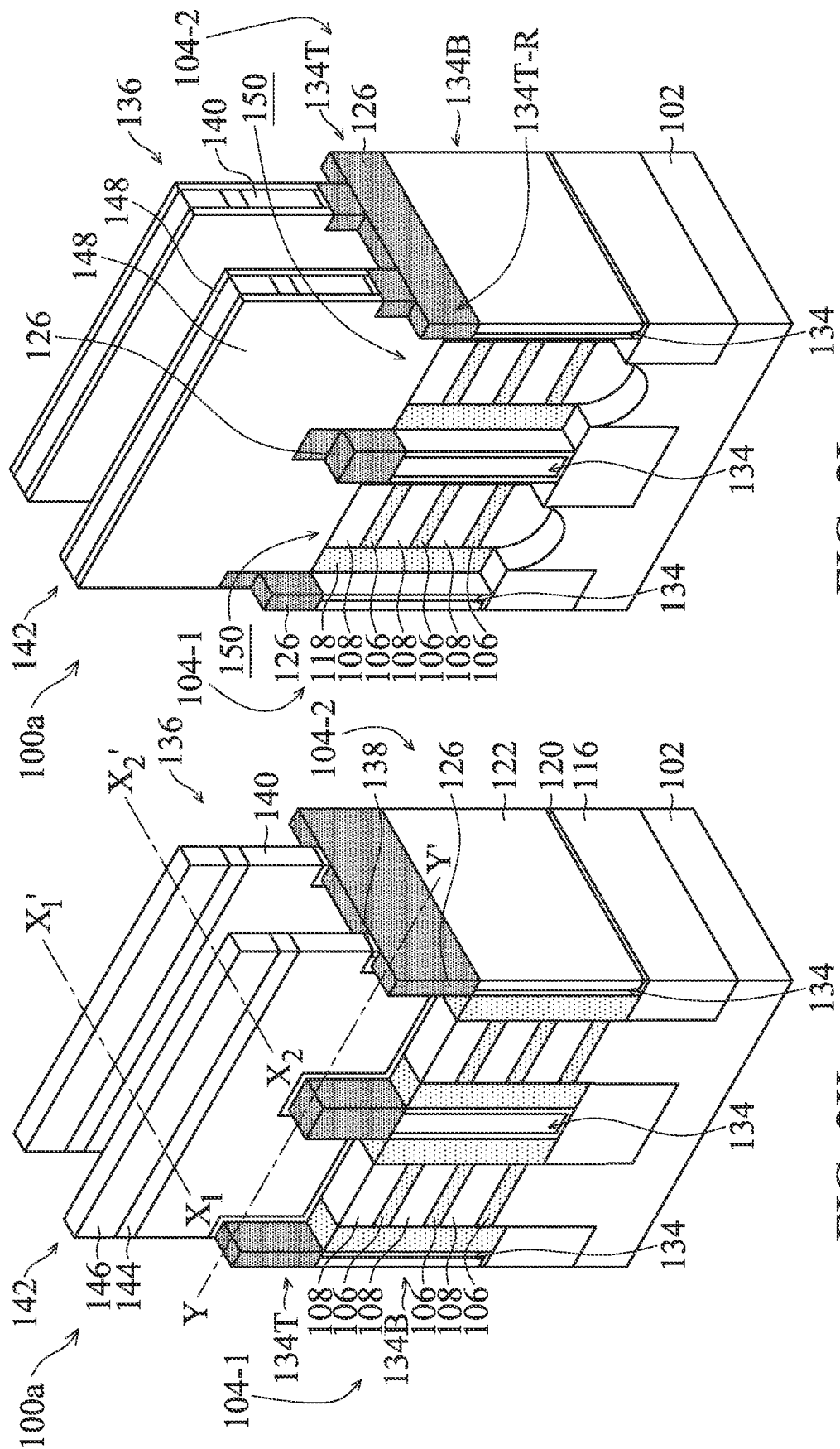

SEMICONDUCTOR DEVICE STRUCTURE AND METHOD FOR FORMING THE SAME

CROSS REFERENCE TO RELATED APPLICATIONS

This application claims the benefit of U.S. Provisional Application No. 63/265,114 filed on Dec. 8, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A to 2L illustrate perspective views of intermediate stages of manufacturing a semiconductor structure, in accordance with some embodiments.

FIGS. 3A-1 to 3P-1 show cross-sectional representations of various stages of forming the semiconductor device structure along line X1-X1' and X2-X2' shown in FIG. 2K, in accordance with some embodiments of the disclosure.

FIGS. 3A-2 to 3P-2 show cross-sectional representations of various stages of forming the semiconductor device structure along line Y-Y' shown in FIG. 2K, in accordance with some embodiments of the disclosure.

FIGS. 3A'-2 to 3P'-2 show cross-sectional representations of various stages of forming a semiconductor device structure.

FIG. 4A-1 show a cross-sectional representation of a semiconductor device structure along line $X_1$-$X_1$' and $X_2$-$X_2$' shown in FIG. 2K, in accordance with some embodiments of the disclosure.

FIG. 4A-2 shows a cross-sectional representation of the semiconductor device structure along line Y-Y' shown in FIG. 2K, in accordance with some embodiments of the disclosure.

FIG. 4A'-2 shows a cross-sectional representation of forming the semiconductor device structure.

FIG. 5A-1 show a cross-sectional representation of a semiconductor device structure along line $X_1$-$X_1$' and $X_2$-$X_2$' shown in FIG. 2K, in accordance with some embodiments of the disclosure.

FIG. 5A-2 shows a cross-sectional representation of the semiconductor device structure along line Y-Y' shown in FIG. 2K, in accordance with some embodiments of the disclosure.

FIG. 5A'-2 shows a cross-sectional representation of forming the semiconductor device structure.

FIG. 9A-1 shows a cross-sectional representation of the semiconductor device structure, in accordance with some embodiments.

FIG. 9A-2 shows a cross-sectional representation of the semiconductor device structure along line Y-Y' shown in FIG. 2K, in accordance with some embodiments of the disclosure.

FIG. 9A'-2 shows a cross-sectional representation of forming the semiconductor device structure.

FIG. 10A-1 show a cross-sectional representation of the semiconductor device structure along line $X_1$-$X_1$' and $X_2$-$X_2$' shown in FIG. 2K, in accordance with some embodiments of the disclosure.

FIG. 10A-2 shows a cross-sectional representation of the semiconductor device structure along line Y-Y' shown in FIG. 2K, in accordance with some embodiments of the disclosure.

FIG. 10A'-2 shows a cross-sectional representation of forming the semiconductor device structure.

FIG. 11A-1 show a cross-sectional representation of the semiconductor device structure along line $X_1$-$X_1$' and $X_2$-$X_2$' shown in FIG. 2K, in accordance with some embodiments of the disclosure.

FIG. 11A-2 shows a cross-sectional representation of the semiconductor device structure along line Y-Y' shown in FIG. 2K, in accordance with some embodiments of the disclosure.

FIG. 11A'-2 shows a cross-sectional representation of forming the semiconductor device structure.

FIG. 12A-1 shows a cross-sectional representation of the semiconductor device structure, in accordance with some embodiments.

FIG. 12A-2 shows a cross-sectional representation of the semiconductor device structure along line Y-Y' shown in FIG. 2K, in accordance with some embodiments of the disclosure.

FIG. 12A'-2 shows a cross-sectional representation of forming the semiconductor device structure.

FIGS. 13A-1 to 13E-1 show cross-sectional representations of various stages of forming the semiconductor device structure along line $X_1$-$X_1$' and $X_2$-$X_2$' shown in FIG. 2K, in accordance with some embodiments of the disclosure.

FIGS. 13A-2 to 13E-2 show cross-sectional representations of various stages of forming the semiconductor device structure along line Y-Y' shown in FIG. 2K, in accordance with some embodiments of the disclosure.

FIGS. 13A'-2 to 13E'-2 show cross-sectional representations of various stages of forming the semiconductor device structure.

FIG. 14A-1 show a cross-sectional representation of the semiconductor device structure along line $X_1$-$X_1'$ and $X_2$-$X_2'$ shown in FIG. 2K, in accordance with some embodiments of the disclosure.

FIG. 14A-2 shows a cross-sectional representation of the semiconductor device structure along line Y-Y' shown in FIG. 2K, in accordance with some embodiments of the disclosure.

FIG. 14A'-2 shows a cross-sectional representation of forming the semiconductor device structure.

FIG. 15A-1 show a cross-sectional representation of the semiconductor device structure along line $X_1$-$X_1'$ and $X_2$-$X_2'$ shown in FIG. 2K, in accordance with some embodiments of the disclosure.

FIG. 15A-2 shows a cross-sectional representation of the semiconductor device structure along line Y-Y' shown in FIG. 2K, in accordance with some embodiments of the disclosure.

FIG. 15A'-2 shows a cross-sectional representation of forming the semiconductor device structure.

DETAILED DESCRIPTION

Figure 1:
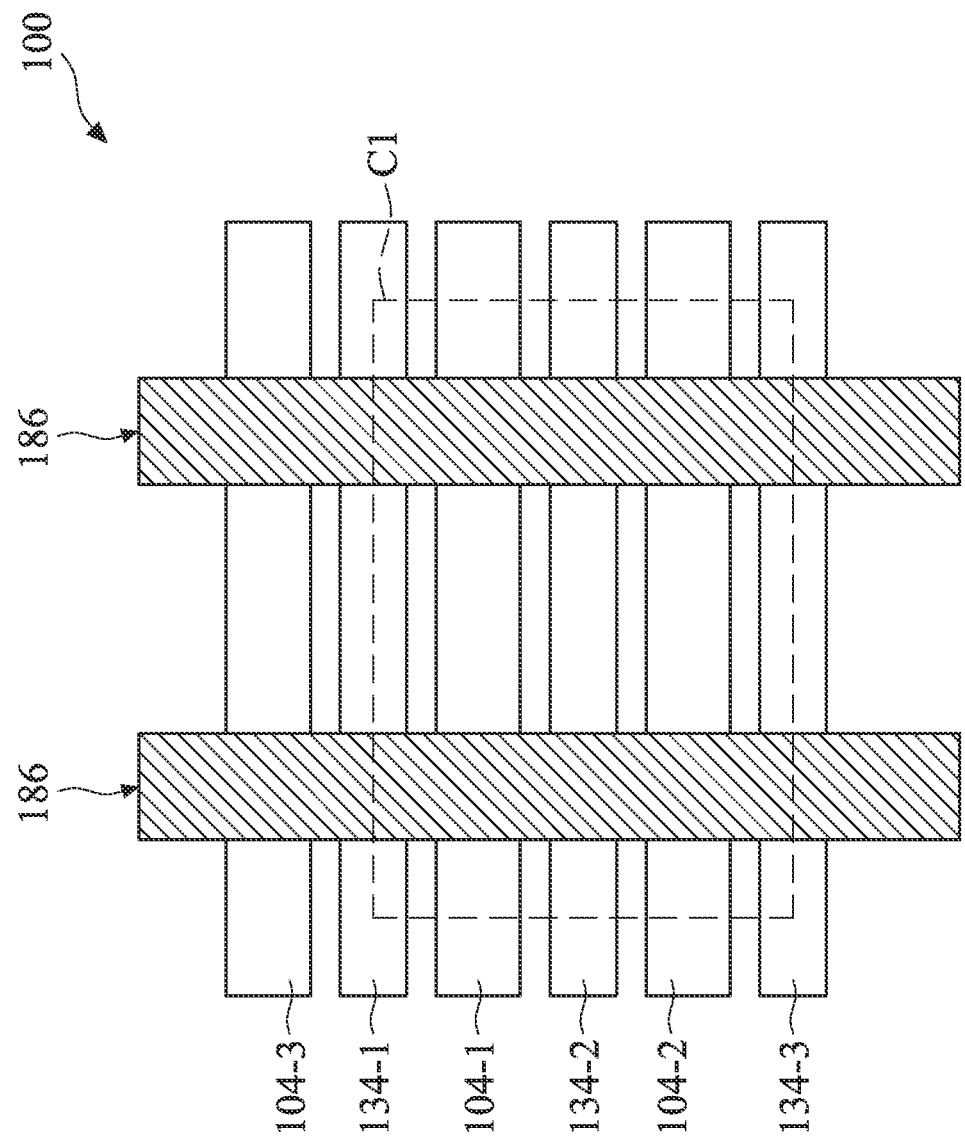
FIG. 1 shows a top view of a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor device structure are provided. The semiconductor device structure may include nanostructures (e.g., nano-wires, nano-sheets, or the like) formed over a substrate and a gate structure wraps around the nanostructures. The insulating layer is formed adjacent to the nanostructure, and the source/drain structure ("S/D structure") is formed over the insulating layer. The insulating layer is used to define the effective (or active) number of the nanostructures to control the effective width of the channel.

FIG. 1 shows a top view of a semiconductor structure 100, in accordance with some embodiments. FIG. 1 has been simplified for the sake of clarity to better understand the inventive concepts of the present disclosure. Additional features may be added in the semiconductor structure 100, and some of the features described below may be replaced, modified, or eliminated.

The semiconductor structure 100 may include nanostructure devices or other multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

FIGS. 2A to 2L illustrate perspective views of intermediate stages of manufacturing a semiconductor structure 100a in accordance with some embodiments. More specifically, FIGS. 2A to 2L illustrate diagrammatic perspective views of intermediate stages of manufacturing the semiconductor structure 100a shown in the dotted line block $C_1$ of FIG. 1.

Figure 2B:
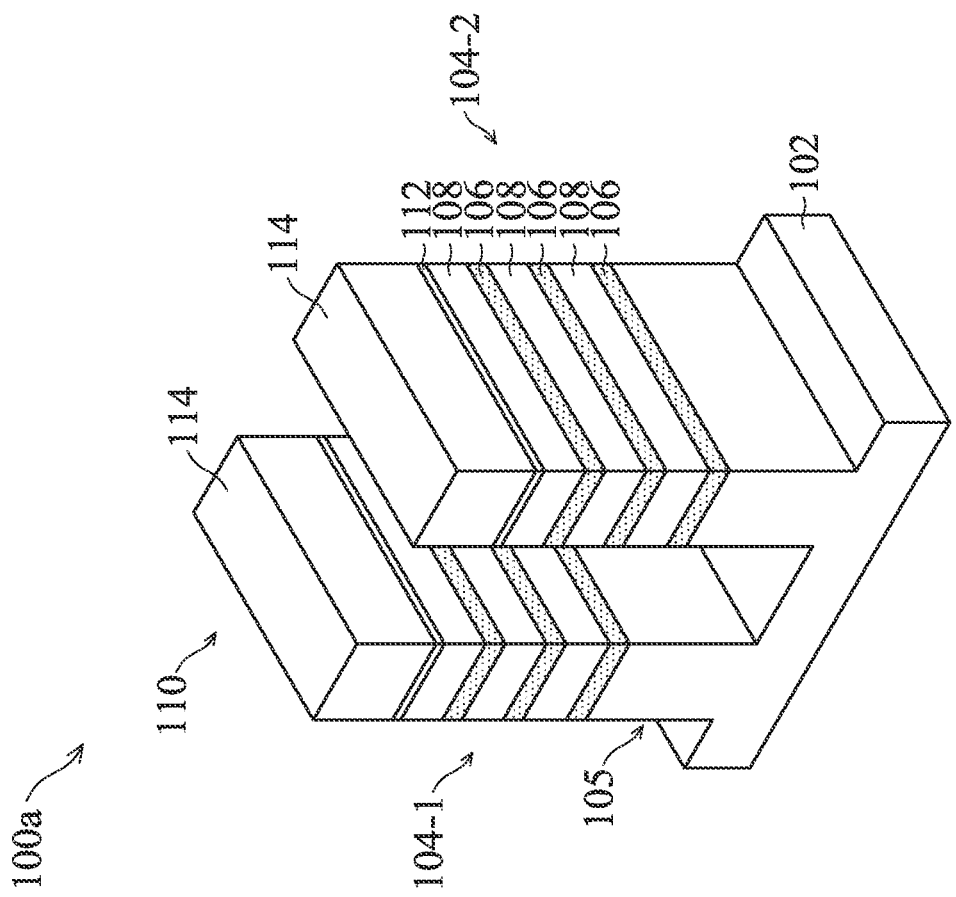
Figure 2A:
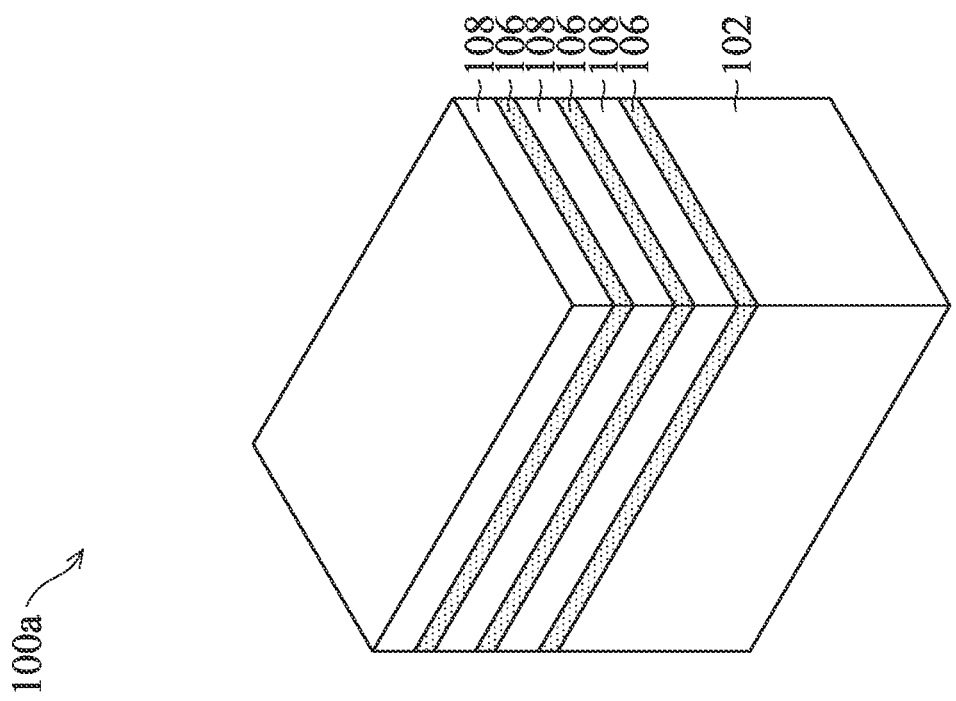

As shown in FIG. 2A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 106 and a number of second semiconductor layers 108 are sequentially and alternately formed over the substrate 102. The first semiconductor layers 106 and the second semiconductor layers 108 are vertically stacked to form a stacked nanostructure (or a stacked nanosheet or a stacked nanowire).

In some embodiments, the first semiconductor layers 106 and the second semiconductor layers 108 include silicon (Si), germanium (Ge), silicon germanium ($Si_{1-x}Ge_x$, 0.1<x<0.7, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 106 and the second semiconductor layer 108 are made of different materials.

The first semiconductor layers 106 and the second semiconductor layers 108 are made of different materials and/or have different lattice constants. In some embodiments, the first semiconductor layer 106 is made of silicon germanium ($Si_{1-x}Ge_x$, 0.1<x<0.7), and the second semiconductor layer 108 is made of silicon (Si). In some other embodiments, the first semiconductor layer 106 is made of silicon (Si), and the second semiconductor layer 108 is made of silicon germanium ($Si_{1-x}Ge_x$, 0.1<x<0.7).

In some embodiments, the first semiconductor layers 106 and the second semiconductor layers 108 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 106 and the second semiconductor layers 108 are formed in-situ in the same chamber.

In some embodiments, the thickness of each of the first semiconductor layers 106 is in a range from about 1.5 nanometers (nm) to about 20 nm. In some embodiments, the first semiconductor layers 106 are substantially uniform in thickness. In some embodiments, the thickness of each of the second semiconductor layers 108 is in a range from about 1.5 nm to about 20 nm. In some embodiments, the second semiconductor layers 108 are substantially uniform in thickness.

Then, as shown in FIG. 2B, the first semiconductor layers 106 and the second semiconductor layers 108 are patterned to form fin structures 104-1 and 104-2, in accordance with some embodiments of the disclosure. In some embodiments, the fin structures 104-1 and 104-2 include base fin structures 105 and the semiconductor material stacks, including the first semiconductor layers 106 and the second semiconductor layers 108, formed over the base fin structure 105.

The fin structures 104-1 and 104-2 may be patterned by any suitable method. For example, in some embodiments, the patterning process includes forming mask structures 110 over the semiconductor material stack, and etching the semiconductor material stack and the underlying substrate 102 through the mask structure 110. In some embodiments, the mask structures 110 are a multilayer structure including a pad oxide layer 112 and a nitride layer 114 formed over the pad oxide layer 112. The pad oxide layer 112 may be made of silicon oxide, which may be formed by thermal oxidation or CVD, and the nitride layer 114 may be made of silicon nitride, which may be formed by CVD, such as LPCVD or plasma-enhanced CVD (PECVD).

Other processes may be used to pattern the fin structures 104-1 and 104-2. For example, the structures may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor (e.g. nanosheet transistor, nanowire transistor, multi-bridge channel, nano-ribbon FET, gate all around (GAA) transistor structures).

Figure 2D:
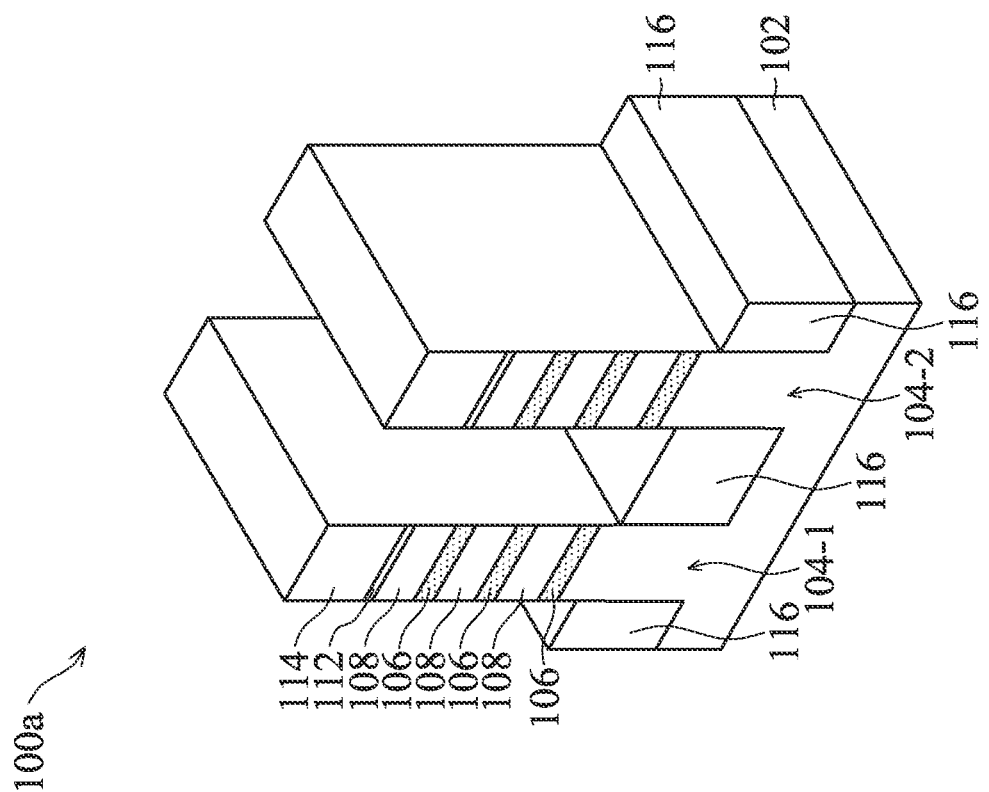
Figure 2C:
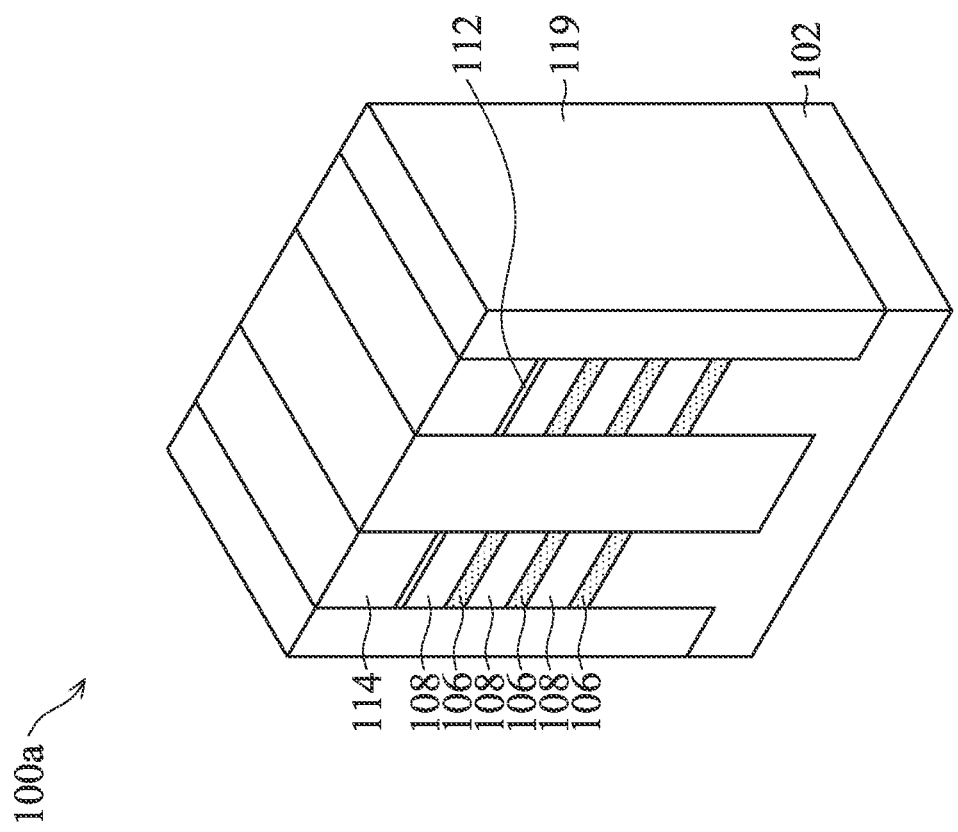

Afterwards, as shown in FIG. 2C, a liner (not shown) is formed to cover the fin structures 104-1 and 104-2, and an insulating layer 119 is formed around the fin structures 104-1 and 104-2 over the liner, in accordance with some embodiments of the disclosure. In some embodiments, the liner is made of an oxide layer and a nitride layer. In some embodiments, the liner is omitted. In some embodiments, the insulating layer 119 is made of silicon oxide, silicon nitride, silicon oxynitride (SiON), another suitable insulating material, or a combination thereof.

Afterwards, as shown in FIG. 2D, the insulating layer 119 and the liner (not shown) are recessed to form an isolation structure 116, in accordance with some embodiments. The isolation structure 116 is configured to electrically isolate active regions (e.g. the fin structures 104-1 and 104-2) of the semiconductor structure and is also referred to as shallow trench isolation (STI) feature in accordance with some embodiments.

Figure 2F:
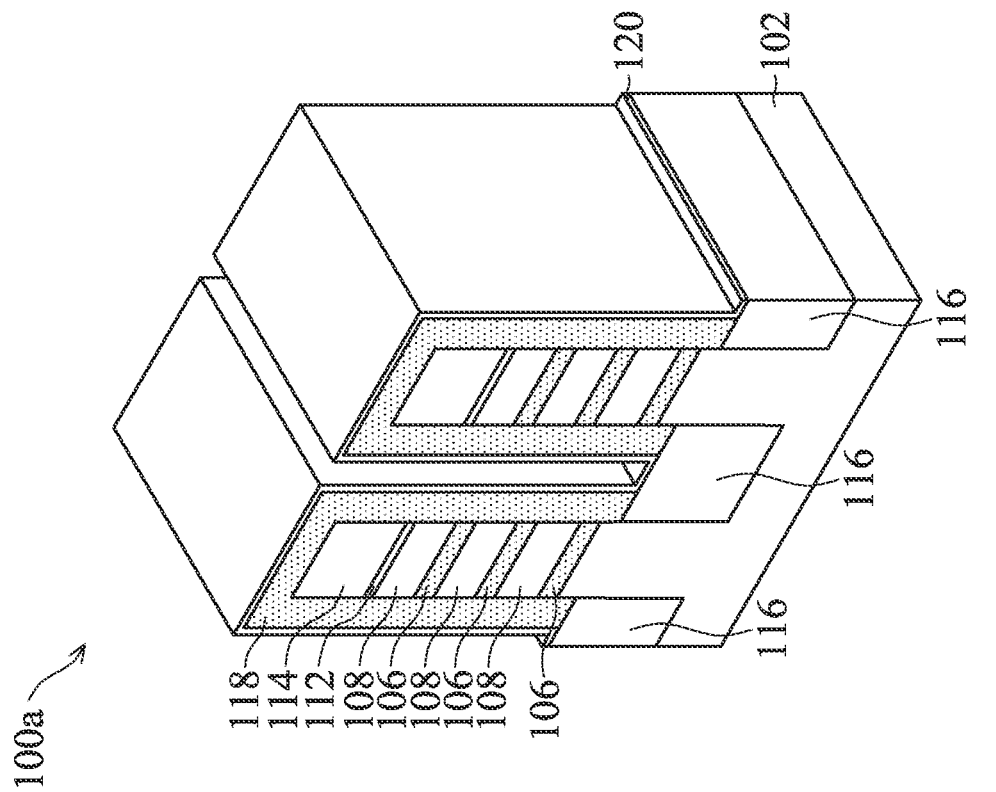
Figure 2E:
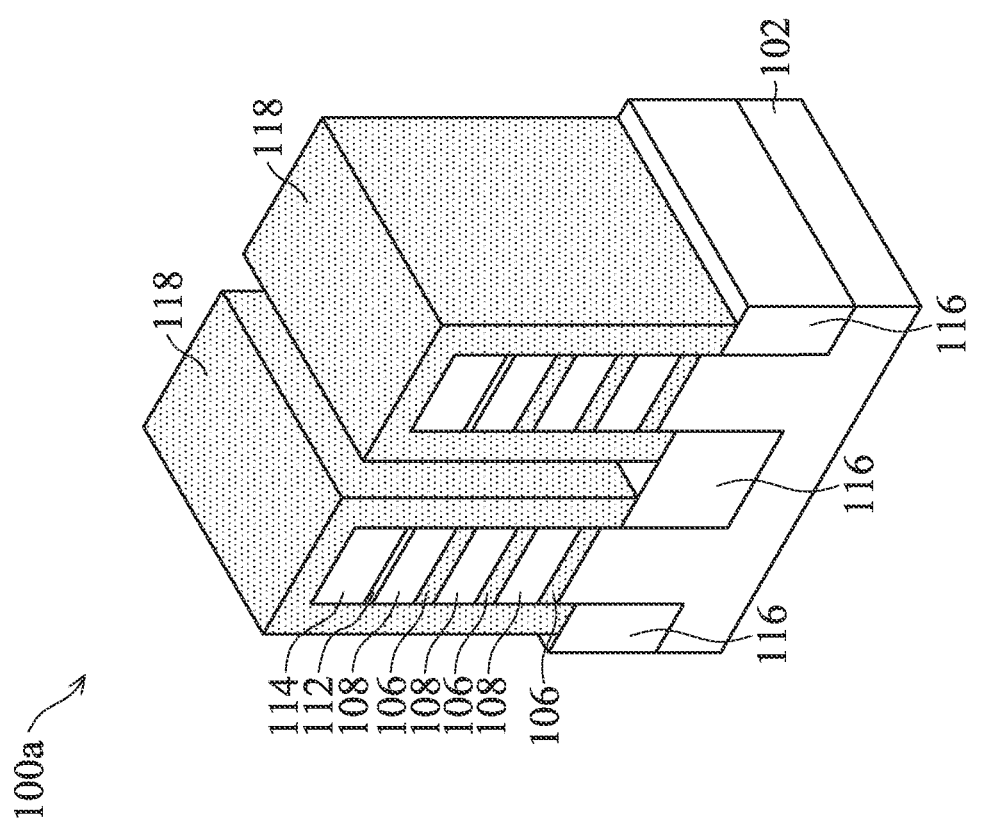

Afterwards, as shown in FIG. 2E, cladding layers 118 are formed over the top surfaces and the sidewalls of the fin structures 104-1 and 104-2 and over the top surface of the isolation structure 116, in accordance with some embodiments. In some embodiments, the cladding layers 118 are made of semiconductor materials. In some embodiments, the cladding layers 118 are made of silicon germanium (SiGe). In some embodiments, the cladding layers 118 and the first semiconductor layers 106 are made of the same semiconductor material.

The cladding layer 118 may be grown by a process such as vapor phase epitaxy (VPE) or molecular beam epitaxy (MBE), deposited by a process such as chemical vapor deposition (CVD) or atomic layer deposition (ALD), or the like. In embodiments in which the cladding layer 118 is deposited, an etching process may be performed to remove the portion of the cladding layer 118 not formed on the sidewalls of the fin structures 104-1 and 104-2 using, for example, a plasma dry etching process. In some embodiments, the portions of the cladding layers 118 formed on the top surface of the fin structures 104-1 and 104-2 are partially or completely removed by the etching process, such that the thickness of the cladding layer 118 over the top surface of the fin structures 104-1 and 104-2 is thinner than the thickness of the cladding layer 118 on the sidewalls of the fin structures 104-1 and 104-2.

Before the cladding layers 118 are formed, a semiconductor liner (not shown) may be formed over the fin structures 104-1 and 104-2. The semiconductor liner may be a Si layer and may be incorporated into the cladding layers 118 during the epitaxial growth process for forming the cladding layers 118.

Next, as shown in FIG. 2F, a liner layer 120 is formed over the cladding layers 118 and the isolation structure 116, in accordance with some embodiments. In some embodiments, In some embodiments, the liner layer 120 is made of a low k dielectric material having a k value lower than 7. In some embodiments, the liner layer 120 is made of SiN, SiCN, SiOCN, SiON, or the like. The liner layer 120 may be deposited using CVD, PVD, ALD, HDPCVD, MOCVD, RPCVD, PECVD, LPCVD, ALCVD, APCVD, other applicable methods, or combinations thereof. In some embodiments, the liner layer 120 has a thickness in a range from about 2 nm to about 8 nm.

Next, as shown in FIG. 2G, a filling layer 122 is formed over the cladding layers 118 and the isolation structure 116, in accordance with some embodiments. After the liner layer 120 is formed, the filling layer 122 is formed over the liner layer 120 to completely fill the spaces between the adjacent fin structures 104-1 and 104-2, and a polishing process is performed until the top surfaces of the cladding layers 118 are exposed, in accordance with some embodiments.

In some embodiments, the filling layer 122 and the liner layer 120 are both made of oxide but are formed by different methods. In some embodiments, the filling layer 122 is made of SiN, SiCN, SiOCN, SiON, or the like. The filling layer 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, as shown in FIG. 2H, recesses 124 are formed between the fin structures 104-1 and 104-2, in accordance with some embodiments. In some embodiments, the filling layer 122 and the liner layer 120 are recessed by performing an etching process.

Figures 2I, 2J:
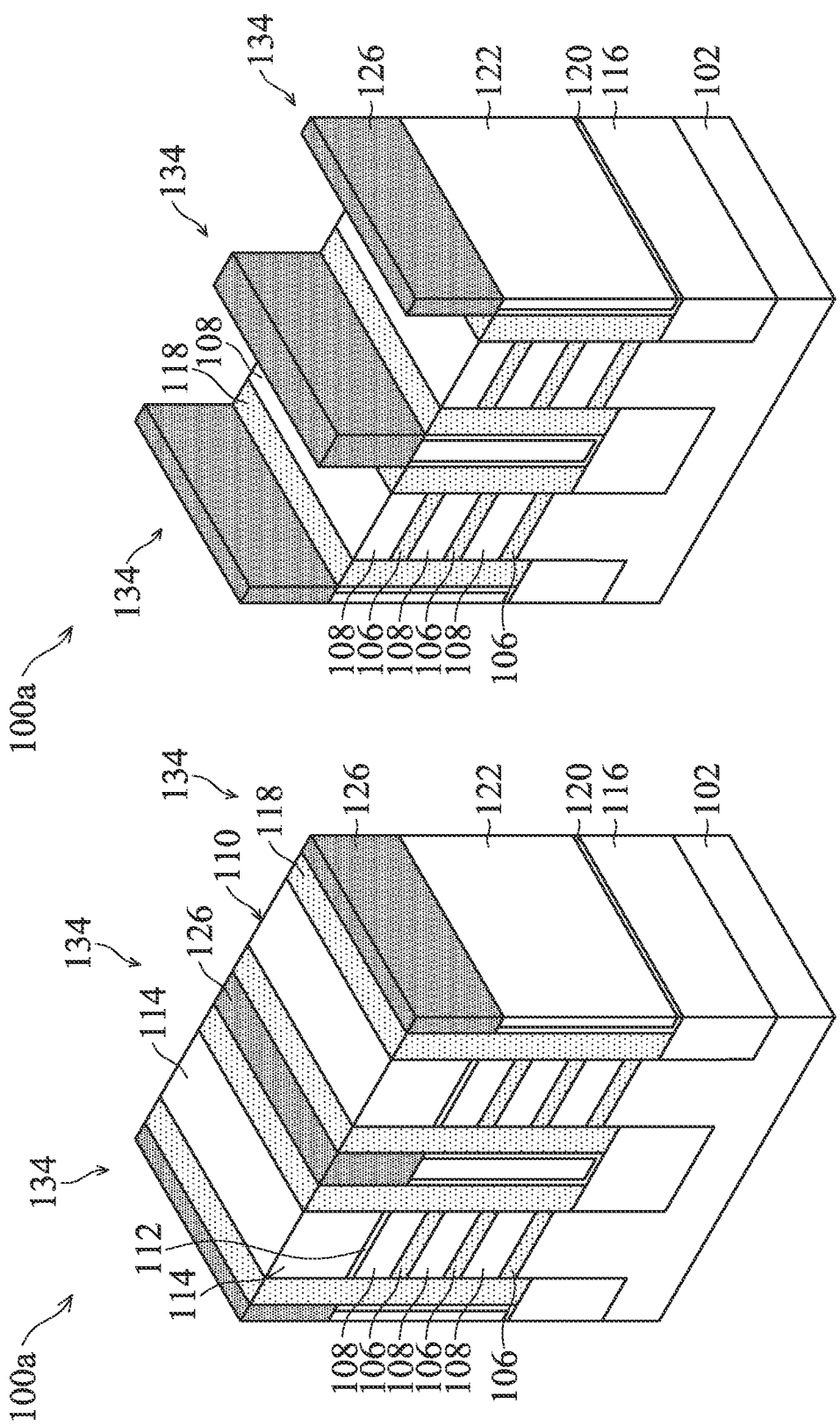

Afterwards, as shown in FIG. 2I, a cap layer 126 is formed in the recesses 124, thereby forming dielectric features 134 (collectively referring to the liner layer 120, the filling layer 122, and the cap layer 126), in accordance with some embodiments. In some embodiments, the cap layer 126 is made of a high k dielectric material, such as HfO$_2$, ZrO$_2$, HfAlO$_x$, HfSiO$_x$, Al$_2$O$_3$, or the like. The dielectric materials for forming the cap layer 126 may be formed by performing ALD, CVD, PVD, oxidation-based deposition process, other suitable process, or combinations thereof. After the cap layers 126 are formed, a CMP process is performed until the mask structures 110 are exposed in accordance with some embodiments. The cap layers 126 should be thick enough to protect the dielectric features 134 during the subsequent etching processes, so that the dielectric features 134 may be used to separate the adjacent source/drain structures formed afterwards.

Next, as shown in FIG. 2J, the mask structures 110 over the fin structures 104-1 and 104-2 and the top portions of the cladding layers 118 are removed to expose the top surfaces of the topmost second semiconductor layers 108, in accordance with some embodiments. In some embodiments, the top surfaces of the cladding layers 118 are substantially level with the top surfaces of the topmost second semiconductor layers 108.

The mask structures 110 and the cladding layers 118 may be recessed by performing one or more etching processes that have higher etching rate to the mask structures 110 and the cladding layers 118 than the dielectric features 134, such that the dielectric features 134 are only slightly etched during the etching processes. The selective etching processes can be dry etching, wet etching, reactive ion etching, or other applicable etching methods.

Afterwards, as shown in FIG. 2K, dummy gate structures 136 are formed across the fin structure 104-1 and 104-2 and the dielectric features 134, in accordance with some embodiments. The dummy gate structures 136 may be used to define the source/drain regions and the channel regions of the resulting semiconductor structure 100a.

In some embodiments, the dummy gate structure 136 includes a dummy gate dielectric layer 138 and a dummy gate electrode layer 140. In some embodiments, the dummy gate dielectric layer 138 is made of one or more dielectric materials, such as silicon oxide, silicon nitride, silicon oxynitride (SiON), HfO$_2$, HfZrO, HfSiO, HfTiO, HfAlO, or a combination thereof. In some embodiments, the dummy gate dielectric layer 138 is formed using thermal oxidation, CVD, ALD, physical vapor deposition (PVD), another suitable method, or a combination thereof.

In some embodiments, the dummy gate electrode layer 140 is made of conductive or non-conductive material, such as amorphous silicon, polycrystalline-silicon (poly-Si), poly-crystalline silicon-germanium (poly-SiGe), or a combination thereof. In some embodiments, the dummy gate electrode layer 140 is formed using CVD, PVD, or a combination thereof.

In some embodiments, hard mask layers 142 are formed over the dummy gate structures 136. In some embodiments, the hard mask layers 142 include multiple layers, such as an oxide layer 144 and a nitride layer 146. In some embodiments, the oxide layer 144 is silicon oxide, and the nitride layer 146 is silicon nitride.

The formation of the dummy gate structures 136 may include conformally forming a dielectric material as the dummy gate dielectric layers 138. Afterwards, a dielectric or conductive material may be formed over the dielectric material as the dummy gate electrode layers 140, and the hard mask layer 142 may be formed thereover. Next, the material layers may be patterned through the hard mask layer 142 to form the dummy gate dielectric layers 138 and the dummy gate electrode layers 140 of the dummy gate structures 136.

In some embodiments, the dielectric feature 134 includes a bottom portion 134B and a top portion 134T over the bottom portion 134B. The bottom portion 134B includes the liner layer 120 and the filling layer 122, and the top portion 134T includes the cap layer 126. The cap layers 126 may be configured to protect the liner layer 120 and the filling layer 122 during the subsequent etching processes.

Since the dielectric features 134 are self-aligned to the spaces between the fin structures 104-1 and 104-2, complicated alignment processes are not required when forming the dielectric features 134. In addition, the width of the dielectric features 134 may be determined by the widths of the spaces between the fin structures 104-1 and 104-2 and the thicknesses of the cladding layer 118. In some embodiments, the dielectric features 134 have substantially the same width. Meanwhile, in some embodiments, the spaces between the fin structures 104-1 and 104-2 have different widths, and the dielectric features 134 also have different widths. As shown in FIG. 1, the dielectric features 134 are formed between the fin structures 104-1 and 104-2 and have longitudinal axes that are substantially parallel to longitudinal axes of the fin structures 104-1 and 104-2, in accordance with some embodiments.

Figures 1, 3A:
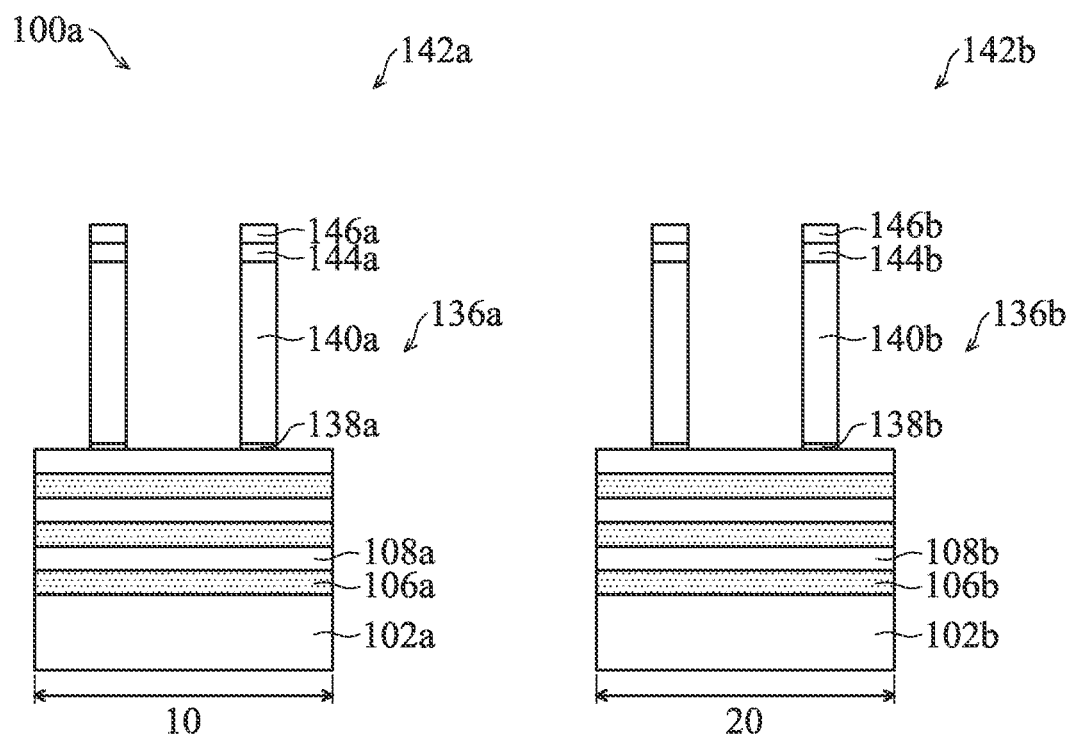
Figures 2, 3A:
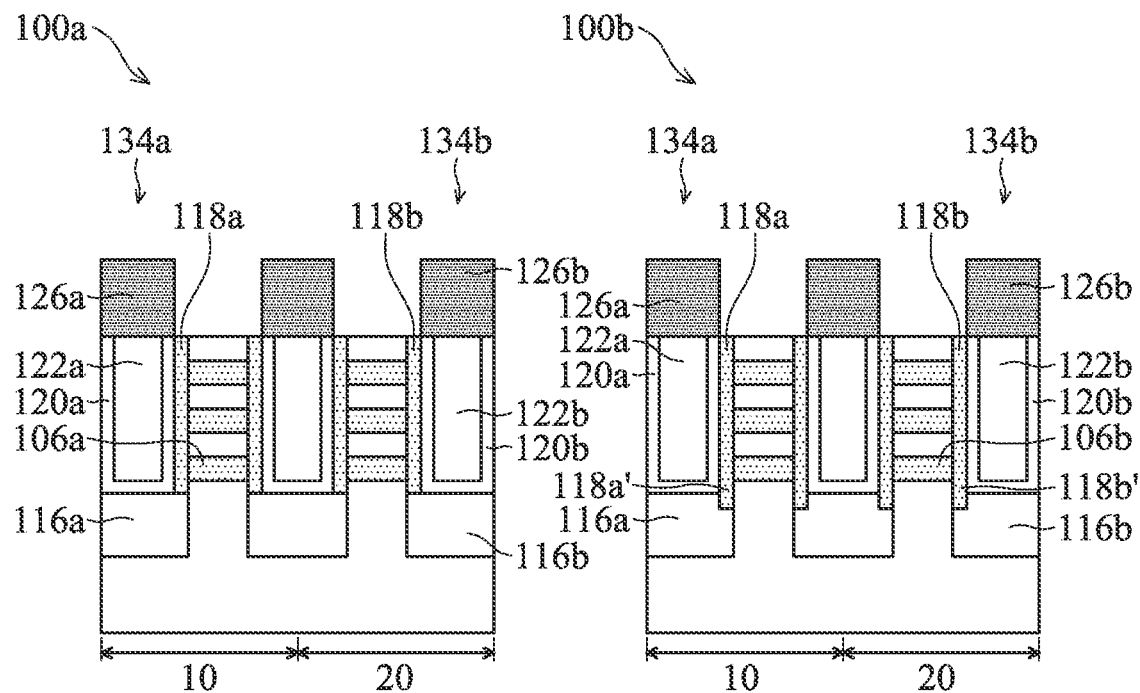
Figures 1, 3B:
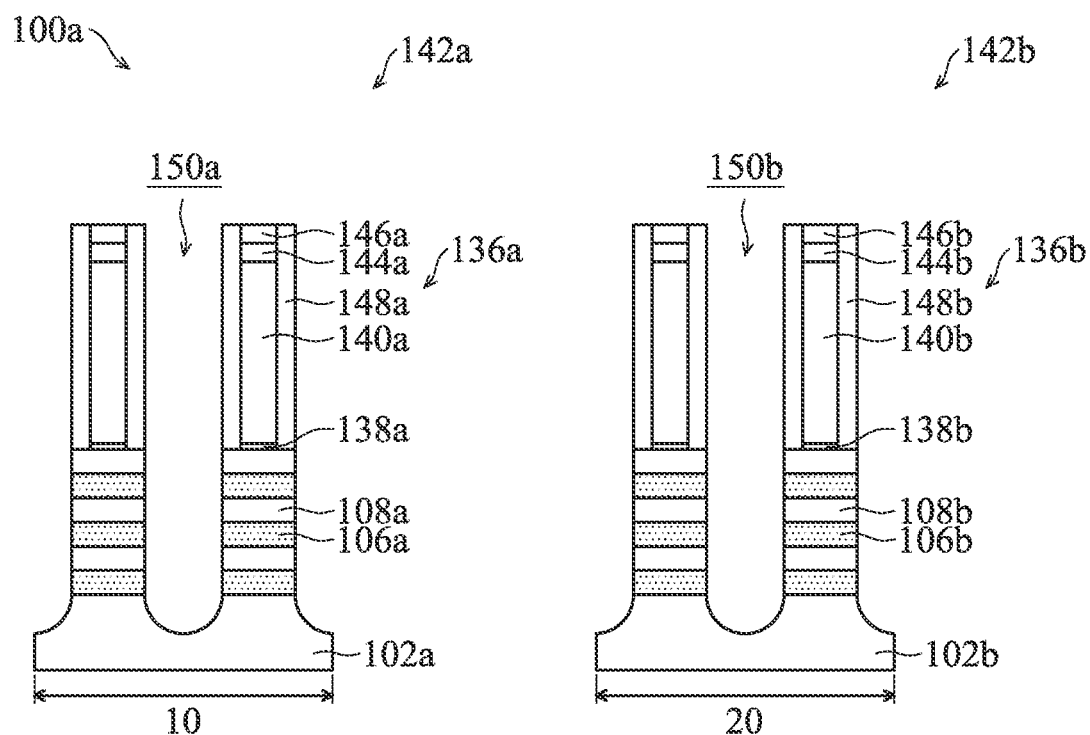
Figures 2, 3B:
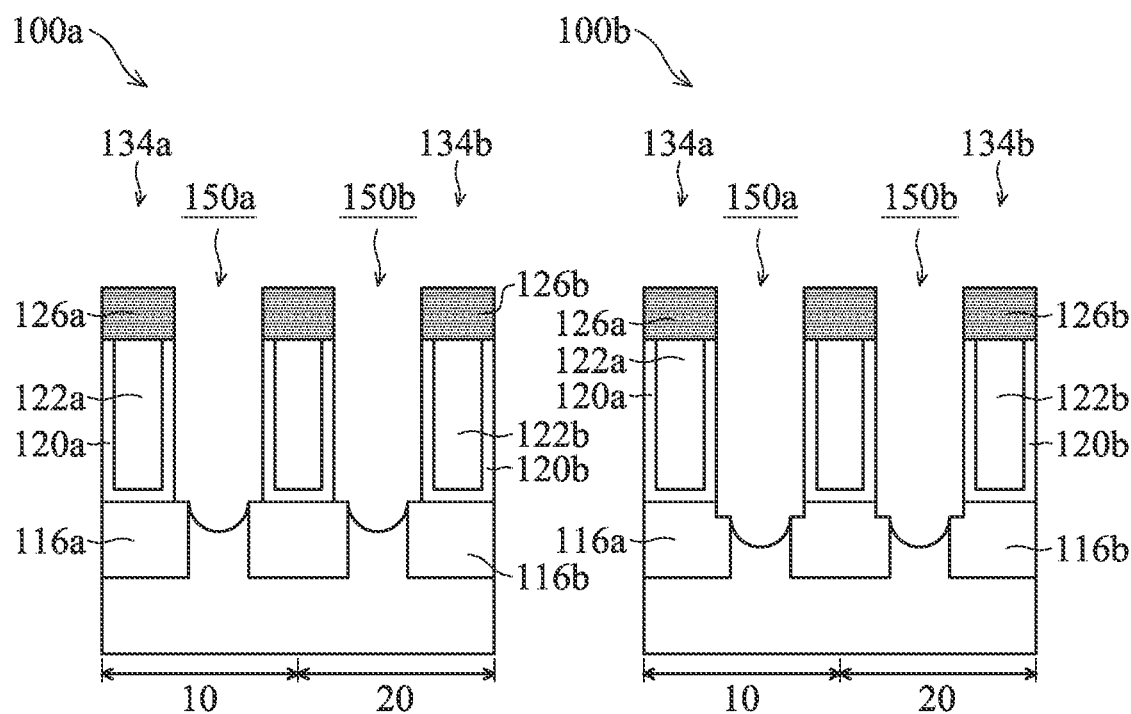
Figures 1, 3C:
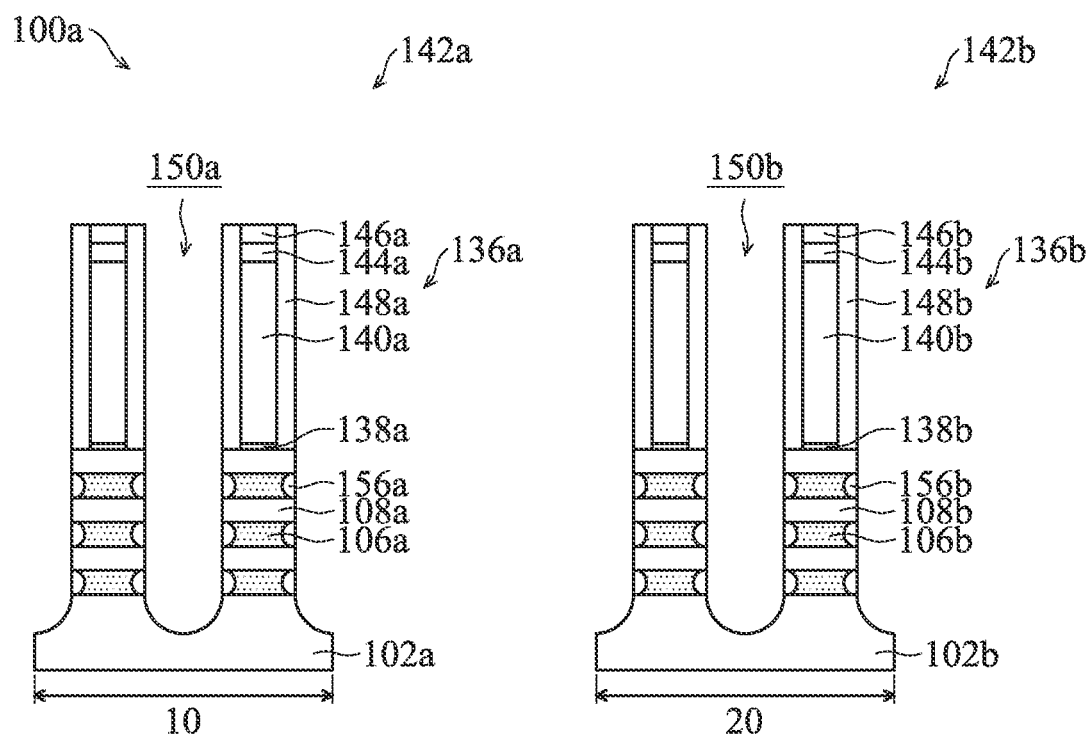
Figures 2, 3C:
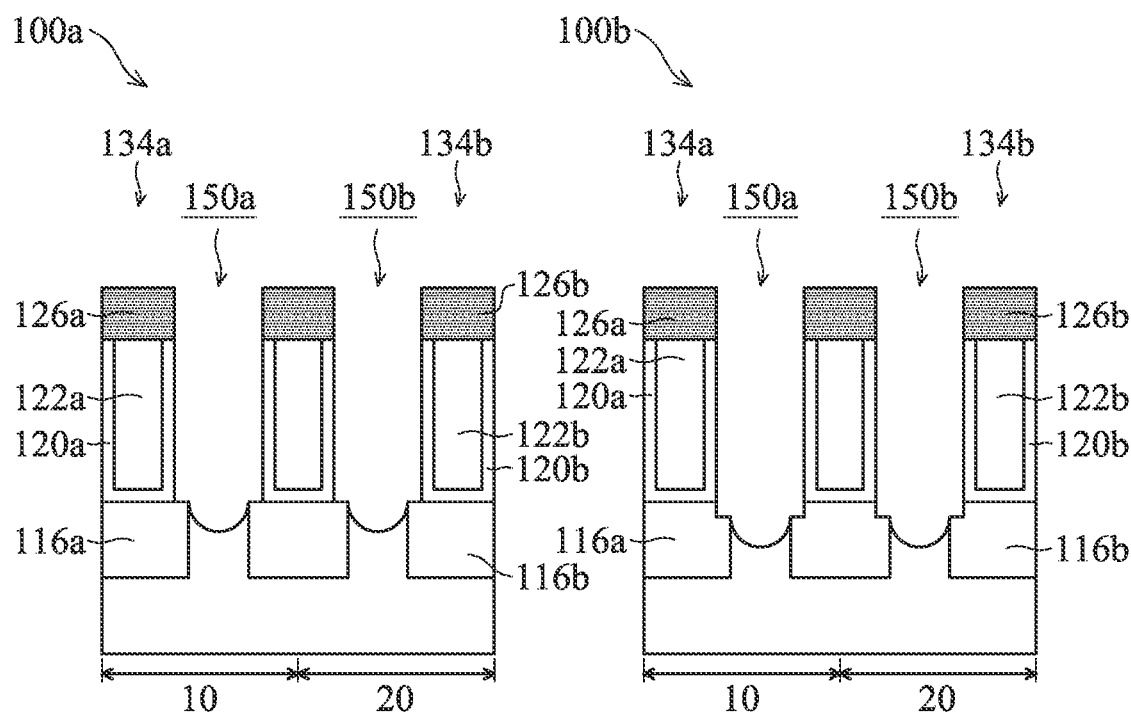
Figures 1, 3D:
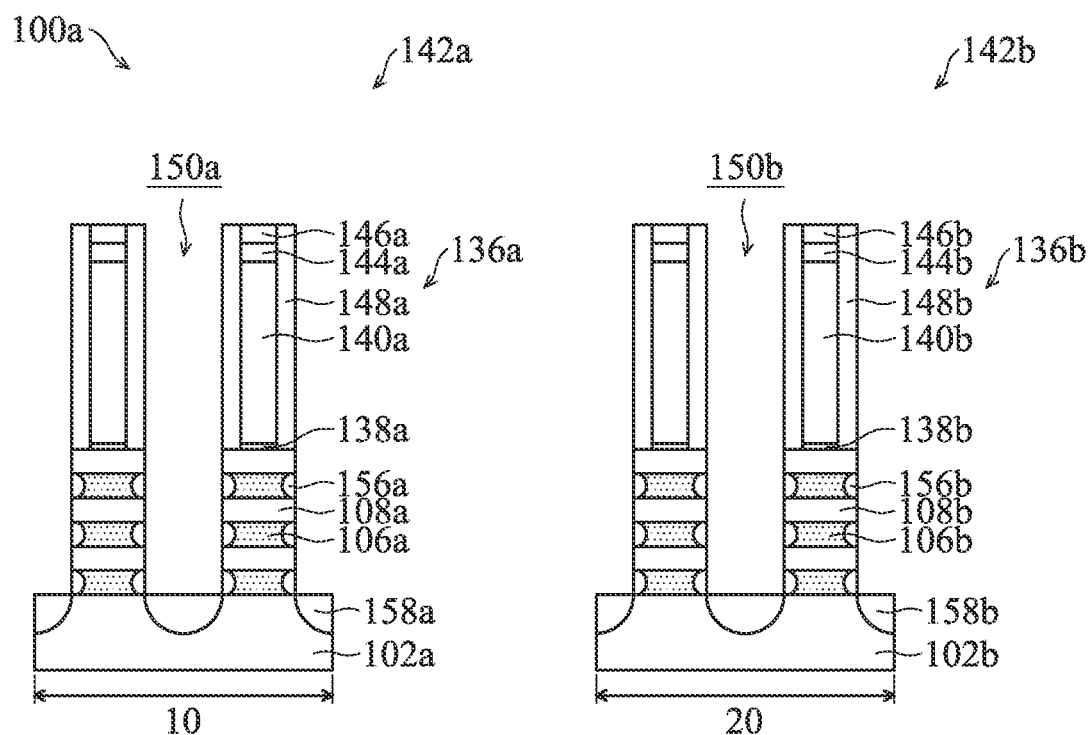
Figures 2, 3D:
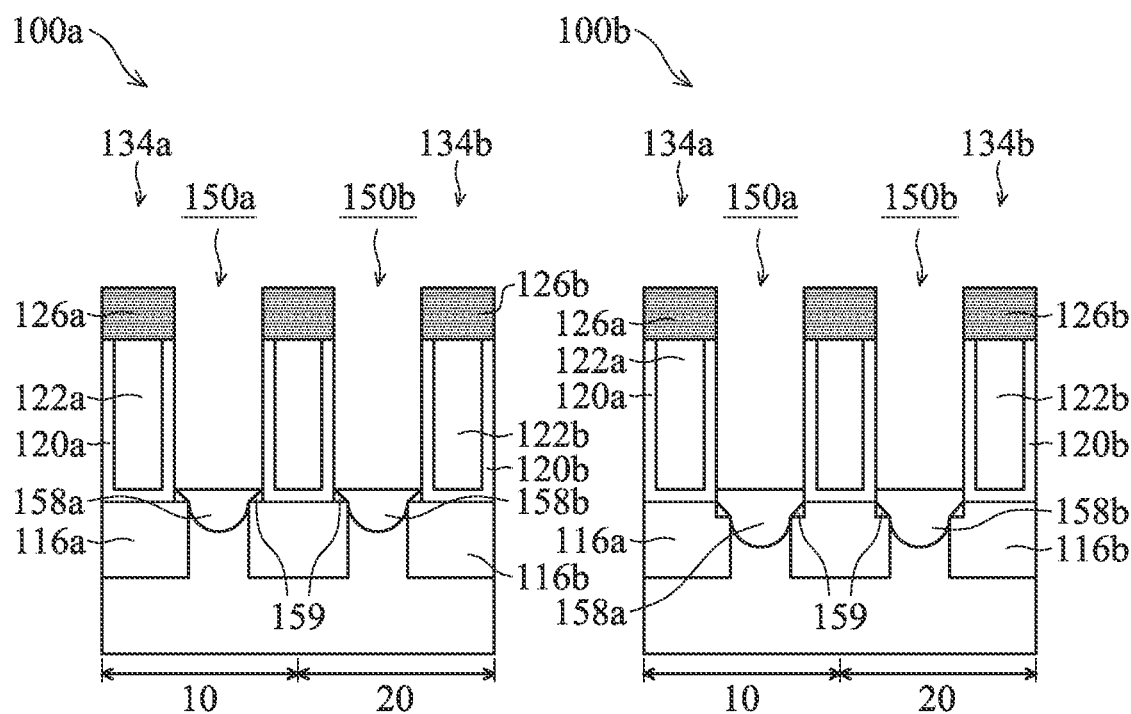
Figures 1, 3E:
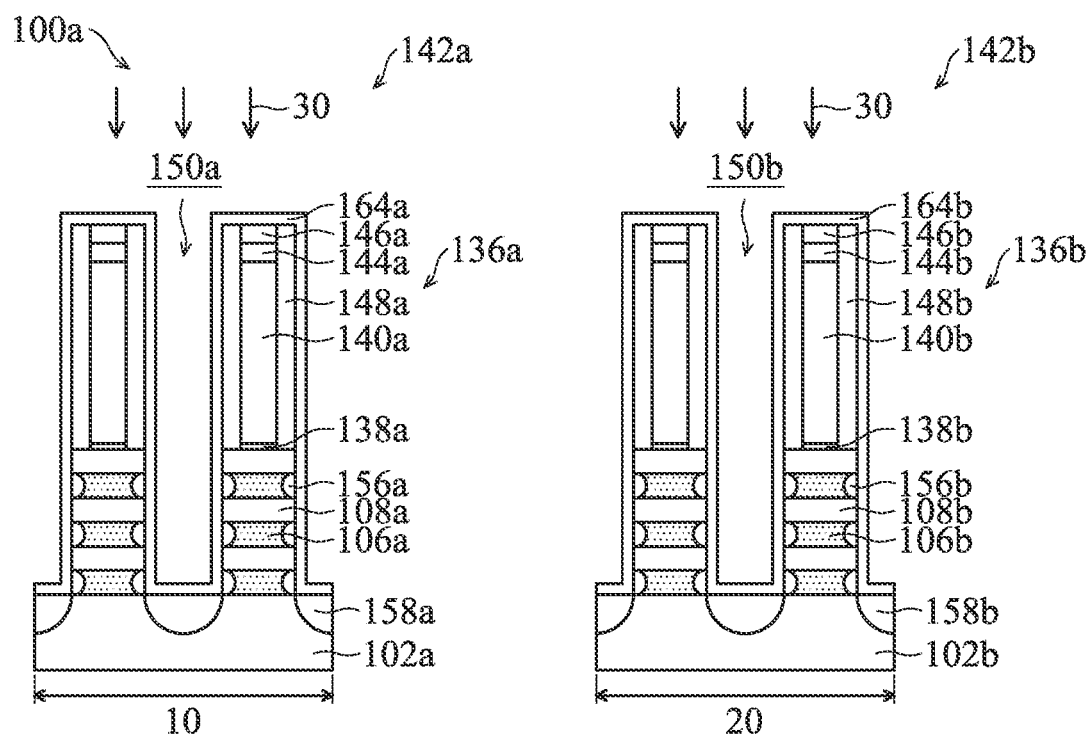
Figures 2, 3E:
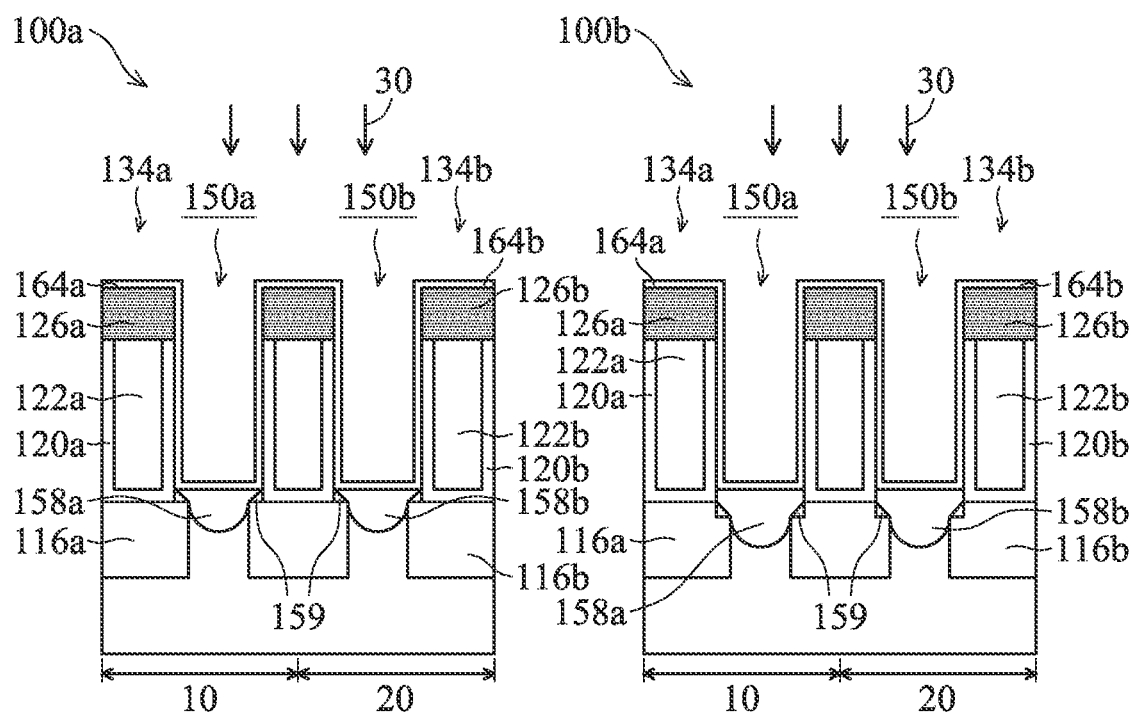
Figures 1, 3F:
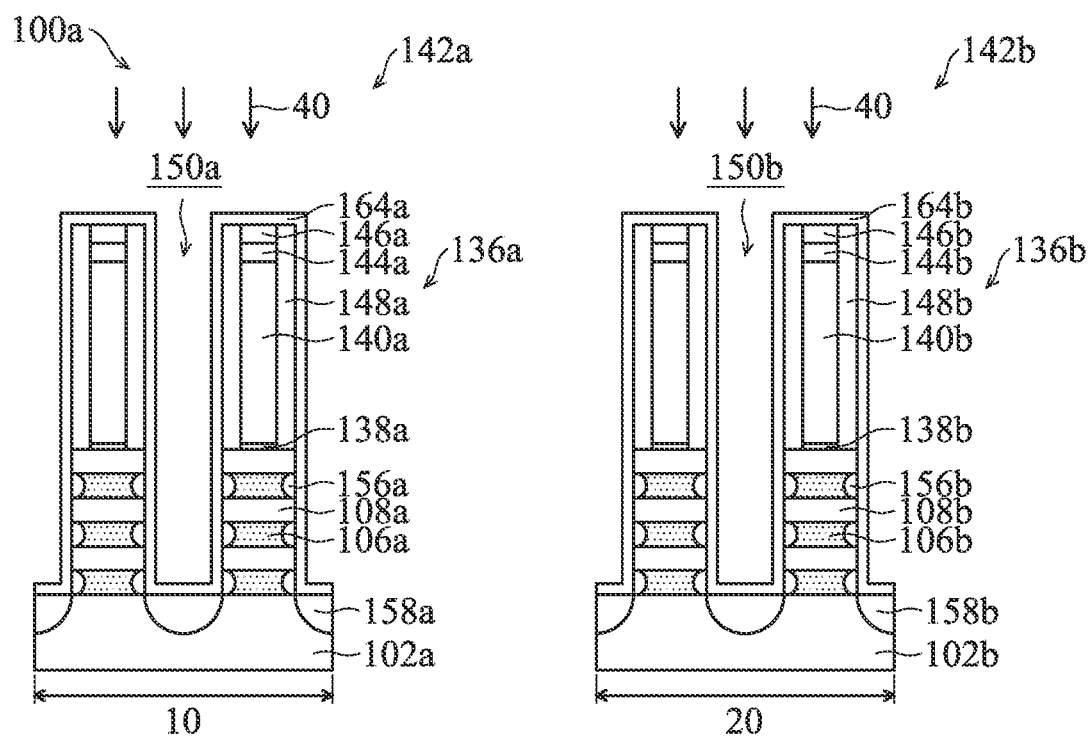
Figures 2, 3F:
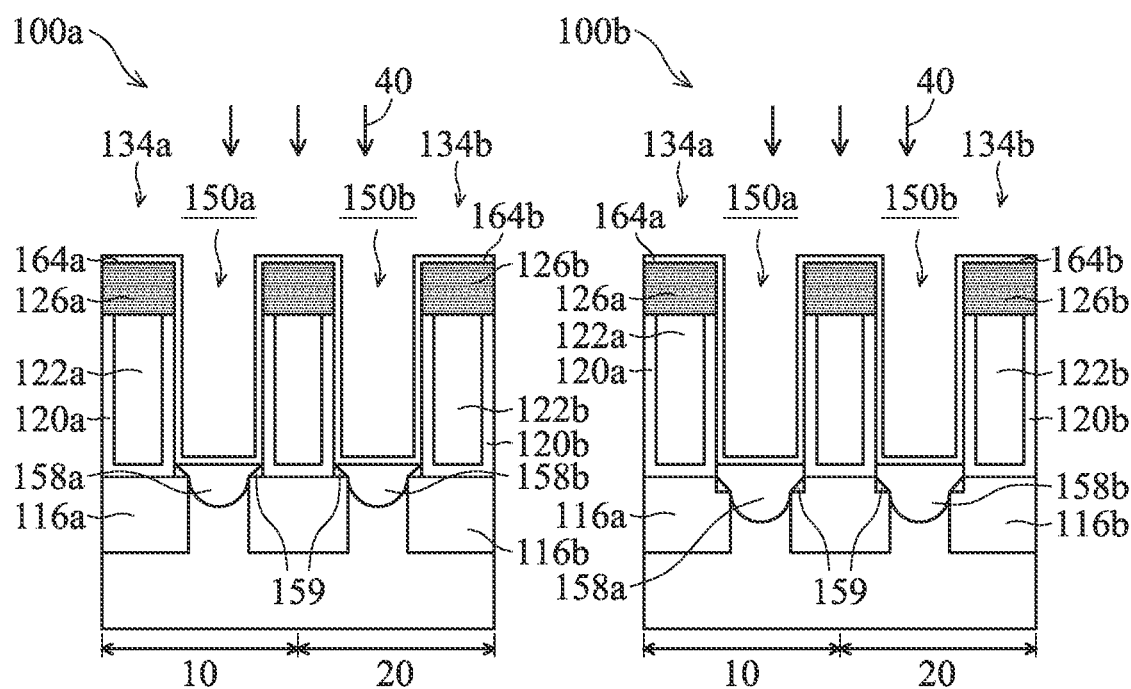
Figures 1, 3G:
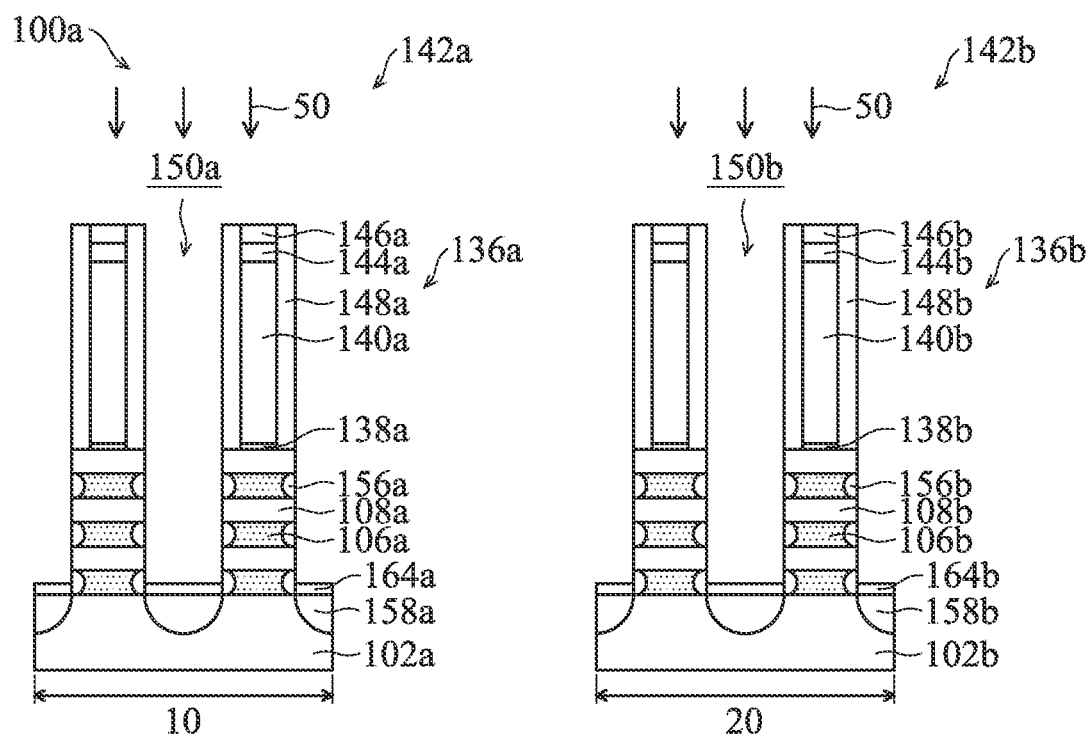
Figures 2, 3G:
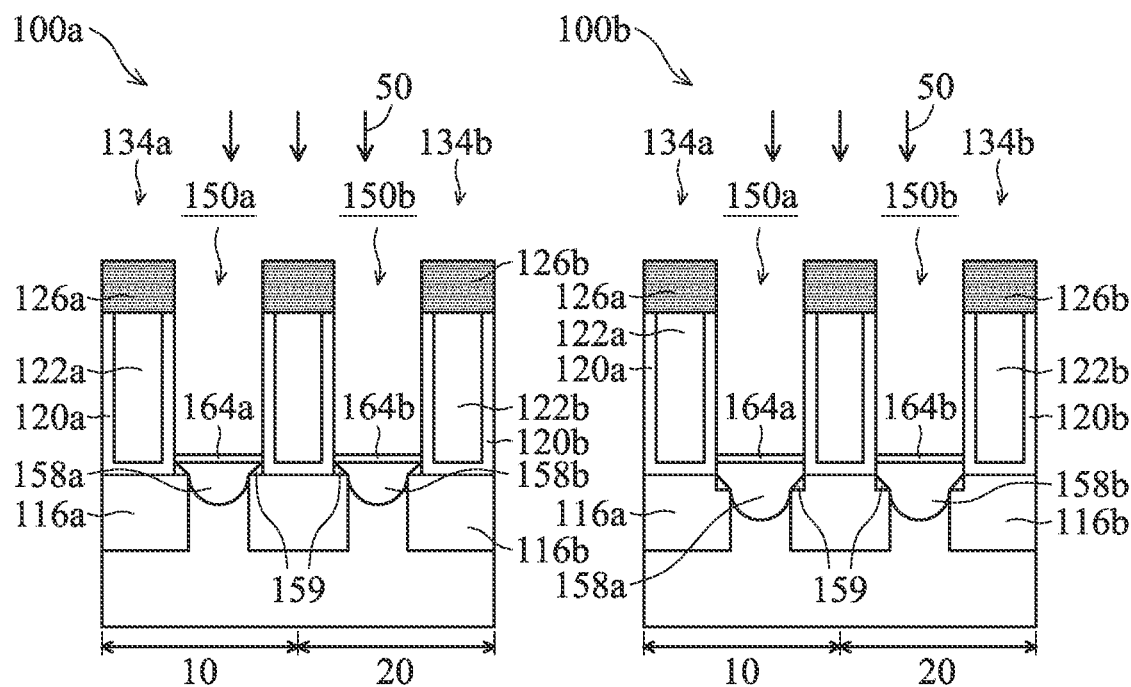
Figures 1, 3H:
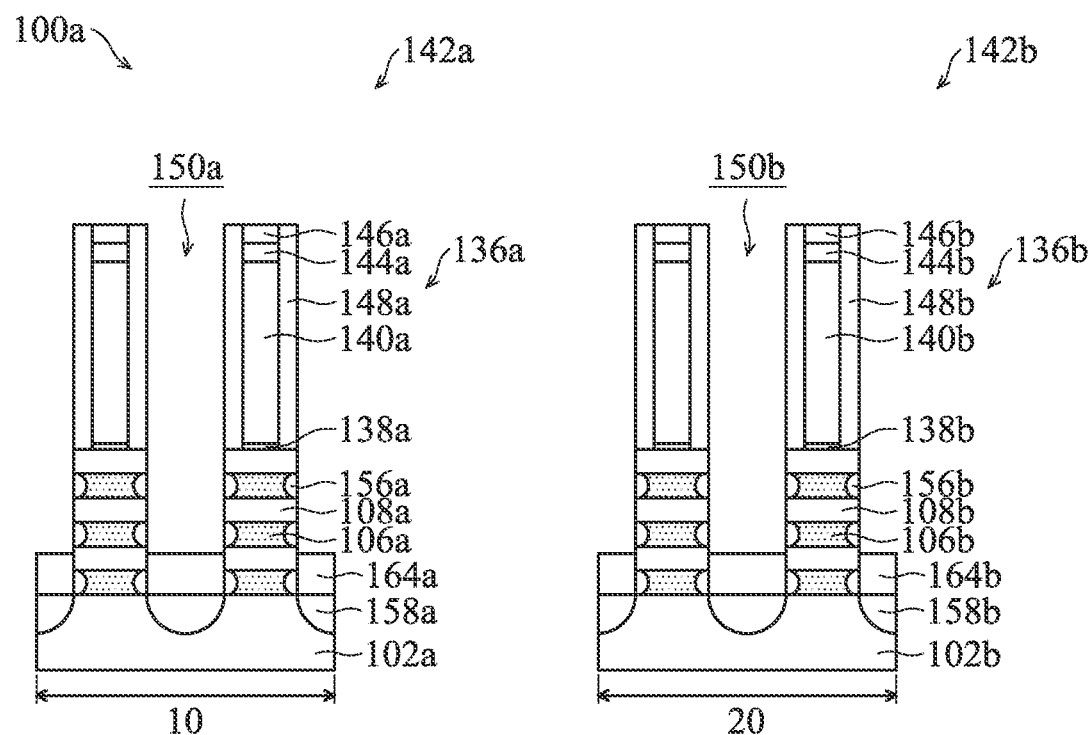
Figures 2, 3H:
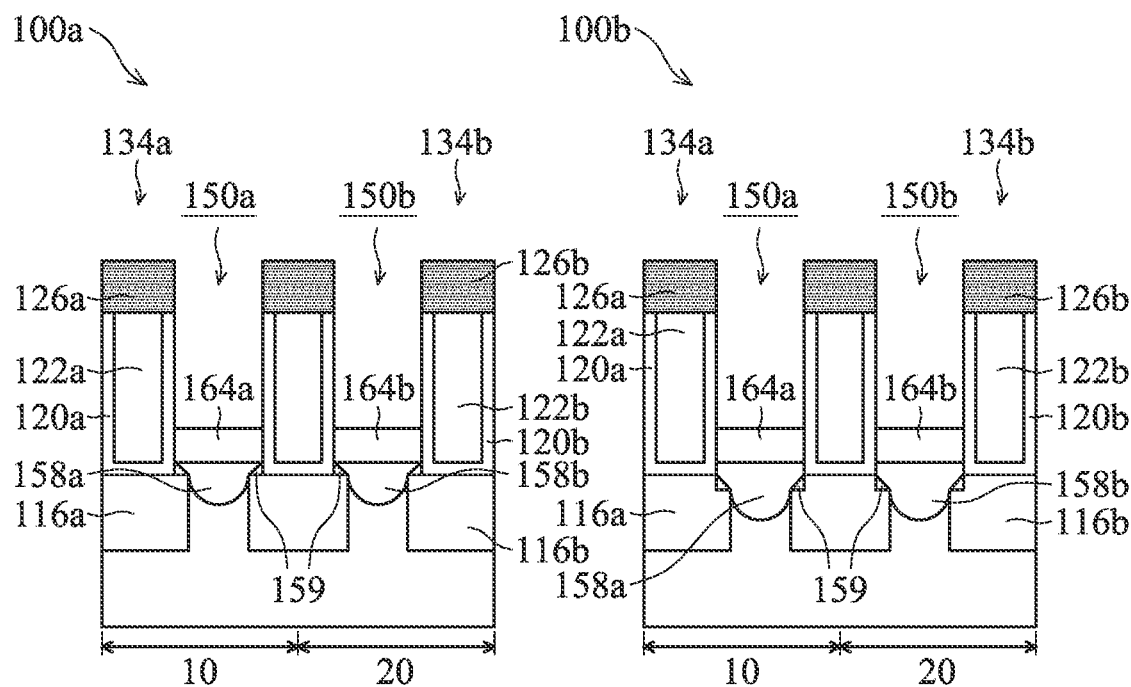
Figures 1, 3I:
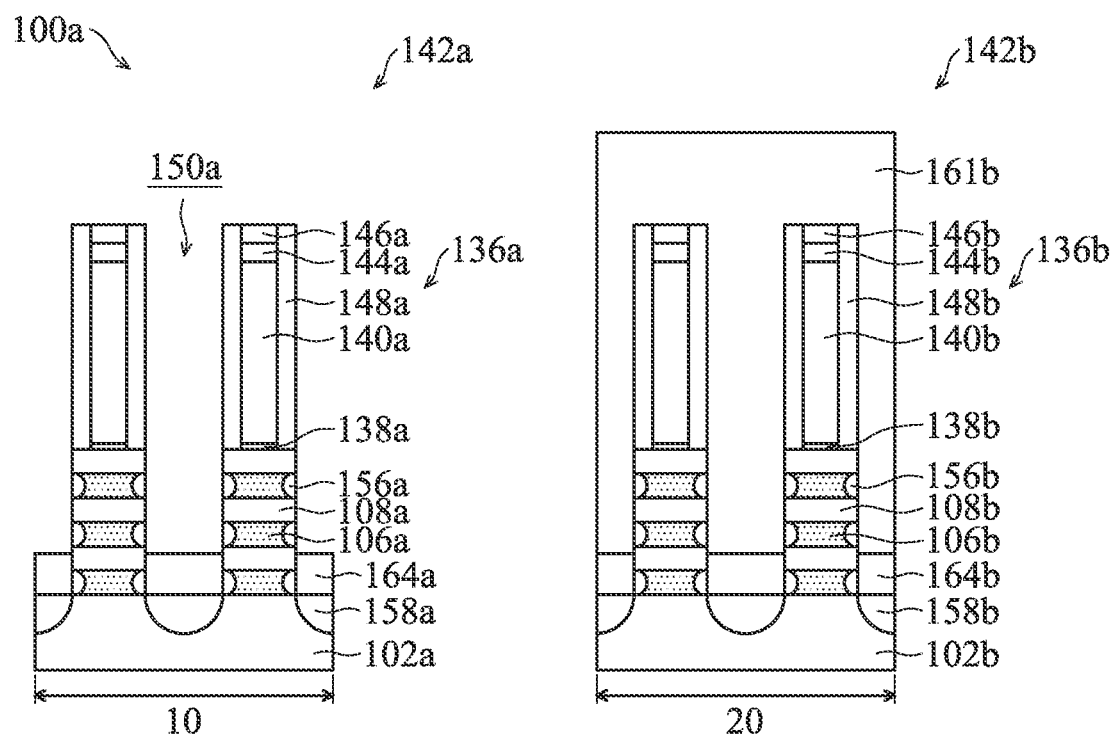
Figures 2, 3I:
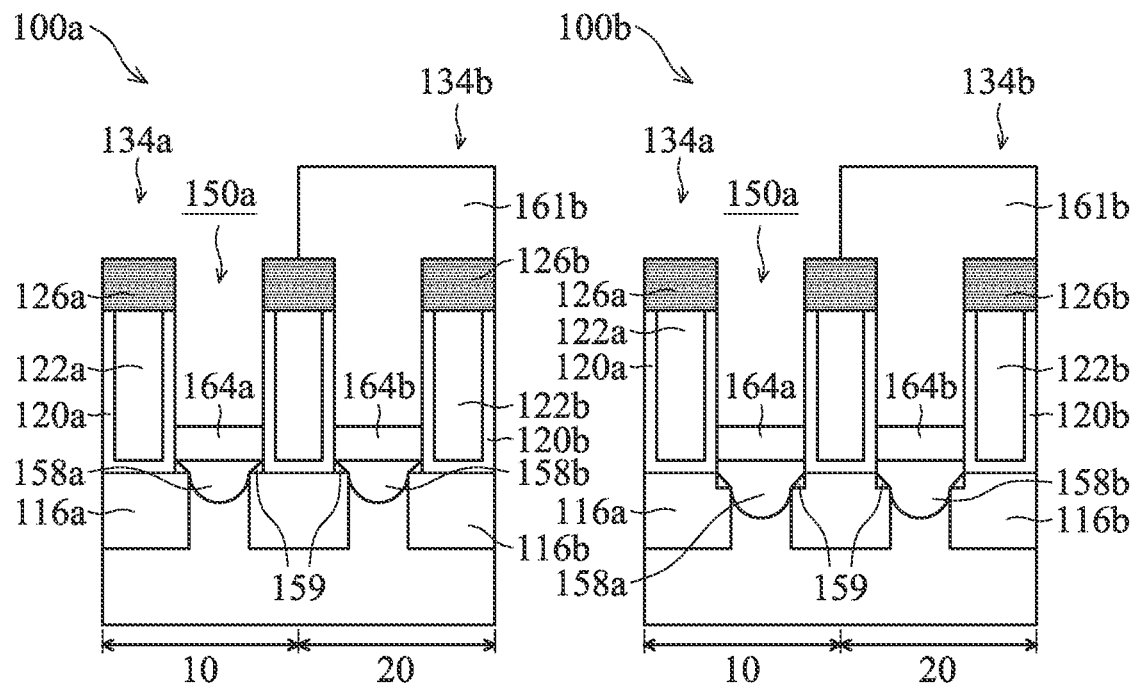
Figures 1, 3J:
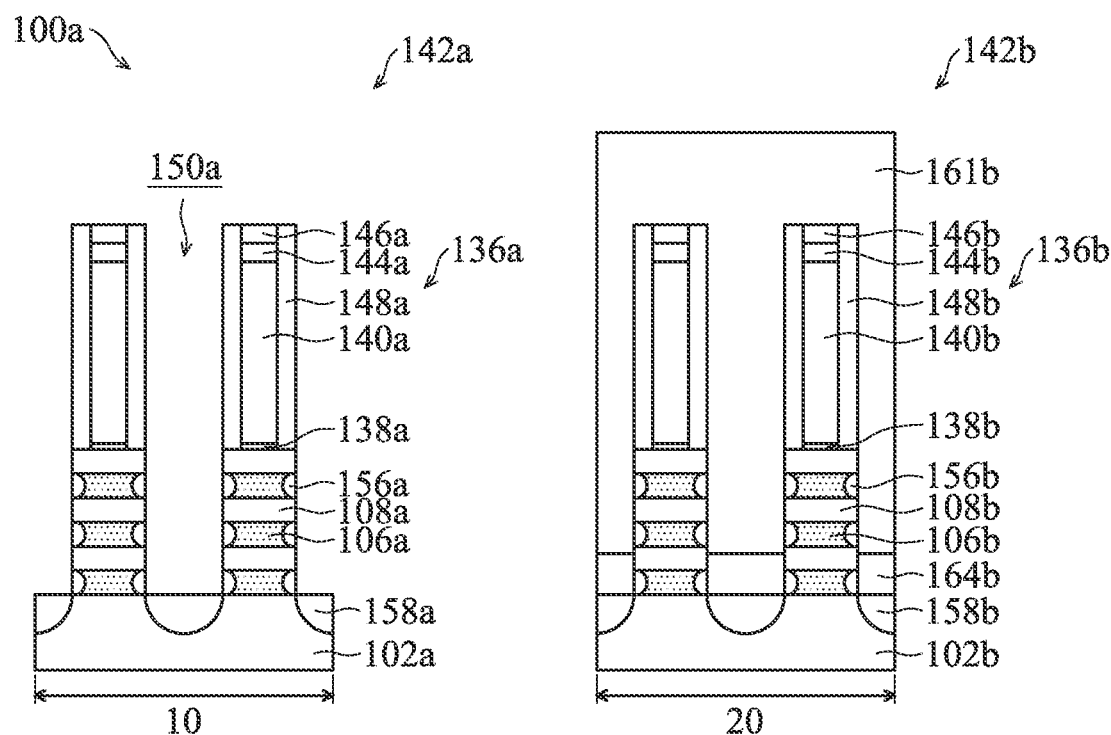
Figures 2, 3J:
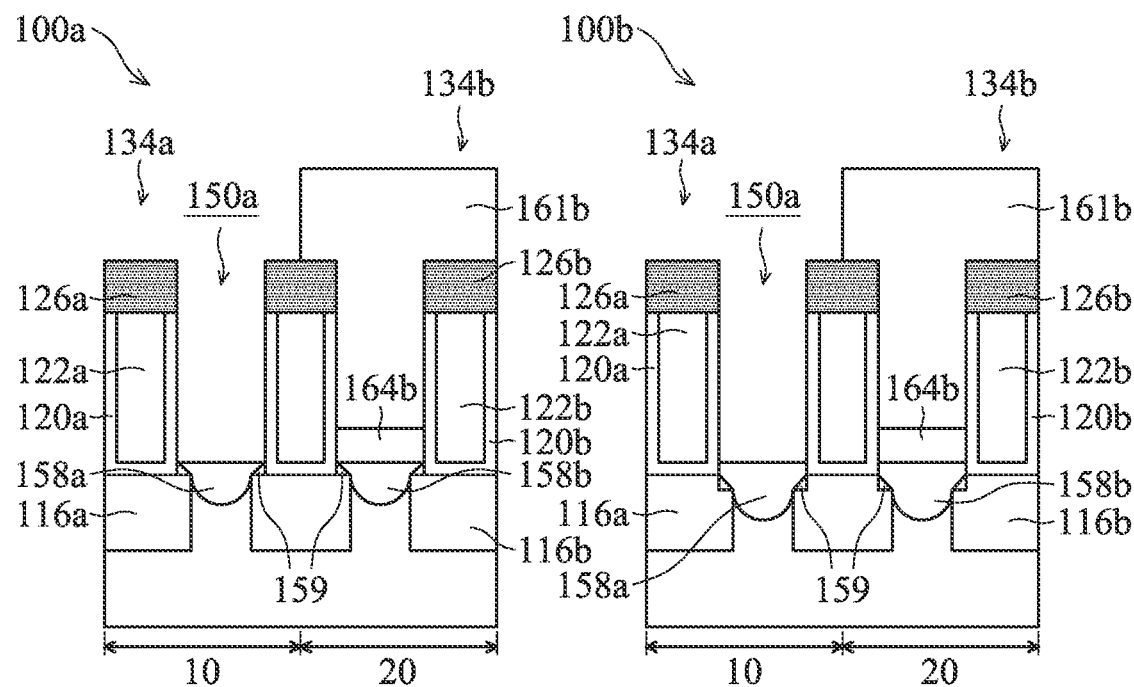
Figures 1, 3K:
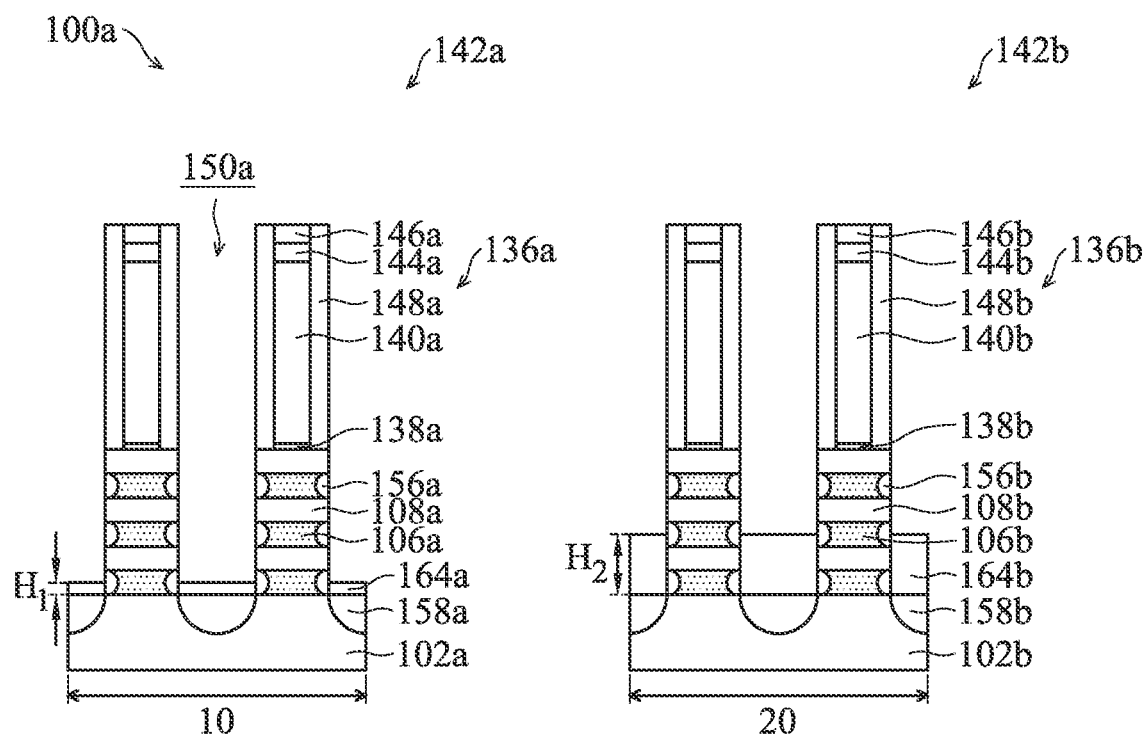
Figures 2, 3K:
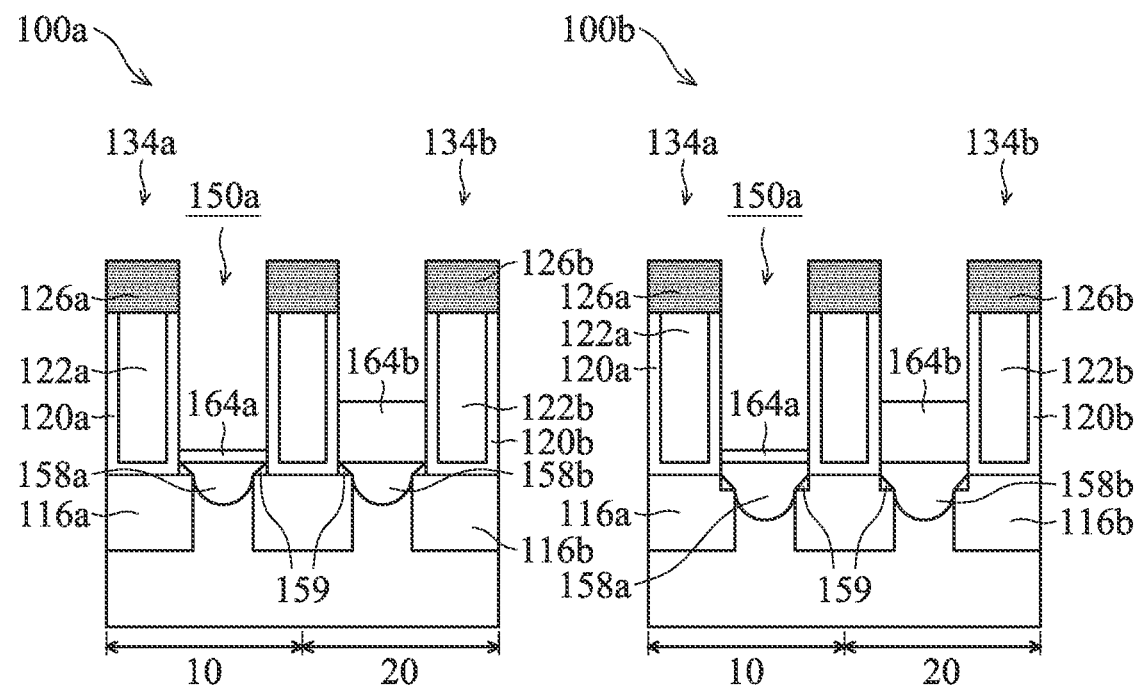
Figures 1, 3L:
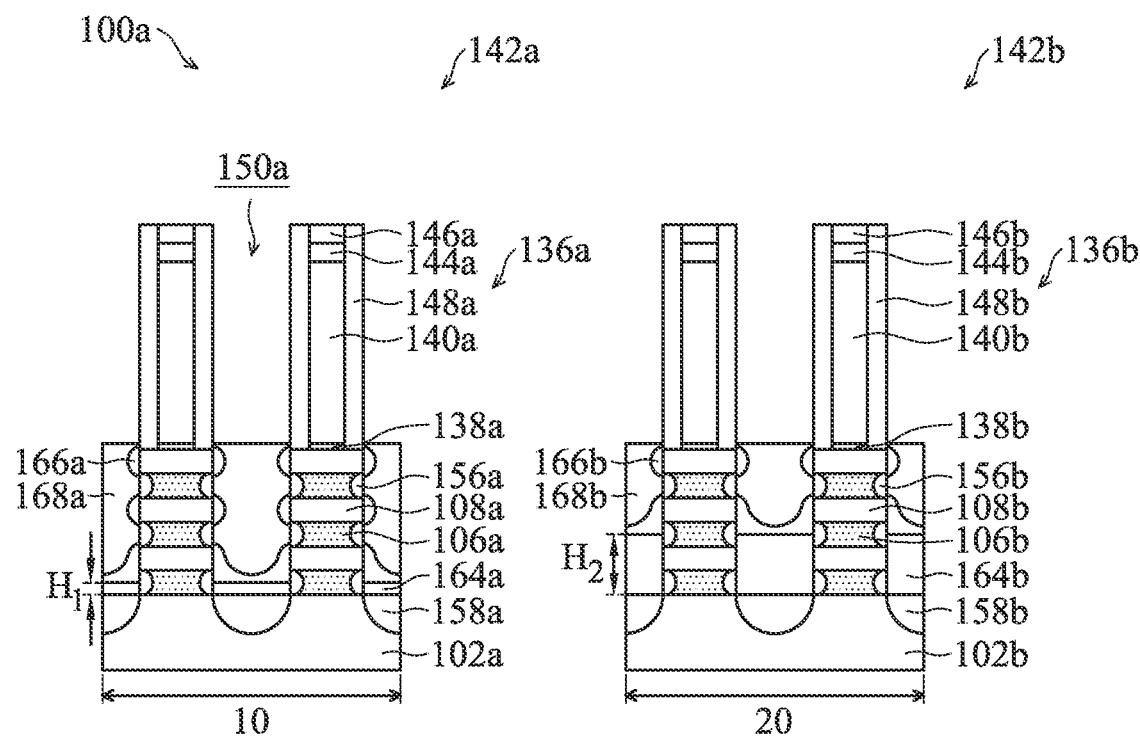
Figures 2, 3L:
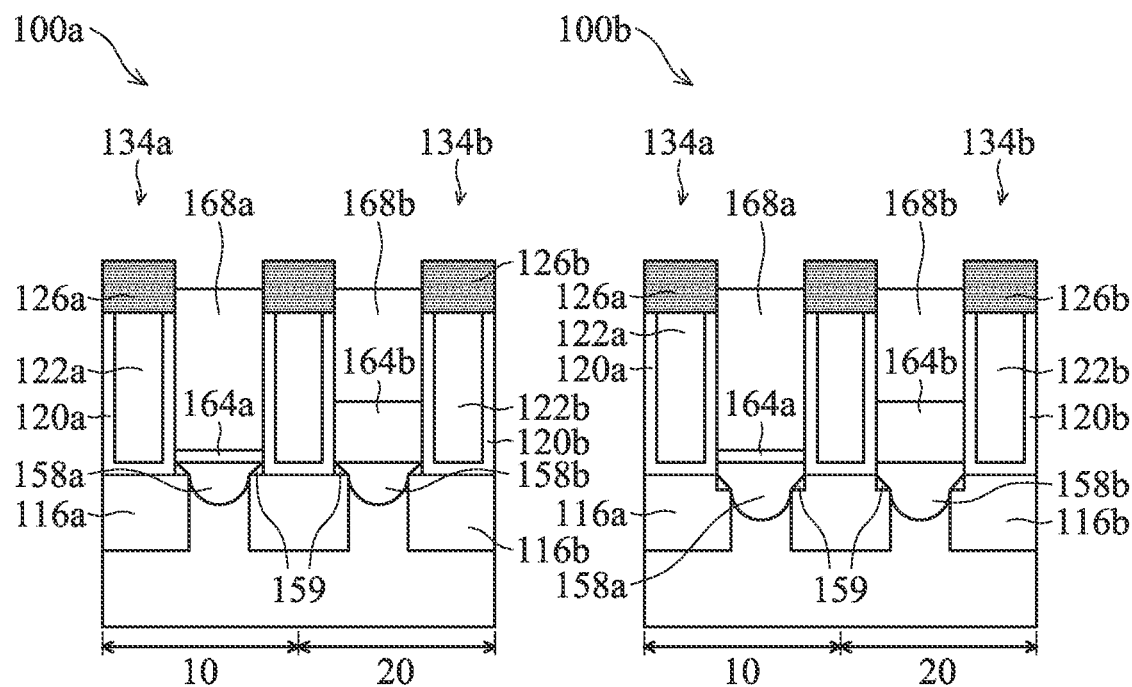
Figures 1, 3M:
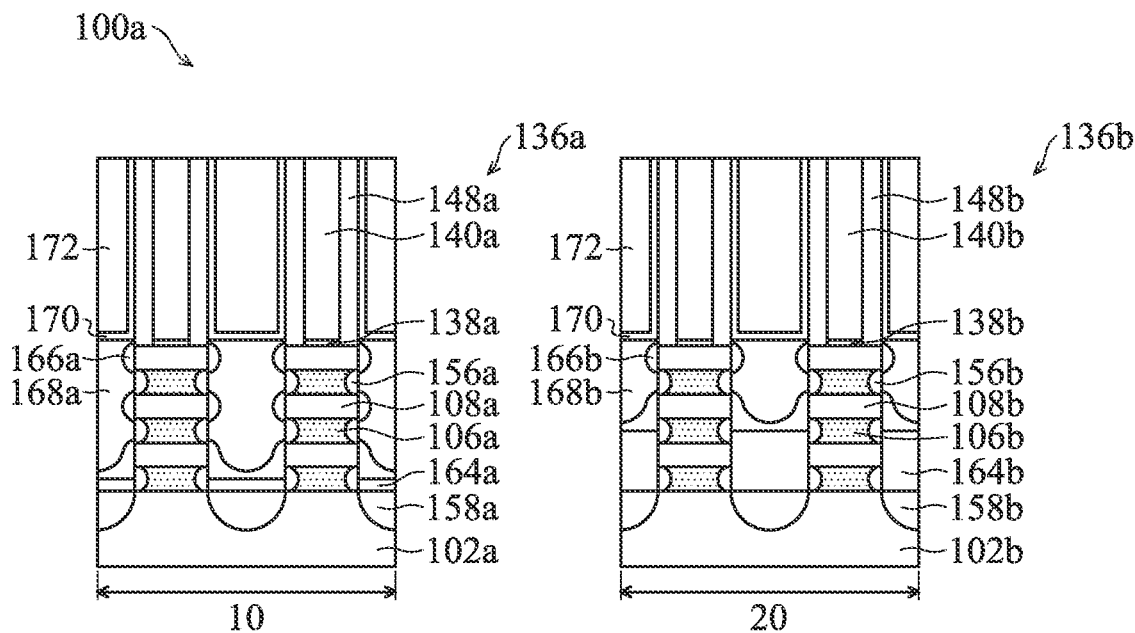
Figures 2, 3M:
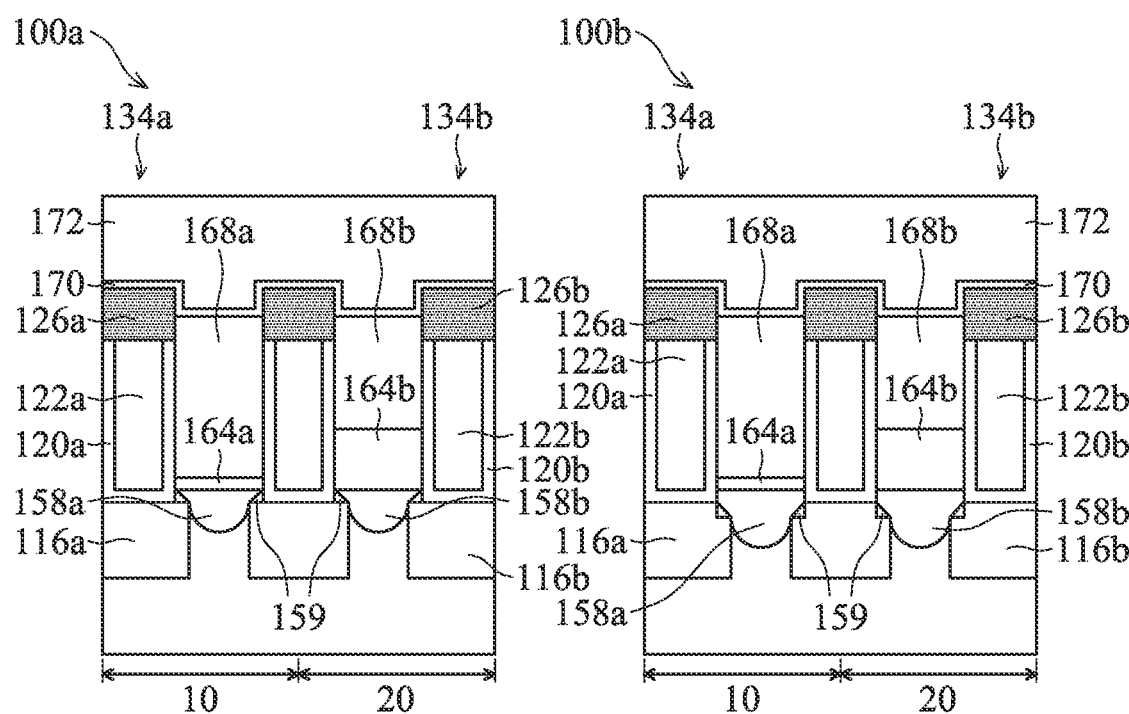
Figures 1, 3N:
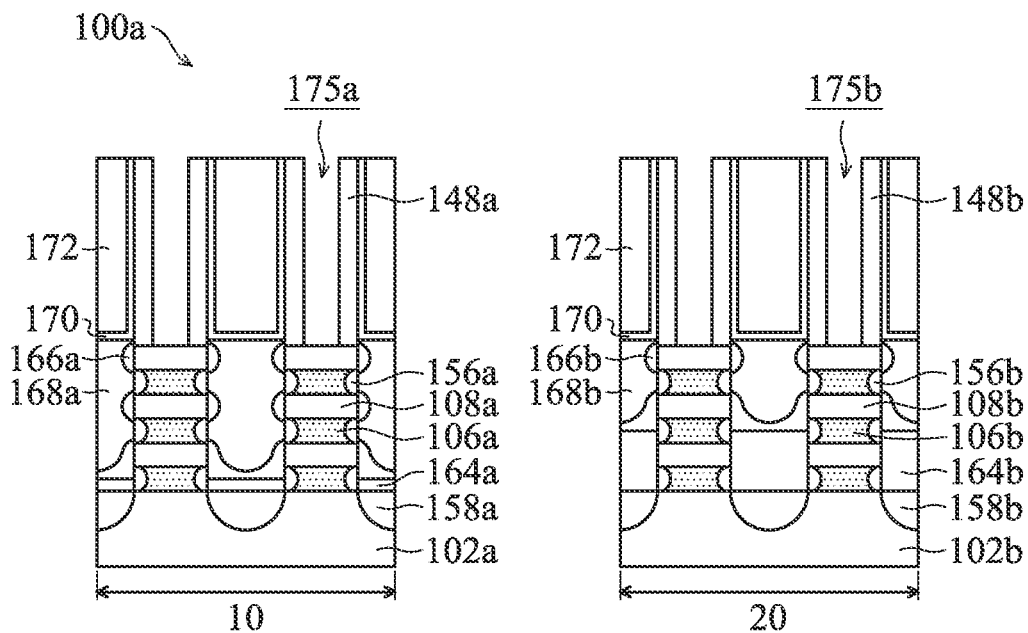
Figures 2, 3N:
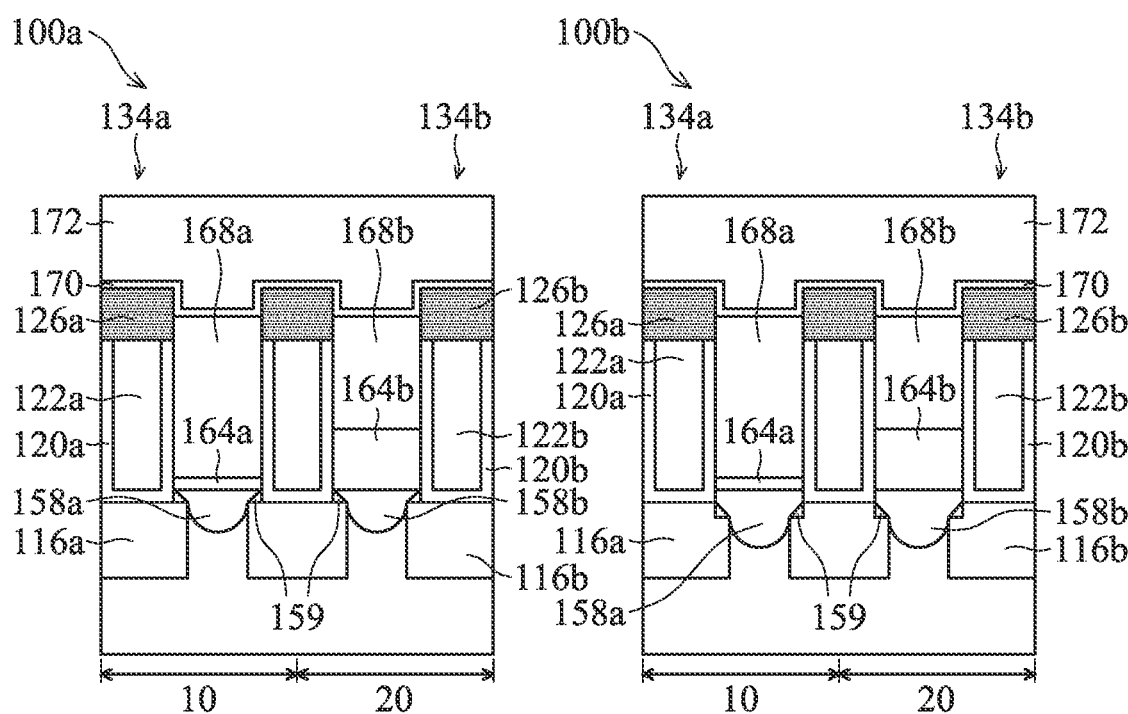
Figures 1, 3O:
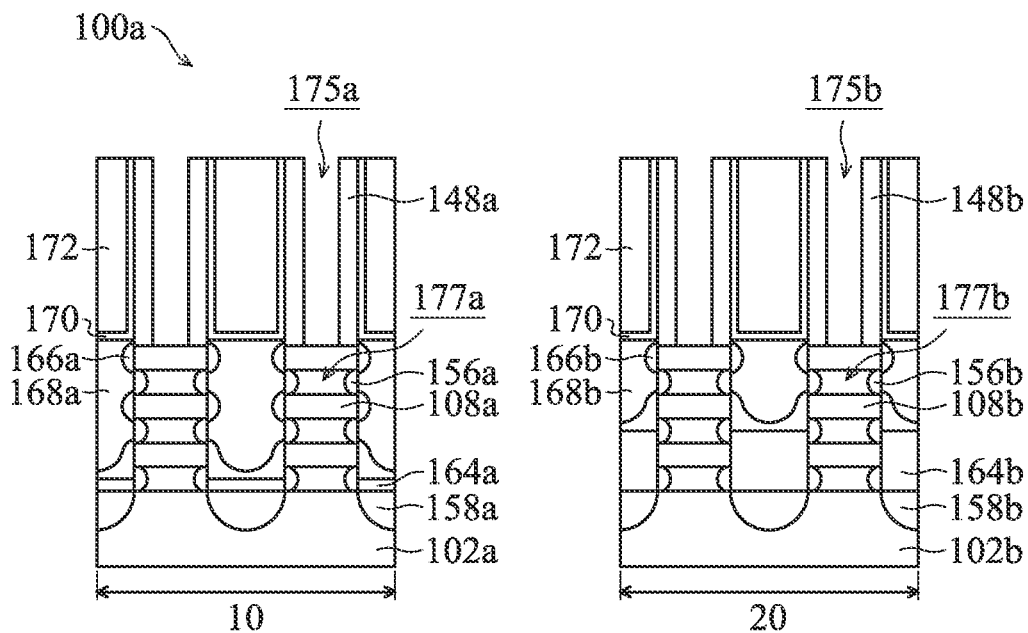
Figures 2, 3O:
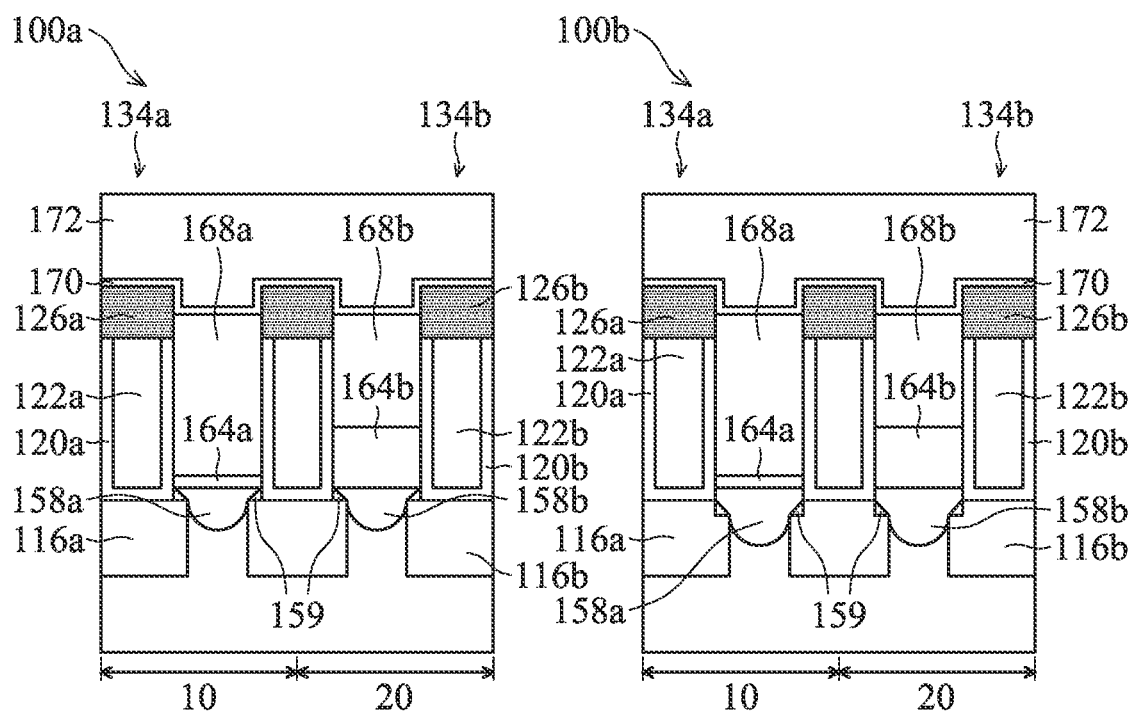
Figures 1, 3P:
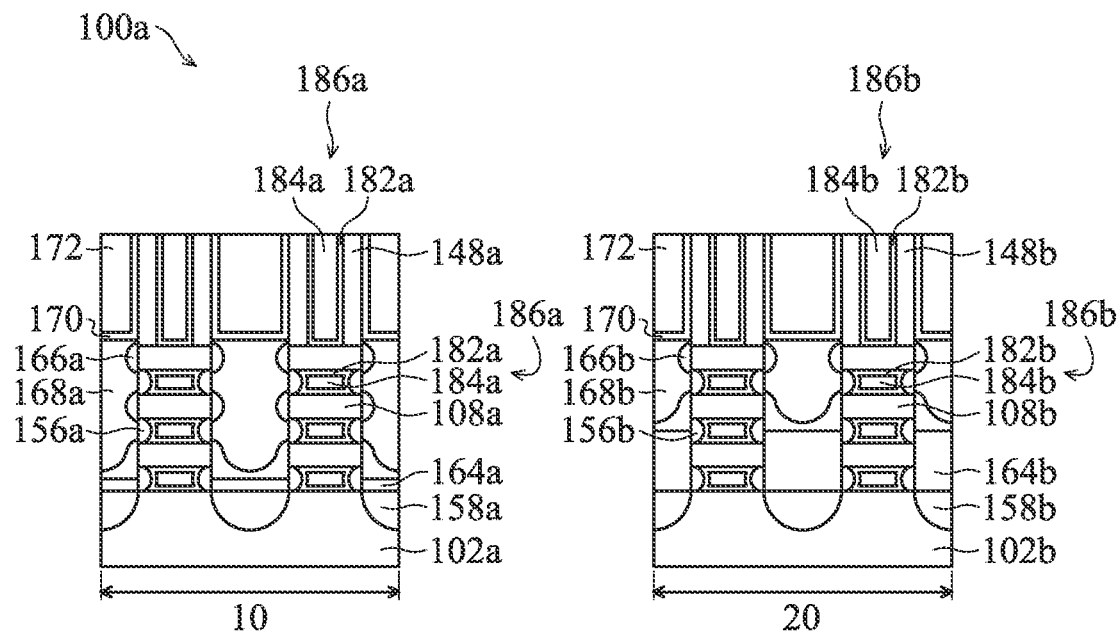
Figures 2, 3P:
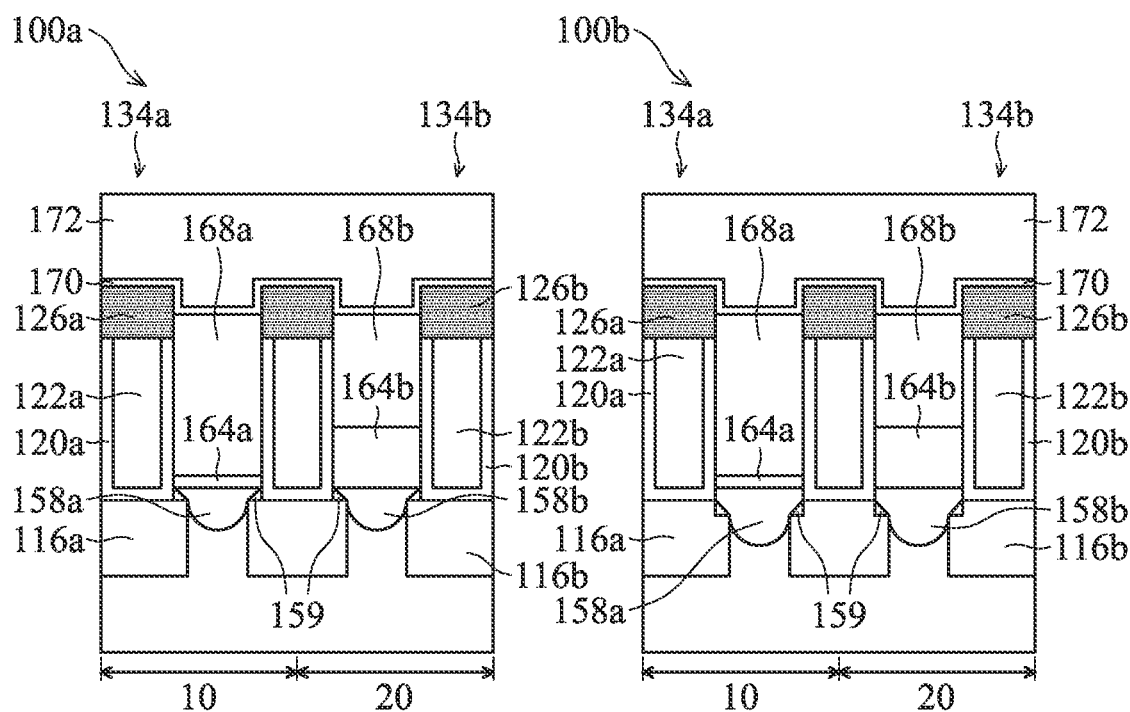

FIG. 3A-1 to 3P-1 (e.g., figures designated with the suffix "-1") show cross-sectional representations of various stages of forming the semiconductor device structure 100a along line $X_1$-$X_1$' (e.g., along the fin structure 104-1) and $X_2$-$X_2$' (e.g., along the fin structure 104-2) as shown in FIG. 2K, in accordance with some embodiments of the disclosure. FIG. 3A-2-3P-2 (e.g., figures designated with the suffix "-2") show cross-sectional representations of various stages of forming the semiconductor device structure 100a along line Y-Y' (e.g., through the source/drain regions) as shown in FIG. 2K, in accordance with some embodiments of the disclosure. FIG. 3A'-2-3P'-2 (e.g., figures designated with the suffix prime indicator "'") show cross-sectional representations of various stages of forming a semiconductor device structure 100b.

Accordingly, FIG. 3A-1 represents the cross-sectional view of the structure illustrated in FIG. 2K along the $X_1$-$X_1$' line and $X_2$-$X_2$' line, and FIG. 3A-2 represents the cross-sectional view of the structure illustrated in FIG. 2K along the Y-Y' line. As shown in FIG. 3A-1, the substrate 102 includes a first region 10 (e.g., the region of the fin structure 104-1) and a second region 20 (e.g., the region of the fin structure 104-2), wherein the first region 10 includes the first semiconductor layers 106a and the second semiconductor layers 108a, and the second region 20 includes the first semiconductor layers 106b and the second semiconductor layers 108b. The first semiconductor layers 106 collectively refers to the first semiconductor layers 106a and the first semiconductor layers 106b, and the second semiconductor layers 108 collectively refers to the second semiconductor layers 108a and the second semiconductor layers 108b. The first dummy gate structure 136a includes a first dummy gate dielectric layer 138a and a first dummy gate electrode layer 140a over the first region 10 of the first substrate 102a. The second dummy gate structure 136b includes a second dummy gate dielectric layer 138b and a second dummy gate electrode layer 140b over the second region 20 of the second substrate 102b.

As shown in FIG. 3A-2, a first cladding layer 118a is formed over the first region 10, and a second cladding layer 118b is formed over the second region 20, in accordance with some embodiments of the disclosure. A first dielectric feature 134a of the dielectric features 134 includes a first liner layer 120a, a first filling layer 122a and a first cap layer 126a over the first region 10. A second dielectric feature 134b of the dielectric features 134 includes a second liner layer 120b, a second filling layer 122b and a second cap layer 126b over the second region 20.

The semiconductor structure 100b of FIG. 3A'-2 includes elements that are similar to, or the same as, elements of the semiconductor structure 100a of FIG. 3A-2, whereas like reference numerals refer to like elements, wherein FIG. 3A'-2 illustrates embodiments in which the first cladding layer 118a extends into the first isolation structure 116a and the second cladding layer 118b extends into the second isolation structure 116b. In other words, a portion of the first cladding layer 118a is below the top surface of the first isolation structure 116a and a portion of the second cladding layer 118b is below the top surface of the second isolation structure 116b. In some embodiments, the first cladding layer 118a and the second cladding layer 118b are formed by a epitaxy process, and therefore a portion of the first cladding layer 118a and a portion of the second cladding layer 118b may insert into the first isolation structure layer 116a and the second isolation structure layer 116b.

Next, as shown in FIG. 2L, FIG. 3B-1, and FIG. 3B-2, a first S/D recess 150a is formed over the first region 10 and a second S/D recess 150b is formed over the second region 20, in accordance with some embodiments of the disclosure. After the dummy gate structures 136 are formed, gate spacers 148 are formed along opposing sidewalls of the dummy gate structure 136, in accordance with some embodiments. In some embodiments, the gate spacers 148 also cover some portions of the top surfaces and the sidewalls of the dielectric features 134.

Afterwards, source/drain (S/D) recesses 150 are formed adjacent to the gate spacers 148. More specifically, the fin structures 104-1 and 104-2 and the cladding layers 118 not covered by the dummy gate structures 136 and the gate spacers 148 are recessed. In addition, in some embodiments, the top portions 134T of the dielectric features 134 are also recessed to have recessed portions 134T_R at the source/drain regions in accordance with some embodiments. In some other embodiments, the cap layers 126 are completely removed.

The gate spacers 148 may be configured to separate source/drain structures (formed afterwards) from the dummy gate structure 136. In some embodiments, the gate spacers 148 are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof.

In some embodiments, the fin structures 104-1 and 104-2 and the cladding layers 118 are recessed by performing one or more etching processes. The etching process may be an anisotropic etching process, such as dry plasma etching, and the dummy gate structure 136 and the gate spacers 148 may be used as etching masks during the etching process.

Afterwards, as shown in FIG. 3B-2, the bottom surface of the first S/D recess 150a is lower than the top surface of the first isolation structure 116a, and the bottom surface of the second S/D recess 150b is lower than the top surface of the second isolation structure 116b, in accordance with some embodiments of the disclosure.

The semiconductor structure 100b of FIG. 3B'-2 includes elements that are similar to, or the same as, elements of the semiconductor structure 100a of FIG. 3B-2, whereas like reference numerals refer to like elements, wherein the first S/D recess 150a of FIG. 3B'-2 has an extending portion that extends into a portion of the first isolation structure 116a, and the second S/D recess 150b has an extending portion extending into a portion of the second isolation structure 116b.

Afterwards, as shown in FIG. 3C-1, a portion of the first semiconductor layers 106a over the first region 10 is removed to form a number of notches, and first inner spacers 156a are formed in the notches, in accordance with some embodiments of the disclosure. In addition, a portion of the first semiconductor layers 106b over the second region 20 is removed to form a notch, and second inner spacers 156b are formed in the notches. The first inner spacers 156a and the second inner spacers 156b are configured to as a barrier between an S/D structure (formed later) and a gate structure (formed later). The first inner spacers 156a and the second inner spacers 156b can reduce the parasitic capacitance between the S/D structure (formed later) and the gate structure (formed later). The first inner spacers 156a and the second inner spacers 156b may be formed by depositing a dielectric material using a conformal deposition process, such as CVD, ALD, or the like. The dielectric material may comprise a material such as silicon nitride or silicon oxynitride, although any suitable material, such as low-dielectric constant (low-k) materials having a k-value less than about 3.5, may be utilized. The dielectric material may then be anisotropically etched to form the first inner spacers 156a and the second inner spacers 156b as illustrated in FIG. 3C-1.

FIG. 3C-2 and 3C'-2 is similar to, or the same as, FIG. 3B-2 and 3B'-2, respectively, in accordance with some embodiments of the disclosure.

Next, as shown in FIG. 3D-1, a first bottom layer 158a is formed in the first S/D recess 150a over the first region 10, and a second bottom layer 158b is formed in the second S/D recess 150b over the second region 20, in accordance with some embodiments of the disclosure. The top surface of the first bottom layer 158a is substantially level with the top surface of the second bottom layer 158b. The top surface of the first bottom layer 158a is substantially level with the bottom surface of a bottom first inner spacer 156a. In addition, the top surface of the second bottom layer 158b is substantially level with the bottom surface of a bottom second inner spacer 156b. The first bottom layer 158a and the second bottom layer 158b are formed to reduce the leakage current and to reduce the height variations between the center portion and the edge portion of the substrate 102.

The first bottom layer 158a and the second bottom layer 158b are used to define the locations of a first insulating layer 164a (formed later) and a second insulating layer 164b (formed later), respectively, and to further define the effective nanostructure number (e.g. number of nanowires, nanosheets, or the like) and to achieve multi-nanostructures (e.g. multi-nanowires, multi-nanosheets, or the like) co-exist.

In some embodiments, the first bottom layer 158a and the second bottom layer 158b are simultaneously formed, and the top surface of the first bottom layer 158a and the top surface of the second bottom layer 158b are in the same level.

In some embodiments, the first bottom layer 158a and the second bottom layer 158b include un-doped Si, un-doped SiGe or a combination thereof. The materials of the first bottom layer 158a and the second bottom layers 158b may be the same or different. In some embodiments, the first bottom layer 158a and the second bottom layer 158b are formed by an epitaxy or epitaxial (epi) process, either simultaneously or in separate processes. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes. In some embodiments, an epitaxy material is grown and also partially removed during the epi process. More specifically, the epitaxy material may be grown over the bottom portion of the first S/D recess 150a, the bottom portion of the second S/D recess 150b and the exposed sidewalls of the second semiconductor layers 108a, 108b. Since the exposed sidewalls of the second semiconductor layers 108a, 108b have relatively smaller size, the growth rate of the epitaxy material over the second semiconductor layers 108a, 108b may be smaller than that of the epitaxy material over the bottom portion of the first S/D recess 150a and the bottom portion of the second S/D recess. That is, less epitaxy material is formed on the sidewalls of the second semiconductor layers 108a, 108b than that over the bottom portion of the first S/D recess 150a and the bottom portion of the second S/D recess 150b. Accordingly, the epitaxy material on the sidewalls of the second semiconductor layers 108a, 108b may be completely removed during the epi process, while epitaxy material over the bottom portion of the first S/D recess 150a and the bottom portion of the second S/D recess 150b remains, such that the first bottom layer 158a and the second bottom layer 158b are formed in the bottom portion of the first S/D recess 150a and the bottom portion of the second S/D recess 150b respectively.

The top portion of the first bottom layer 158a may have different shapes due to the deposition step and removal step during the epi process. In some embodiments, the first bottom layer 158a have curved top surface. In some other embodiments, the top surface of the first bottom layer 158a is convex. In some other embodiments, the top surface of the first bottom layer 158a is substantially flat. In some other embodiments, the top surface of the first bottom layer 158a is concave.

As shown in FIG. 3D-2, the top surface of the first bottom layer 158a is higher than the top surface of the first isolation structure 116a. The top surface of the second bottom layer 158b is higher than the top surface of the second isolation structure 116b. As the first bottom layer 158a is epitaxially grown from the crystalline structure of the substrate 102, gaps 159 may be formed between the first bottom layer 158a and the first isolation structure 116a. Similarly, the gaps 159 may be formed between the second bottom layer 158b and the second isolation structure 116b as the second bottom layer 158b is epitaxially grown from the substrate 102.

As shown in FIG. 3D'-2 the first bottom layer 158a has the extending portion that extends into a portion of the first isolation structure 116a, and the second bottom layer 158b also has the extending portion that extends into a portion of the second isolation structure 116b.

Next, as shown in FIG. 3E-1, a first insulating layer 164a is formed over the first dummy gate structure 136a and the first bottom layer 158a, and a second insulating layer 164b is formed over the second dummy gate structure 136b and the second bottom layer 158b by a deposition process 30, in accordance with some embodiments of the disclosure. The first insulating layer 164a and the second insulating layer 164b are used to further reduce the leakage current since they are made of insulating materials.

In some embodiments, the first insulating layer 164a and the second insulting layer 164b are made of SiN, SiON, SiOCN, SiOC, SiCN, Ox, AlOx, HfOx, low-k or another applicable material. When the first insulating layer 164a and the second insulting layer 164b are made of low-k materials, the unwanted parasitic capacitance is further reduced. In some embodiments, the deposition process 30 includes CVD process, ALD process, another applicable process, or a combination thereof. In some embodiments, when the first insulating layer 164a and the second insulting layer 164b are formed by a PEALD process, and the precursor includes dichlorosilane, and $NH_3$, the first insulating layer 164a and the second insulting layer 164b are made of SiN. The first insulating layer 164a and the second insulating layer 164b may be the same or different materials.

As shown in FIG. 3E-2, the first insulating layer 164a is formed over the first cap layer 126a, the first liner layer 120a, and the first bottom layer 158a, in accordance with some embodiments of the disclosure. The second insulating layer 164b is formed over the second cap layer 126b, and the second liner layer 120b and the second bottom layer 158b.

FIG. 3E'-2 illustrates elements that are similar to, or the same as, elements of FIG. 3E-2 (where like reference numerals refer to like elements), wherein the first bottom layer 158a and the second bottom layer 158b of FIG. 3E-2 have extending portions that extend into the first isolation structure 116a and the second isolation structure 116b.

Next, as shown in FIG. 3F-1, a treatment process 40 is performed on the first insulating layer 164a and the second insulating layer 164b, in accordance with some embodiments of the disclosure. The treatment process 40 is used to modify the properties of the first insulating layer 164a and the second insulating layer 164b, such that the etch rate of the bottom portions of the first insulating layer 164a and the second insulating layer 164b is different than the etch rate of the sidewall portions. As a result, the sidewall portions of the first insulating layer 164a and the second insulating layer 164b may be removed while leaving bottom portions of the first insulating layer 164a and the second insulating layer 164b as described in greater detail below.

In some embodiments, the treatment process 40 is a plasma process, and the plasma process includes using nitrogen ($N_2$) and argon (Ar). In some embodiments, the treatment process 40 is operated at a pressure in a range from about 1.5 Torr to about 10 Torr. In some embodiments, the treatment process 40 is operated at a temperature in a range from about 300 Celsius degrees to about 600 Celsius degrees. When the treatment process is operated at the above-mentioned range, the bottom portions in respect to the sidewall portions of the first insulating layer 164a and the second insulating layer 164b have large etching selectivity.

After the deposition process 30, the first insulating layer 164a and the second insulating layer 164b both have substantially the same chlorine (Cl) concentration. The chlorine (Cl) is the by-produce from dichloride used to form the first insulating layer 164a and the second insulating layer 164b. After the treatment process 40, the chlorine (Cl) concentration of the bottom portions of the first insulating layer 164a and the second insulating layer 164b is lower than the chlorine (Cl) concentration of the sidewall portions of the first insulating layer 164a and the second insulating layer 164b, and the bottom portions are left while the sidewall portions are removed. In addition, after the treatment process 40, the density of the bottom portions of the first insulating layer 164a and the second insulating layer 164b are higher than the density of the sidewall portions of the first insulating layer 164a and the second insulating layer 164b.

FIG. 3F-2 and 3F'-2 includes elements similar to, or the same as, elements of FIG. 3E-2 and 3E'-2, where like reference numerals refer to like elements, in accordance with some embodiments of the disclosure.

Next, as shown in FIG. 3G-1, sidewall portions of the first insulating layer 164a and sidewall portions of the second insulating layer 164b are removed by an etching process 50, in accordance with some embodiments of the disclosure. Since the bottom portions in respect to the sidewall portions have large etching selectivity, sidewall portions are removed while the bottom portions are left. More specifically, the bottom portion of the first insulating layer 164a and the bottom portion of the second insulating layer 164b are remaining. In some embodiments, the etching process 50 is a wet etching process. In embodiments in which the first insulating layer 164a and the second insulating layer 164b comprise SiN_, the etching process 50 includes using DHF (diluted hydrofluoric acid) solution.

A process cycle comprising the deposition process 30, the treatment process 40, and the etching process 50 may be performed one or more times. For example, the process cycle may be performed multiple times to gradually increase thicknesses of the bottom portion of the first insulating layer 164a and the bottom portion of the second insulating layer 164b.

As shown in FIG. 3H-2, the bottom portion of the first insulating layer 164a and the bottom portion of the second insulating layer 164b are gradually increased.

FIG. 3H'-2 includes elements similar to, or the same as, elements of FIG. 3H-2 (wherein like reference numerals refer to like elements), wherein FIG. 3H'-2 illustrates the first bottom layer 158a and the second bottom layer 158b having extending portions that extends into the first isolation structure 116a and the second isolation structure 116b as discussed above.

Afterwards, as shown in FIG. 3I-1, a mask layer 161b is formed over the second bottom layer 158b over the second region 20 to expose the first insulating layer 164a in the first region 10, in accordance with some embodiments of the disclosure. In some embodiments, the mask layer 161b is a photoresist layer that has been deposited and patterned.

As shown in FIG. 3I-2, the mask layer 161b is formed to cover the second bottom layer 158b, the second insulating layer 164b over the second region 20.

FIG. 3I'-2 includes elements is similar to, or the same as, elements of FIG. 3I-2 (where like reference numerals refer to like elements), wherein FIG. 3I-2' illustrates that the first bottom layer 158a and the second bottom layer 158b have extending portions that extends into the first isolation structure 116a and the second isolation structure 116b.

Next, as shown in FIG. 3J-1, the exposed first insulating layer 164a in the first region 10 is removed using a suitable etching process, in accordance with some embodiments of the disclosure. Next, the mask layer 161b is removed from the second region 20. In some embodiments, the mask layer 161b is removed by an etching process, such as wet etching process or dry etching process.

As shown in FIG. 3J-2, the exposed first insulating layer 164a in the first region 10 is removed, in accordance with some embodiments of the disclosure.

FIG. 3J'-2 includes elements is similar to, or the same as, elements of FIG. 3J-2 (where like reference numerals refer to like elements), wherein FIG. 3J'-2 illustrates that the first bottom layer 158a and the second bottom layer 158b have extending portions that extends into the first isolation structure 116a and the second isolation structure 116b.

Next, as shown in FIG. 3K-1, a first insulating layer 164a is re-formed over the first bottom layer 158a, in accordance with some embodiments of the disclosure. Next, the mask layer 161b over the second region 20 is removed after the first insulating layer 164a is re-formed. The top surface of the first insulating layer 164a is lower than the top surface of the second insulating layer 164b.

The thicknesses of the first insulating layer 164a and the second insulating layer 164b may be individually controlled to determine how many of the second semiconductor layers 108a, 108b remain exposed. For example, FIG. 3K-1 illustrates an embodiment in which the height of the bottommost inner spacers of the first inner spacers 156a is greater than the height of the first insulating layer 164a along a vertical direction (Z-axis), thereby leaving all of the second semiconductor layers 108a exposed. The height of the lowest second inner spacers 156b is smaller than the height of the second insulating layer 164b, thereby covering at least the bottommost layer of the second semiconductor layers 108b in the second region 20. The re-formed first insulating layer 164a has a first height $H_1$ along a vertical direction (Z-axis), and the second insulating layer 164b has a second height $H_2$ along a vertical direction (Z-axis). In some embodiments, the height of the bottommost inner spacer of the first inner spacers 156a is in a range from about 5 nm to about 7 nm along a vertical direction (Z-axis). In some embodiments, the height of the bottommost inner spacer of the second inner spacers 156b is in a range from about 5 nm to about 7 nm along a vertical direction (Z-axis). In some embodiments, the first height $H_1$ is in a range of about 3 nm to about 6 nm. In some embodiments, the second height $H_2$ is in a range of about 17 nm to about 20 nm.

As shown in FIG. 3K-2, the first insulating layer 164a is re-formed over the first bottom layer 158a in the first region 10, in accordance with some embodiments of the disclosure.

FIG. 3K'-2 includes elements is similar to, or the same as, elements of FIG. 3K-2 (where like reference numerals refer to like elements), wherein FIG. 3K'-2 illustrates that the first bottom layer 158a and the second bottom layer 158b have extending portions that extends into the first isolation structure 116a and the second isolation structure 116b.

Exposing all of the second semiconductor layers 108a in the first region 10 and covering only the bottommost layer of the second semiconductor layers 108b in the second region 20 as discussed above is provided for illustrative purposes only to demonstrate that the number of exposed second semiconductor layers (and, hence, channel regions) may be individually controlled to individually adjust the operating characteristics of the transistors. In some embodiments, any number of nanostructures may be exposed and/or covered in different regions of the substrate.

Afterwards, as shown in FIG. 3L-1, first S/D structures are formed over the first insulating layer 164a, and second S/D structures are formed over the second insulating layer 164b, in accordance with some embodiments of the disclosure. In some embodiments, the first S/D structures includes the sub-portion 166a and the sub-portion 168a which are made of the same materials but have different doping concentrations. In some other embodiments, the sub-portion 166a and the sub-portion 168a of the first S/D structures are made of different materials. The first S/D structures including sub-portions 166a, 168a are isolated from the first bottom layer 158a by the first insulating layer 164a in the first region 10.

In some embodiments, the second S/D structures includes the sub-portion 166b and the sub-portion 168b which are made of the same materials but have different doping concentrations. In some other embodiments, the sub-portion 166b and the sub-portion 168b of the second S/D structures are made of different materials. The second S/D structures including sub-portions 166b, 168b are isolated from the second bottom layer 158b by the second insulating layer 164b over the second region 20.

In some embodiments, the first height of the first S/D structure including sub-portions 166a, 168a is greater than the second height of the second S/D structure including sub-portions 166b, 168b. The first S/D structure including sub-portions 166a, 168a and the second S/D structure including sub-portions 166b, 168b may independently include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The first S/D structure including sub-portions 166a, 168a and the second S/D structure including sub-portions 166b, 168b may be doped with one or more dopants. In some embodiments, the first S/D structure including sub-portions 166a, 168a or the second S/D structure including sub-portions 166b, 168b is silicon (Si) doped with phosphorus (P), arsenic (As), antimony (Sb), or another applicable dopant. Alternatively, the first S/D structure including sub-portions 166a, 168a or the second S/D structure including sub-portions 166b, 168b is silicon germanium (SiGe) doped with boron (B) or another applicable dopant.

In some embodiments, the first S/D structure including sub-portions 166a, 168a and the second S/D structure including sub-portions 166b, 168b are formed by an epitaxy or epitaxial (epi) process. In some other embodiments, the first S/D structure and the second S/D structure are formed in separated processes. The heights of the first S/D structure and the second S/D structure may be individually controlled to individually adjust the conditions of the epi process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, when an N-type FET (NFET) device is desired, the first S/D structure and the second S/D structure include an epitaxially growing silicon (epi Si). Alternatively, when a P-type FET (PFET) device is desired, the first S/D structure and the second S/D structure include an epitaxially growing silicon germanium (SiGe). In some embodiments, the first S/D structure and the second S/D structure may have different conductivity types.

As shown in FIG. 3L-2, the first S/D structure and the second S/D structure are formed over the first insulating layer 164a and the second insulating layer 164b. The top surface of the first S/D structure is lower than the top surface of the first cap layer 126a and higher than the top surface of the first filling layer 122a. In other words, the top surface of the first cap layer 126a is higher than the top surface of the first S/D structure. The top surface of the second S/D structure is lower than the top surface of the second cap layer 126b and higher than the top surface of the second filling layer 122b.

In some embodiments, the first region 10 and the second region 20 may have the same conductivity type. As such, the thickness of the first insulating layer 164a and the thickness of the second insulating layer 164b may be individually controlled to form transistors of the same conductivity type having different operating characteristics. In some embodiments, the first region 10 and the second region 20 may have different conductivity types.

FIG. 3L'-2 includes elements is similar to, or the same as, elements of FIG. 3L-2 (where like reference numerals refer to like elements), wherein FIG. 3L'-2 illustrates that the first insulating layer 164a is formed over the first bottom layer 158a with the extending portion, and the second insulating layer 164b is formed over the second bottom layer 158b with the extending portion.

Afterwards, as shown in FIG. 3M-1, a contact etch stop layer (CESL) 170 is formed over the first S/D structure with sub-portions 166a, 168a and the second S/D structure with sub-portions 166b, 168b, and an inter-layer dielectric (ILD) layer 172 is formed over the CESL 170, in accordance with some embodiments. Next, a portion of the ILD layer 172 is removed to expose the top surface of the first dummy gate electrode layer 140a and the top surface of the second dummy gate electrode layer 140b. In some embodiments, the portion of the ILD layer 172 is removed by a planarizing process, a chemical mechanical polishing (CMP) process.

As shown in FIG. 3M-2, the CESL 170 is formed over the first cap layer 126a and the second cap layer 126b, and the ILD layer 172 is formed over the CESL 170, in accordance with some embodiments of the disclosure.

FIG. 3M'-2 includes elements is similar to, or the same as, elements of FIG. 3M-2 (where like reference numerals refer to like elements), wherein FIG. 3M'-2 illustrates that the CESL 170 is formed over the first bottom layer 158a with the extending portion and the second bottom layer 158b with the extending portion.

Afterwards, as shown in FIG. 3N-1, the first dummy gate structure 136a and the second dummy gate structure 136b are removed to form a first trench 175a over the first region 10 and a second trench 175b over the second region 20, in accordance with some embodiments of the disclosure.

FIG. 3N-2 includes elements similar to, or the same as, elements of FIG. 3M-2, where like reference numerals refer to like elements. FIG. 3N'-2 includes elements similar to, or the same as, elements of FIG. 3M'-2 (where like reference numerals refer to like elements), in accordance with some embodiments of the disclosure.

Next, as shown in FIG. 3O-1, the first semiconductor layer 106a over the first region 10 and the first semiconductor layers 106b over the second region 20 are removed to form a number of first gaps 177a over the first region 10 and a number of second gaps 177b over the second region 20, in accordance with some embodiments. As a result, a number of stacked structures made of the second semiconductor layers 108a, 108b is obtained. A number of nanostructures (e.g. the second semiconductor layers 108a, 108b) is stacked in the vertical direction.

FIG. 3O-2, is similar to, or the same as, FIG. 3N-2. FIG. 3O'-2, is similar to, or the same as, FIG. 3N'-2, in accordance with some embodiments of the disclosure.

Afterwards, as shown in FIG. 3P-1, a first gate structure 186a is formed in the first trench 175a and the first gaps 177a over the first region 10, and a second gate structure 186b is formed in the second trench 175b and the second gaps 177b over the second region 20, in accordance with some embodiments. As a result, the number of nanostructures (e.g. the second semiconductor layers 108a in the first region 10) are surrounded by the first gate structure 186a in the first region 10, and the number of nanostructures (e.g. the second semiconductor layers 108b in the second region 20) are surrounded by the second gate structure 186b in the second region 20. The portion of the second semiconductor layers 108a in the first region 10 covered by the first gate structure 186a can be referred to as a channel region. The portion of the second semiconductor layers 108a in the second region 20 covered by the second gate structure 186b can be referred to as a channel region.

The first gate structure 186a includes a first gate dielectric layer 182a and a first gate electrode layer 184a. The second gate structure 186b includes a second gate dielectric layer 182b and a second gate electrode layer 184b. The first gate dielectric layer 182a is conformally formed along the main surfaces of the second semiconductor layers 108a, 108b to surround the second semiconductor layers 108a, 108b.

The first inner spacers 156a are between the first gate structure 186a and the first S/D structures 166a, 168a. The second inner spacers 156b are between the second gate structure 186b and the second S/D structure 166b, 168b.

In some embodiments, the first gate dielectric layer 182a and the second gate dielectric layer 182b independently include a high-k dielectric layer. In some embodiments, the high-k gate dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the high-k gate dielectric layer is formed using chemical vapor deposition (CVD), atomic layer deposition (ALD), another suitable method, or a combination thereof.

In some embodiments, the first gate electrode layer 184a and the second gate electrode layer 184b independently include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof.

In addition, the first gate electrode layer 184a and the second gate electrode layer 184b independently include one or more layers of n-work function layer and/or p-work function layer. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

FIG. 3P-2 includes elements similar to, or the same as, elements of FIG. 3O-2 (where like reference numerals refer to like elements), and FIG. 3P'-2 includes elements is similar to, or the same as, elements of FIG. 3O'-2 (where like reference numerals refer to like elements), in accordance with some embodiments of the disclosure.

The first insulating layer 164a is in direct contact with the liner layer 120a of the dielectric features 134. In addition, the second insulating layer 164b is in direct contact with the liner layer 120b of the dielectric features 134.

The location of the second insulating layer 164b determines the function of the nanostructure (e.g. which of the second semiconductor layers 108a, 108b are workable or not). In the embodiment illustrated in FIG. 3P-2, the bottommost nanostructure of the second semiconductor layers 108b in the second region 20 is below the top surface of the second insulating layer 164b. Furthermore, the second insulating layer 164b is in direct contact with the bottommost nanostructures of the second semiconductor layers 108b in the second region 20. Therefore, the bottommost one of nanostructures (e.g. the bottommost second semiconductor layers 108b in the second region 20) cannot perform the function of a channel of the semiconductor device structure 100b. Therefore, the effective nanostructure number of semiconductor device structure 100b in the second region 20 is two.

As mentioned above, the first bottom layer 158a, the second bottom layer 158b, the first insulating layer 164a, and the second insulating layer 164b are used to define the effective (or active) nanostructure number (e.g. number of nanosheets, nanowires, or the like) and to achieve multi-nanostructures (e.g. nanosheets, nanowires, or the like) co-exist. In the first region 10, the first bottom layer 158a and the first insulating layer 164a provide isolation functions, and therefore the first S/D structure with sub-portions 166a, 168a is isolated from the first bottom layer 158a by the first insulating layer 164a. In the second region 20, the second bottom layer 158b and the second insulating layer 164b provide isolation functions, and therefore the second S/D structure with sub-portions 166b, 168b is isolated from the second bottom layer 158b by the second insulating layer 164b.

In the first region 10, there are three nanostructures (e.g. three second semiconductor layers 108a in the first region 10), and the effective (or active) nanostructure number is three due to the first insulating layer 164a lower than the bottommost one of the nanostructures. In the second region 20, there are three nanostructures (e.g. three second semiconductor layers 108b in the second region 20), but the effective (or active) nanostructure number is two due to the second insulating layer 164b higher than the top surface of the bottommost one of the nanostructures.

More nanostructures (e.g. three second semiconductor layers 108a in the first region 10) can provide large effective width ($W_{eff}$) of the channel. The large effective width ($W_{eff}$) of channel can provide high speed of the semiconductor device structure. However, the larger effective width of the channel consumes more power. For high speed performance consideration, larger effective width ($W_{eff}$) is formed by having more nanostructures. For power efficiency consideration, smaller effective width ($W_{eff}$) is formed by having fewer nanostructures (e.g., two second semiconductor layers 108b in the second region 20). In order to fulfill different needs in different regions, the effective nanostructure number can be controlled by defining the locations of the first bottom layer 158a, the second bottom layer 158b, the first insulating layer 164a and the second insulating layer 164b. The effective nanostructure number of semiconductor device structure 100a in the second region 20 is fewer than the effective nanostructure number of the semiconductor device structure 100a in the first region 10. Therefore, the semiconductor device structure 100a in the second region 20 is formed for power efficiency and the semiconductor device structure 100a in the first region 10 is formed for high speed performance.

The effective width ($W_{eff}$) of the channel may be controlled by adjusting the width of nanostructure along the X-direction or the Y-direction. If the semiconductor device structure with large effective width ($W_{eff}$) of the channel is designed along the X-direction or the Y-direction, it may occupy too much area. If the semiconductor device structure with small effective width ($W_{eff}$) of the channel is designed along the X-direction or the Y-direction, the process window for filling the gate structure or forming the S/D structure may be decreased. In some embodiments, the effective width ($W_{eff}$) of the channel is controlled by defining the effective numbers of the nanostructures along the Z-direction, rather than or in addition to in the X-direction or the Y-direction, to reduce the cell area and improve the process window.

As shown in FIG. 3P-1, the first insulating layer 164a is lower than the second insulating layer 164b. More specifically, the top surface of the first insulating layer 164a is lower than the top surface of the second insulating layer 164b. The top surface of the second insulating layer 164b is higher than the top surface of the first insulating layer 164a. The top surface of the first insulating layer 164a is lower than the top surface of the bottommost inner spacer of the first inner spacers 156a and higher than the bottom surface of the bottommost inner spacer of the first inner spacers 156a. In some embodiments, the top surface of the first insulating layer 164a is substantially level with the top surface of the bottommost inner spacer of the first inner spacers 156a. The first insulating layer 164a is lower than the bottommost second semiconductor layer 108a over the first region 10. The second insulating layer 164b is higher than the bottommost second semiconductor layer 108b over the second region 20. One of the first inner spacers 156a is in direct contact with the first insulating layer 164a, and one of the second inner spacers 156b is in direct contact with the second insulating layer 164b.

Figures 1, 4A:
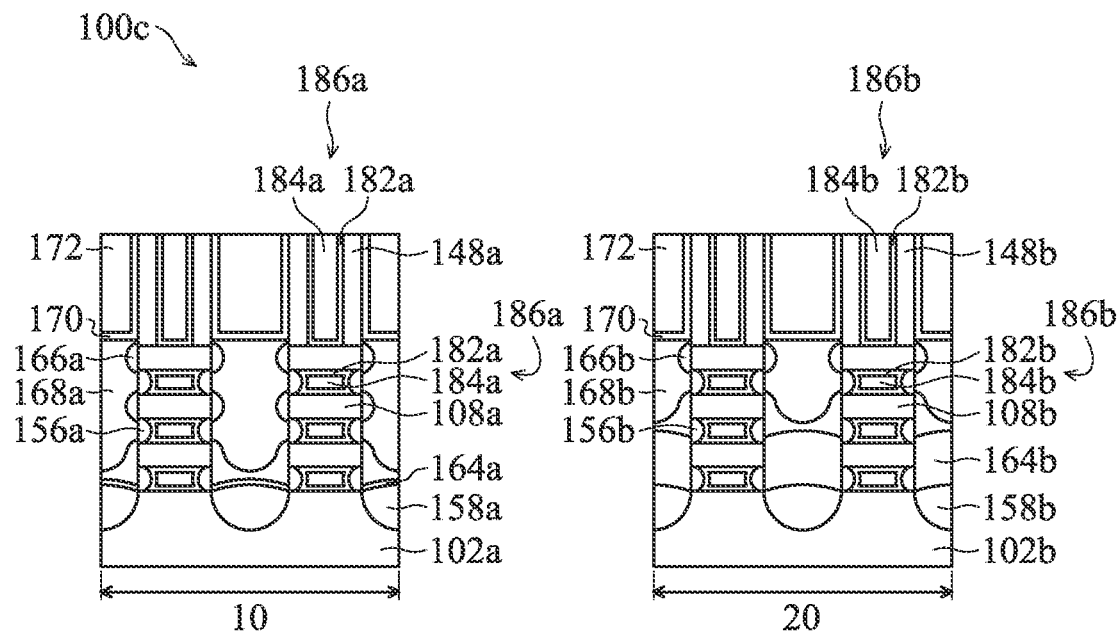
Figures 2, 4A:
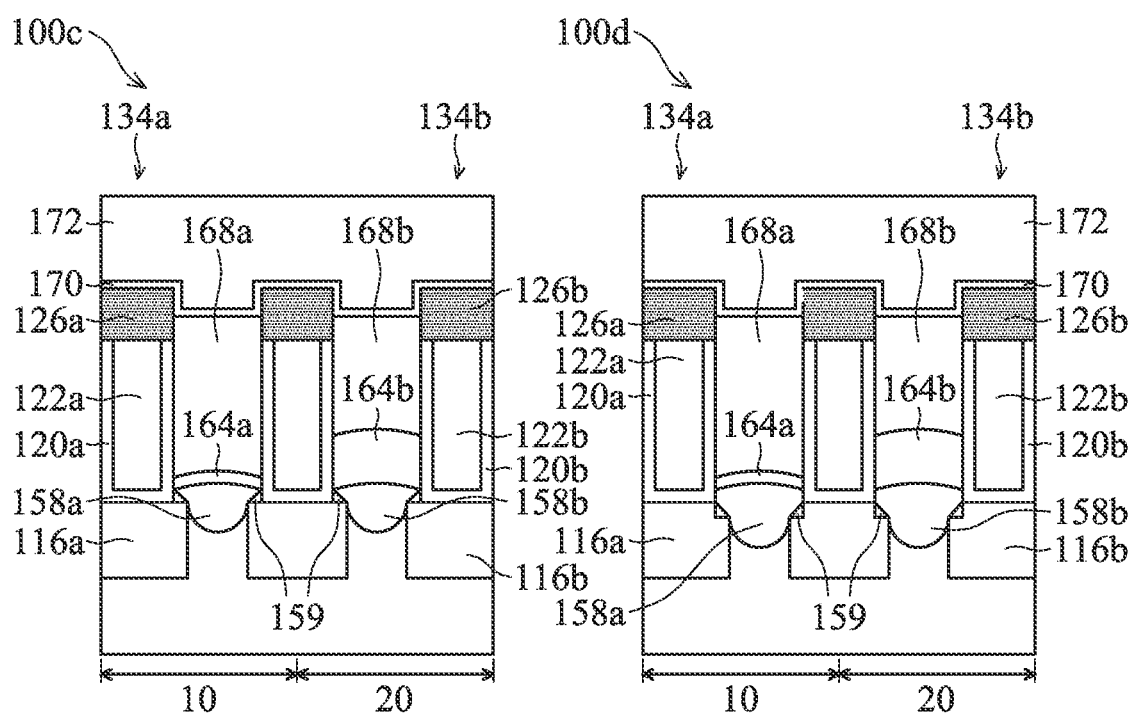

FIG. 4A-1 show a cross-sectional representation of a semiconductor device structure 100c along line X₁-X₁' and X₂-X₂' shown in FIG. 2K, in accordance with some embodiments of the disclosure. FIG. 4A-2 shows a cross-sectional representation of the semiconductor device structure 100c along line Y-Y' shown in FIG. 2K, in accordance with some embodiments of the disclosure. FIG. 4A'-2 shows a cross-sectional representation of forming the semiconductor device structure 100d.

The semiconductor structure 100c of FIG. 4A-1 includes elements similar to, or the same as, elements of the semiconductor structure 100a of FIG. 3P-1 (where like reference numerals refer to like elements), wherein FIG. 4A-1 illustrates that the first bottom layer 158a may have a curved top surface (mentioned before, in FIG. 3D-2), and the first insulating layer 164a may have a curved top surface along the shape of the first bottom layer 158a. In some embodiments, the top surface of the first insulating layer 164a is convex since the top surface of the first bottom layer 158a is convex. In addition, the second insulating layer 164b also has a curved top surface, and the top surface of the second insulating layer 164b is convex since the second bottom layer 158b is convex.

As shown in FIG. 4A-2, the convex top surface of the first insulating layer 164a is lower than the convex top surface of the second insulating layer 164b.

FIG. 4A'-2 includes elements similar to, or the same as, elements of FIG. 4A-2 (where like reference numerals refer to like elements), wherein FIG. 4A'-2 illustrates that the first bottom layer 158a has the extending portion and the second bottom layer 158b has the extending portion.

Figures 1, 5A:
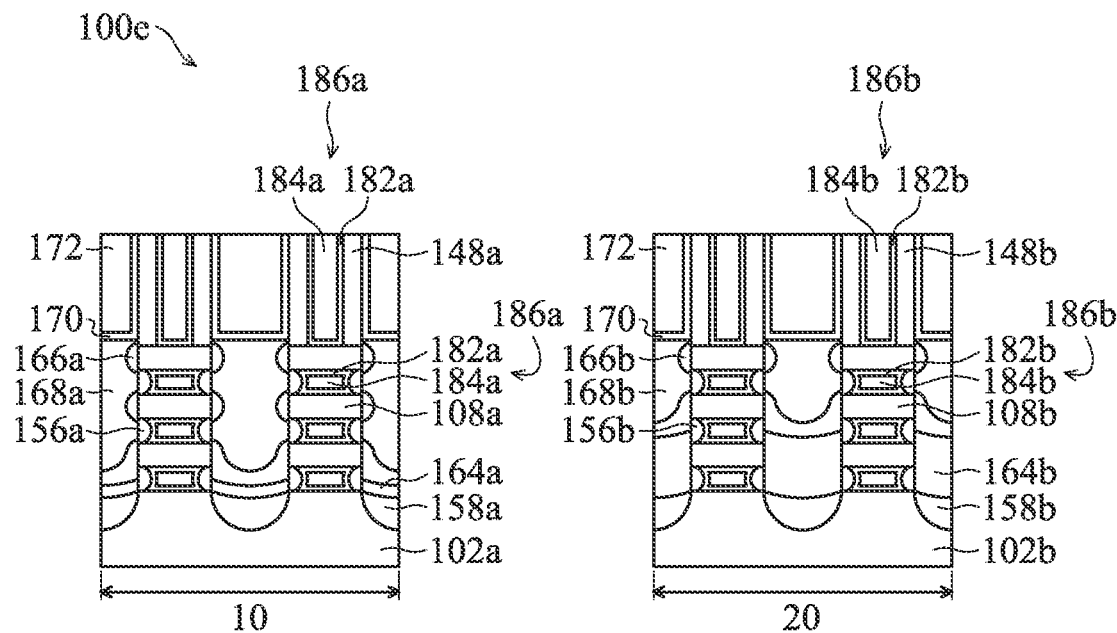
Figures 2, 5A:
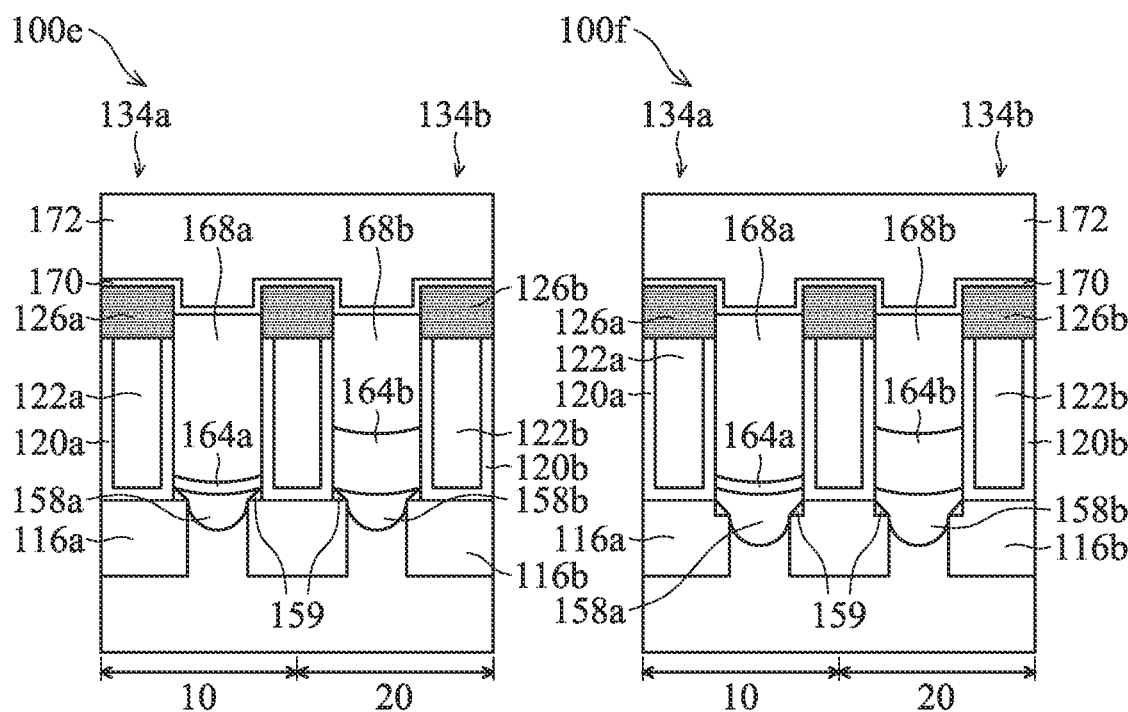

FIG. 5A-1 show a cross-sectional representation of a semiconductor device structure 100e along line X₁-X₁' and X₂-X₂' shown in FIG. 2K, in accordance with some embodiments of the disclosure. FIG. 5A-2 shows a cross-sectional representation of the semiconductor device structure 100e along line Y-Y' shown in FIG. 2K, in accordance with some embodiments of the disclosure. FIG. 5A'-2 shows a cross-sectional representation of forming the semiconductor device structure 100f.

The semiconductor structure 100e of FIG. 5A-1 includes elements similar to, or the same as, elements of the semiconductor structure 100a of FIG. 3P-1 (where like reference numerals refer to like elements), wherein FIG. 5A-1 illustrates that the first bottom layer 158a may have a curved top surface, and the first insulating layer 164a has a curved top surface along the shape of the first bottom layer 158a. In some embodiments, the top surface of the first insulating layer 164a is concave, since the top surface of the first bottom layer 158a is concave. In addition, the second insulating layer 164b is also has a curved top surface, and the top surface of the second insulating layer 164b is concave since the top surface of the second bottom layer 158b is concave.

As shown in FIG. 5A-2, the concave top surface of the first insulating layer 164a is lower than the concave top surface of the second insulating layer 164b.

FIG. 5A'-2 includes elements similar to, or the same as, elements of FIG. 5A-2 (where like reference numerals refer to like elements), wherein FIG. 5A'-2 illustrates that the first bottom layer 158a has the extending portion and the second bottom layer 158b has the extending portion.

Figure 6:
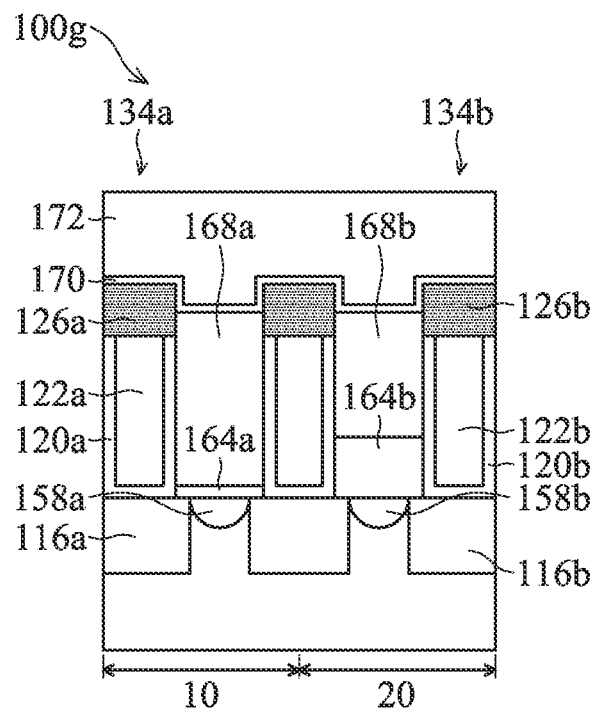
FIG. 6 shows a cross-sectional representation of the semiconductor device structure along line Y-Y' shown in FIG. 2K, in accordance with some embodiments of the disclosure.

FIG. 6 shows a cross-sectional representation of a semiconductor device structure 100g along line Y-Y' shown in FIG. 2K, in accordance with some embodiments of the disclosure.

The semiconductor structure 100g of FIG. 6 includes elements similar to, or the same as, elements of the semiconductor structure 100a of FIG. 3P-1 (where like reference numerals refer to like elements), wherein FIG. 6 illustrates that top surface of the first bottom layer 158a is leveled with the top surface of the first isolation structure 116a.

Figure 7:
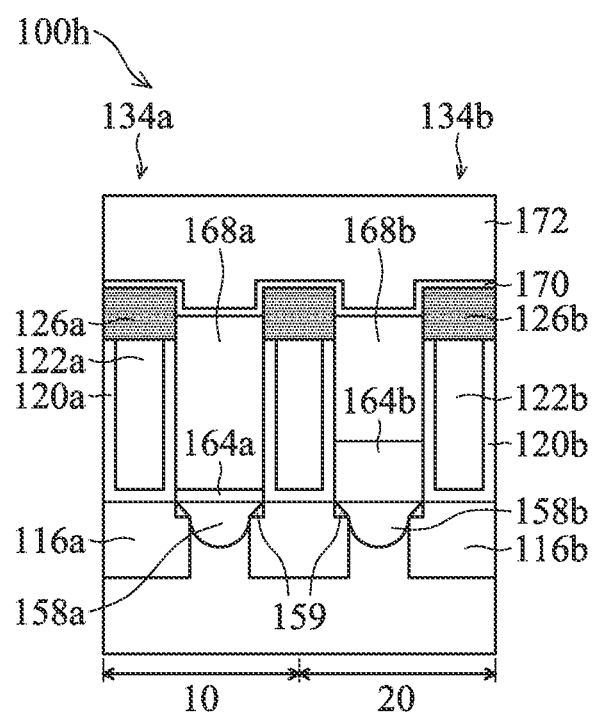
FIG. 7 shows a cross-sectional representation of the semiconductor device structure along line Y-Y' shown in FIG. 2K, in accordance with some embodiments of the disclosure.

FIG. 7 shows a cross-sectional representation of a semiconductor device structure 100h along line Y-Y' shown in FIG. 2K, in accordance with some embodiments of the disclosure.

The semiconductor structure 100h of FIG. 7 includes elements similar to, or the same as, elements of the semiconductor structure 100a of FIG. 3P'-2 (where like reference numerals refer to like elements), wherein FIG. 7 illustrates that top surface of the first bottom layer 158a is leveled with the top surface of the first isolation structure 116a.

Figure 8:
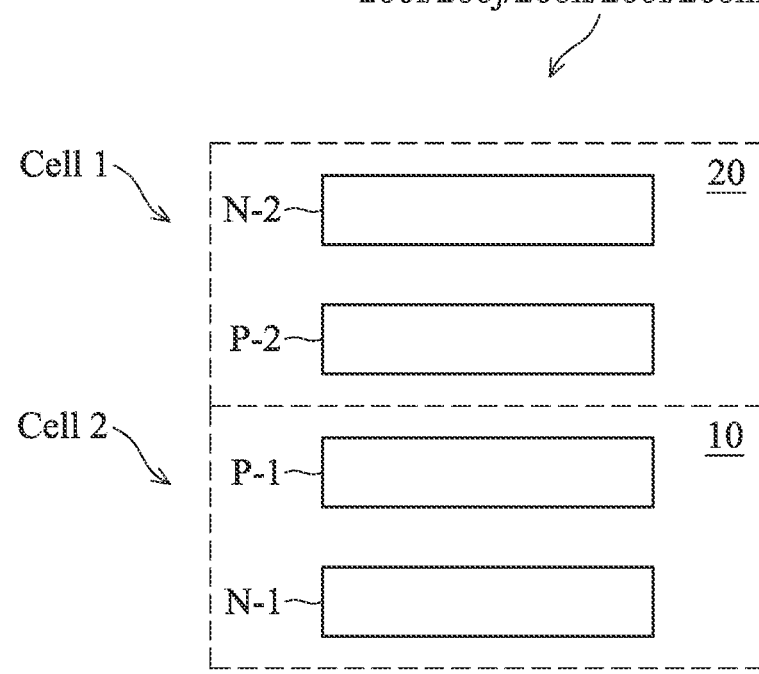
FIG. 8 shows a top view of a semiconductor structure, in accordance with some embodiments.

FIG. 8 shows a top view of a semiconductor structure 200a/200b/200c/200d/200e/200f/200g/200h/200i/200j/200k/20l/200m/200n, in accordance with some embodiments. FIG. 8 has been simplified for the sake of clarity to better understand the inventive concepts of the present disclosure. Additional features may be added in the semiconductor structure 200a/200b/200c/200d/200e/200f/200g/200h/200i/200j/200k/20l/200m/200n, and some of the features described below may be replaced, modified, or eliminated.

As shown in FIG. 8, a cell 1 in the second region 20 and a cell 2 in the first region 10 is illustrated. In the first region 10, there is a n-type field effect transistors (NFETs) N-1 and a p-type FET field effect transistors (PFETs) P-1. In the second region 20, there is a n-type field effect transistors (NFETs) N-2 and a p-type FET field effect transistors (PFETs) P-2.

Figures 1, 9A:
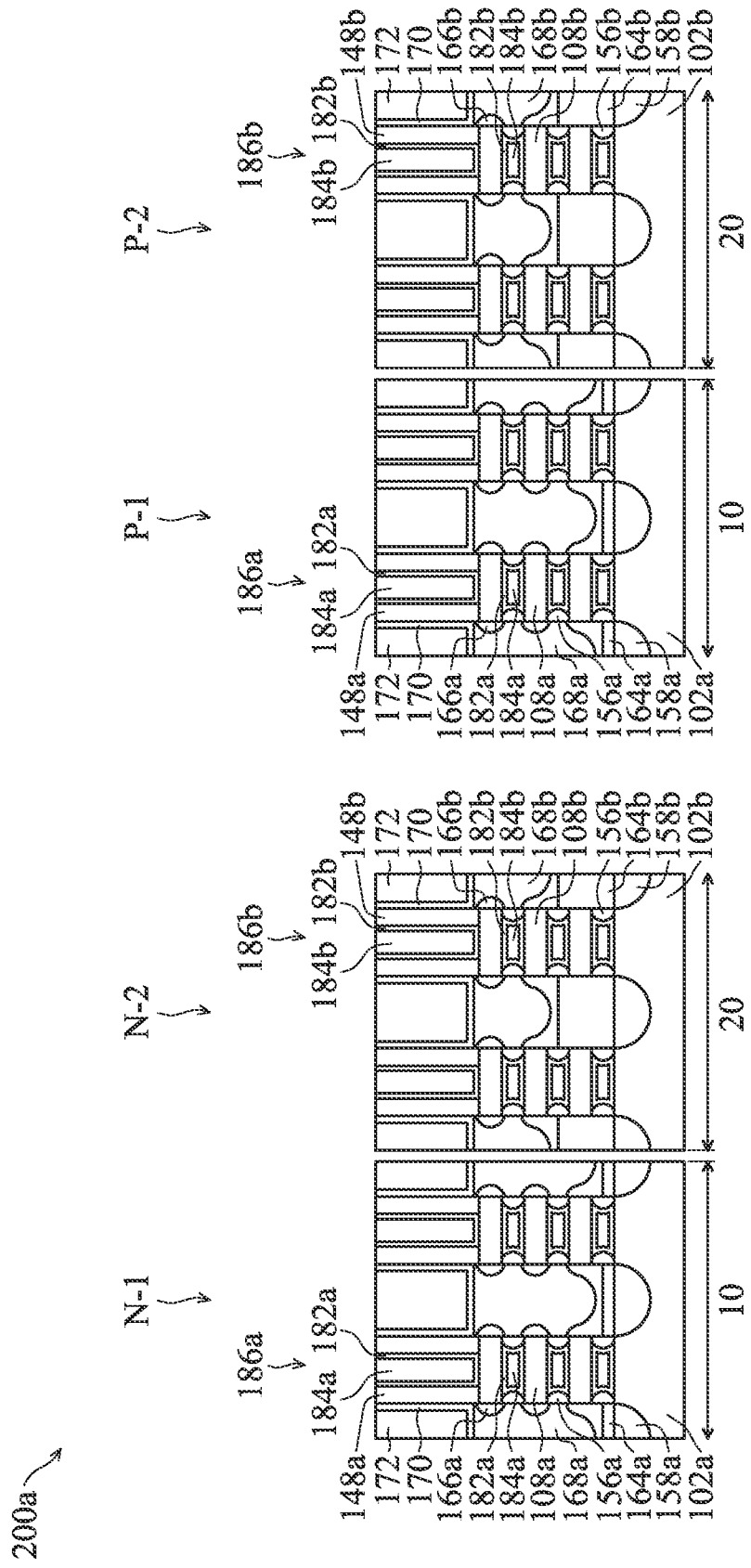
Figures 2, 9A:
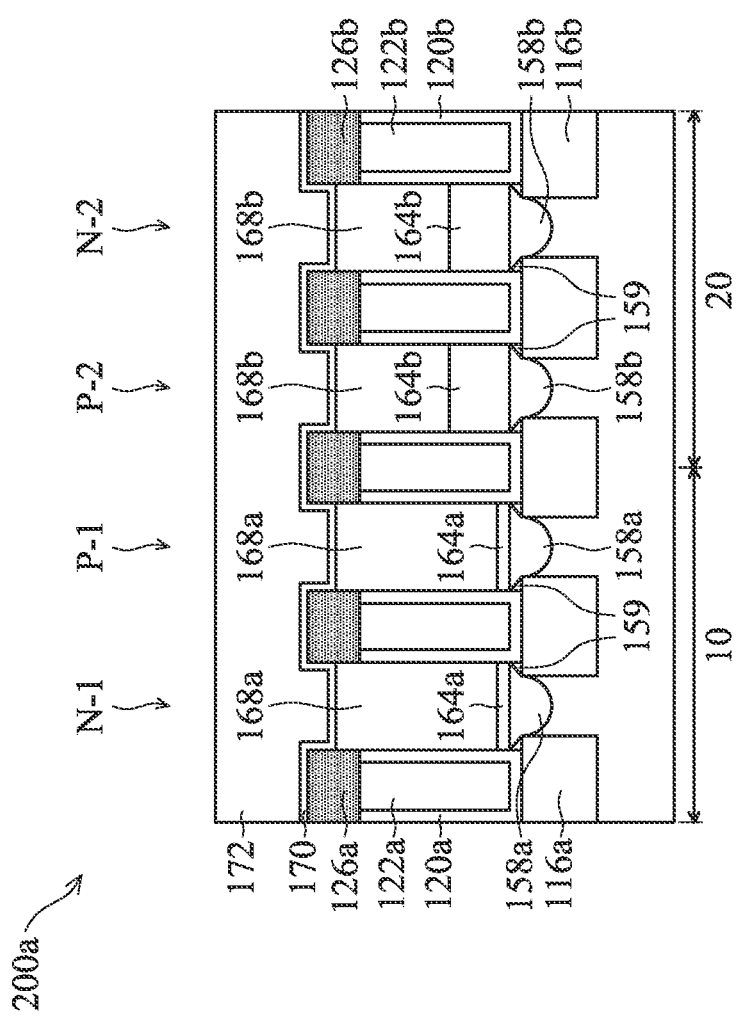
Figure 9A:
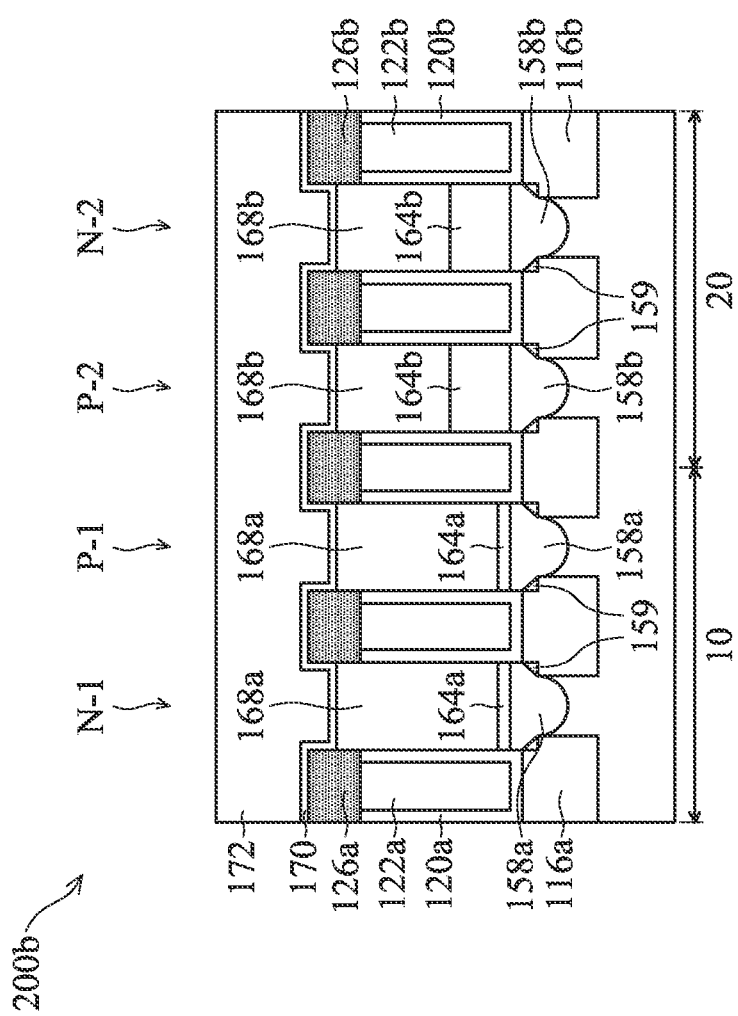

FIG. 9A-1 shows a cross-sectional representation of the semiconductor device structure 200a, in accordance with some embodiments. For convenience, the n-type transistors N-1 and N-2 are illustrated side-by-side, and the p-type transistors P-1 and P-2 are illustrated side-by-side. The semiconductor device structure 200a includes the transistor N-1 and the transistor P-1 over the first region 10, and the transistor N-2 and transistor P-2 over the second region 20. The transistor N-1 and transistor N-2 are similar to, or the same as, the semiconductor structure 100a of FIG. 3P-1. The transistor P-1 and transistor P-2 are similar to, or the same as, the semiconductor structure 100a of FIG. 3P-1.

The transistor N-2 has two effective (or active) nanostructures (e.g. second semiconductor layers 108b) acting as a channel region and the transistor P-2 also has two effective (or active) nanostructures (e.g. second semiconductor layers 108b) acting as a channel region. Therefore, the cell 1 including the transistor N-2 and the transistor P-2 are formed for power efficiency consideration. The transistor N-1 has three effective (or active) nanostructures (e.g. second semiconductor layers 108a) acting as a channel region and the transistor P-1 also has three effective (or active) nanostructures (e.g. second semiconductor layers 108a) acting as a channel region. Therefore, the cell 2 including the transistor N-1 and the transistor P-1 are formed for speed performance consideration.

In some embodiments, for p-type transistors, the S/D structure with sub-portions 166a, 166b, 168a, 168b include silicon germanium or germanium and can be doped with boron, other p-type dopant, or combinations thereof (for example, forming Si:Ge:B epitaxial S/D structures). In some embodiments, for n-type transistors, the S/D structure with sub-portions 166a, 166b, 168a, 168b include silicon and can be doped with carbon, phosphorous, arsenic, other n-type dopant, or combinations thereof (for example, forming Si:C epitaxial S/D structure, Si:P epitaxial S/D structures, or Si:C:P epitaxial S/D structures).

FIG. 9A-2 shows a cross-sectional representation of the semiconductor device structure 200a of FIG. 9A-1 along line Y-Y' shown in FIG. 2K, in accordance with some embodiments of the disclosure. FIG. 9A'-2 shows a cross-sectional representation of forming the semiconductor device structure 200b.

As shown in FIG. 9A-2, the transistor N-1 and P-1 both have the first insulating layer 164a in the first region 10, and the transistor N-2 and P-2 both have the second insulating layer 164b in the second region 20. In addition, the top surface of the second insulating layer 164b is higher than the top surface of the first insulating layer 164a.

As shown in FIG. 9A'-2 includes elements similar to, or the same as, elements of FIG. 9A-2 (where like reference numerals refer to like elements), wherein FIG. 9A'-2 illustrates that the first bottom layer 158a has the extending portion and the second bottom layer 158b has the extending portion.

Figures 1, 10A:
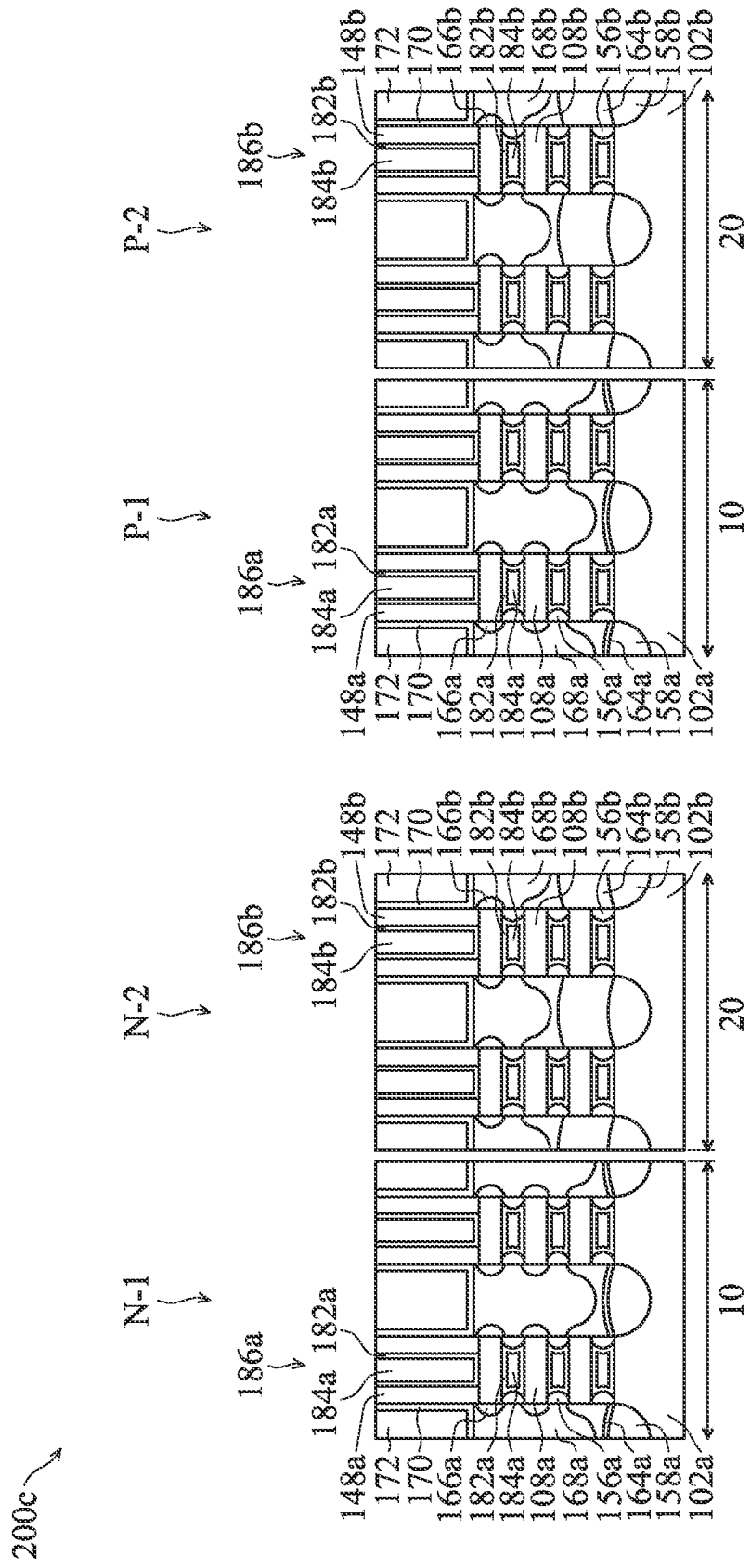
Figures 2, 10A:
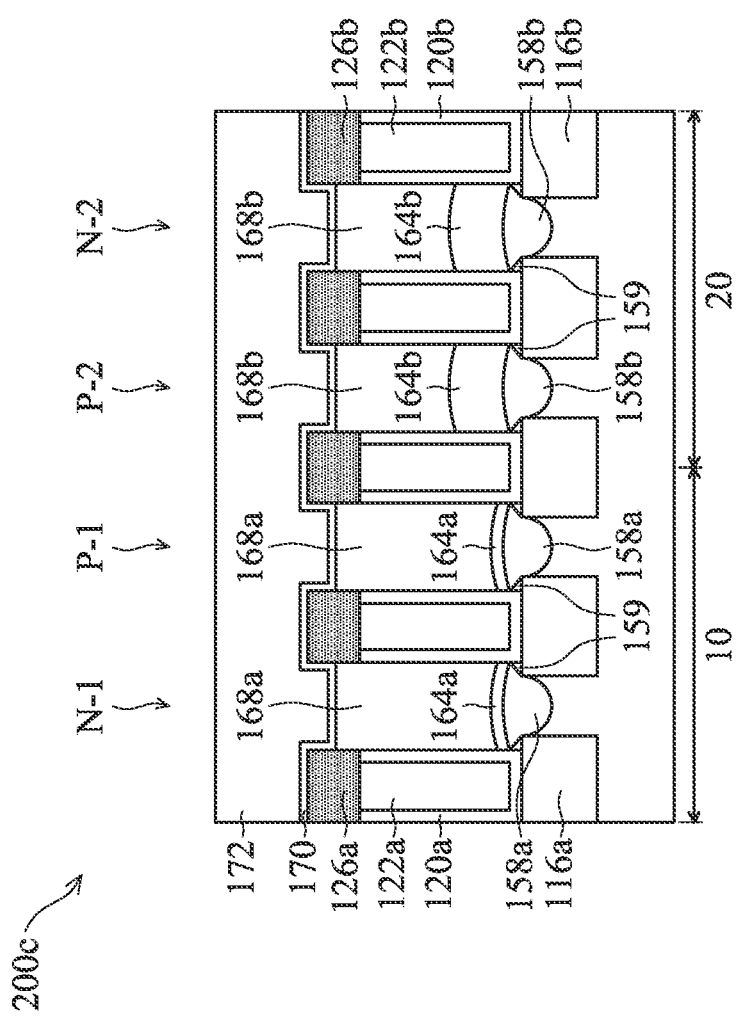
Figure 10A:
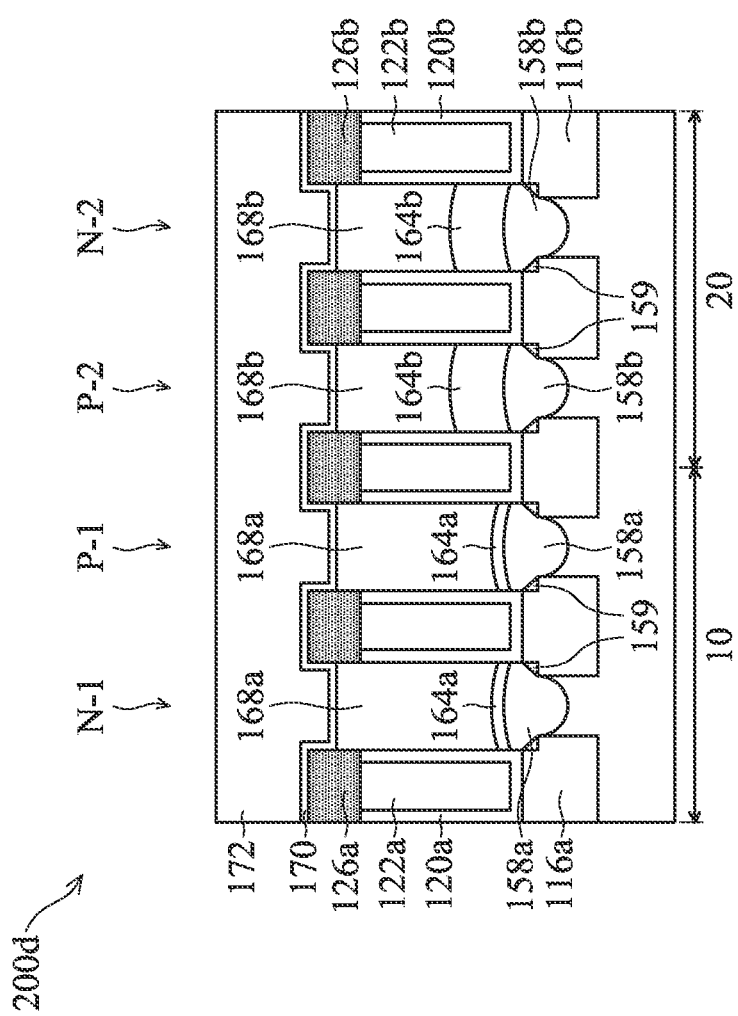

FIG. 10A-1 show a cross-sectional representation of the semiconductor device structure 200c along line $X_1$-$X_1$' and $X_2$-$X_2$' shown in FIG. 2K, in accordance with some embodiments of the disclosure. FIG. 10A-2 shows a cross-sectional representation of the semiconductor device structure 200c of FIG. 10A-1 along line Y-Y' shown in FIG. 2K, in accordance with some embodiments of the disclosure. FIG. 10A'-2 shows a cross-sectional representation of forming the semiconductor device structure 200d.

The semiconductor structure 200c of FIG. 10A-1 includes elements similar to, or the same as, elements of the semiconductor structure 200a of FIG. 9A-1 (where like reference numerals refer to like elements), wherein FIG. 10A-1 illustrates that the first bottom layer 158a may have a curved top surface, and the first insulating layer 164a may have a curved top surface. In some embodiments, the top surface of the first insulating layer 164a is convex since the top surface of the first bottom layer 158a is convex. In addition, the second insulating layer 164b is also has a curved top surface, and the top surface of the second insulating layer 164b is convex since the top surface of the second bottom layer 158b is convex.

As shown in FIG. 10A-2, the convex top surface of the first insulating layer 164a is lower than the convex top surface of the second insulating layer 164b.

FIG. 10A'-2 includes elements similar to, or the same as, elements of FIG. 8A-2 (where like reference numerals refer to like elements), wherein FIG. 10A'-2 illustrates that the first bottom layer 158a may have the extending portion and the second bottom layer 158b has the extending portion.

Figures 1, 11A:
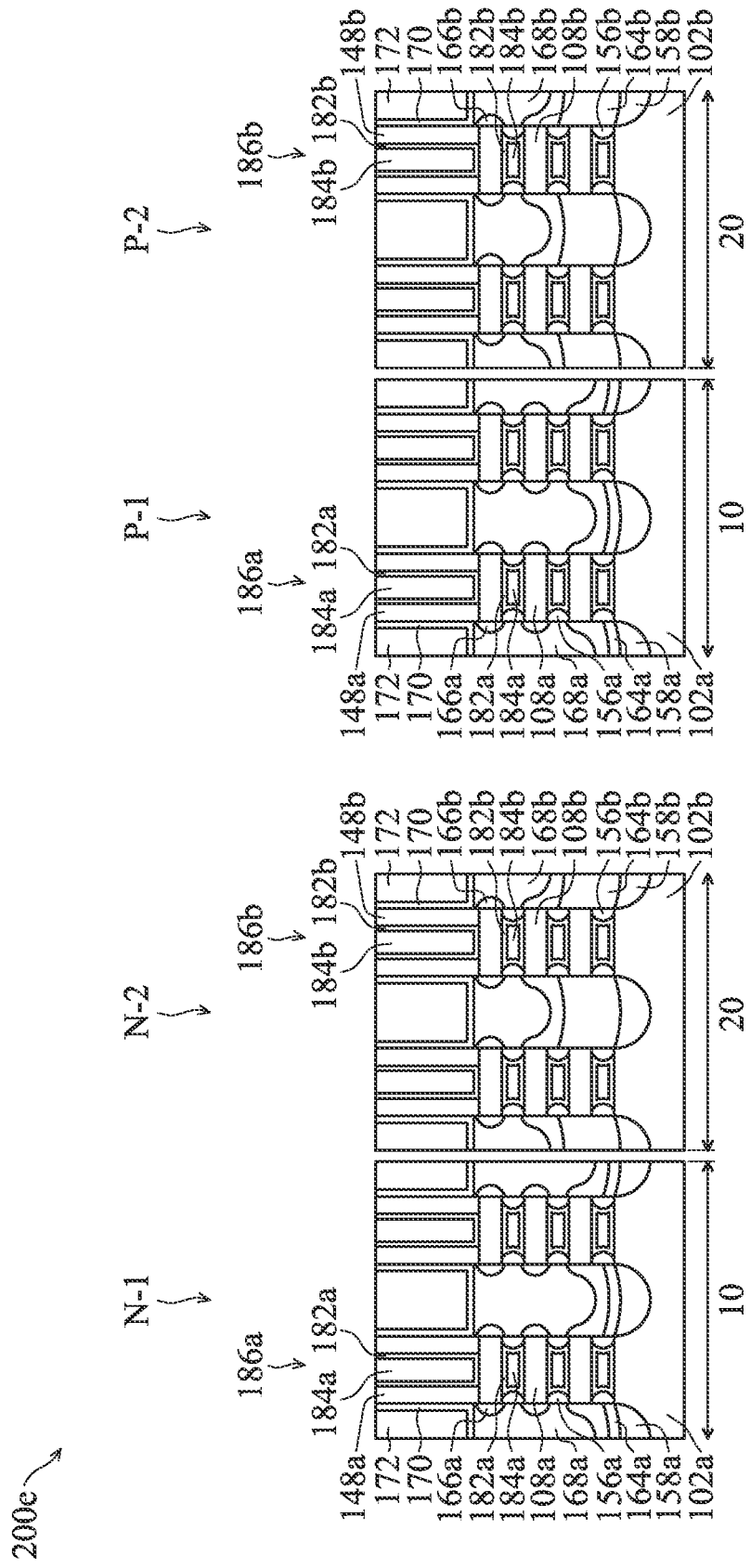
Figures 2, 11A:
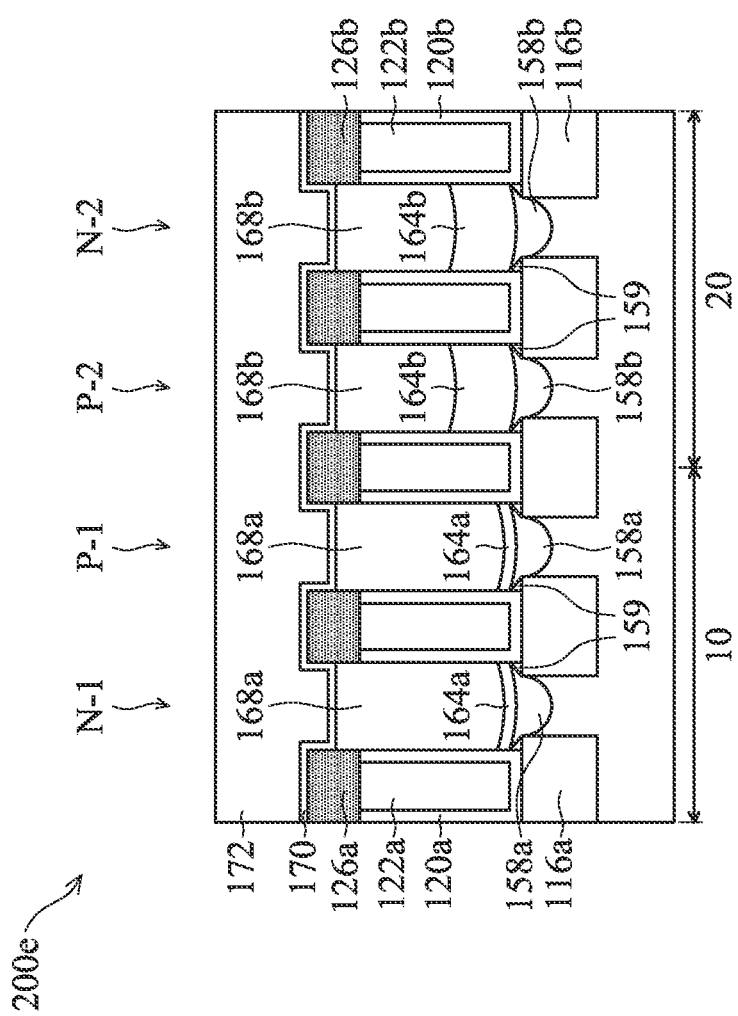
Figure 11A:
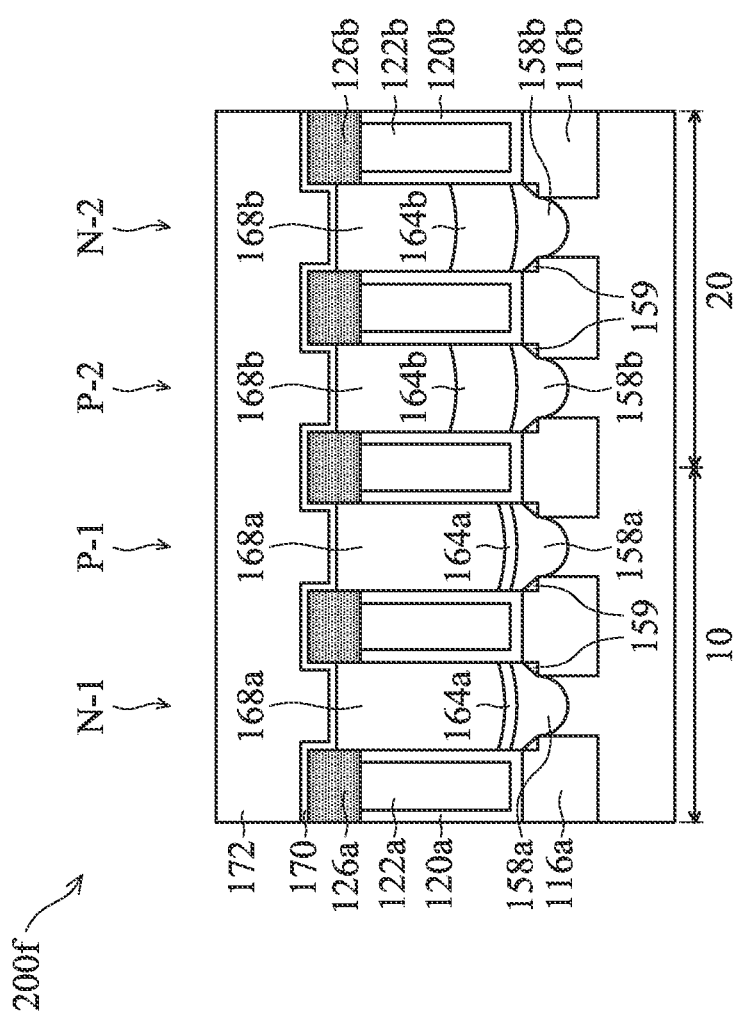

FIG. 11A-1 show a cross-sectional representation of the semiconductor device structure 200e along line $X_1$-$X_1$' and $X_2$-$X_2$' shown in FIG. 2K, in accordance with some embodiments of the disclosure. FIG. 11A-2 shows a cross-sectional representation of the semiconductor device structure 200e of FIG. 11A-1 along line Y-Y' shown in FIG. 2K, in accordance with some embodiments of the disclosure. FIG. 11A'-2 shows a cross-sectional representation of forming the semiconductor device structure 200f.

The semiconductor structure 200e of FIG. 11A-1 includes elements similar to, or the same as, elements of the semiconductor structure 100a of FIG. 3P-1 (where like reference numerals refer to like elements), wherein FIG. 11A-1 illustrates that the first bottom layer 158a has a curved top surface, and the first insulating layer 164a may have a curved top surface. In some embodiments, the top surface of the first insulating layer 164a is concave since the top surface of the first bottom layer 158a is concave. In addition, the second insulating layer 164b is also has a curved top surface, and the top surface of the second insulating layer 164b is concave since the top surface of the second bottom layer 158b is concave As shown in FIG. 11A-2, the concave top surface of the first insulating layer 164a is lower than the concave top surface of the second insulating layer 164b.

FIG. 11A'-2 includes elements similar to, or the same as, elements of FIG. 11A-2 (wherein like reference numerals refer to like elements), wherein FIG. 11A'-2 illustrates that the first bottom layer 158a may have the extending portion and the second bottom layer 158b has the extending portion.

Figures 1, 12A:
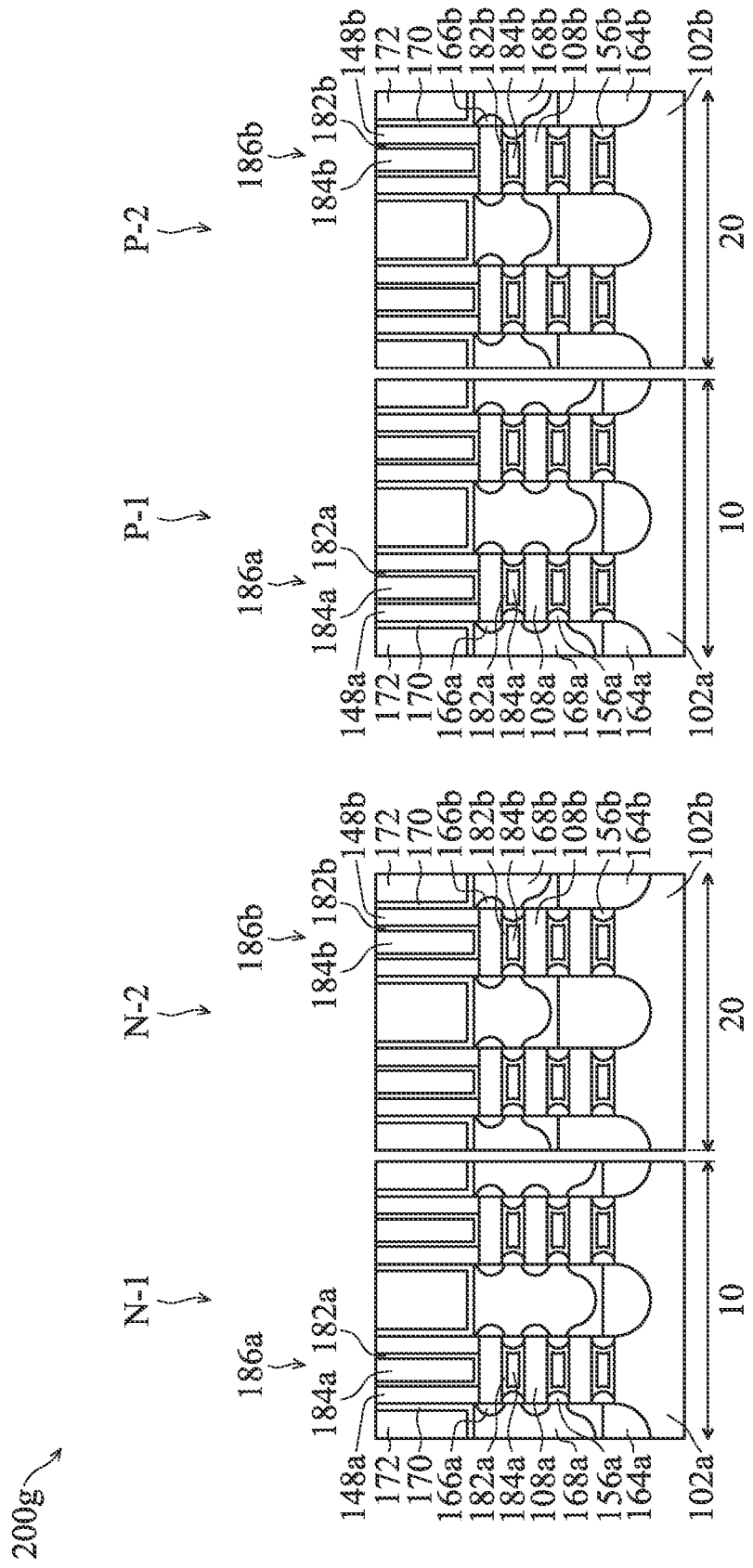
Figures 2, 12A:
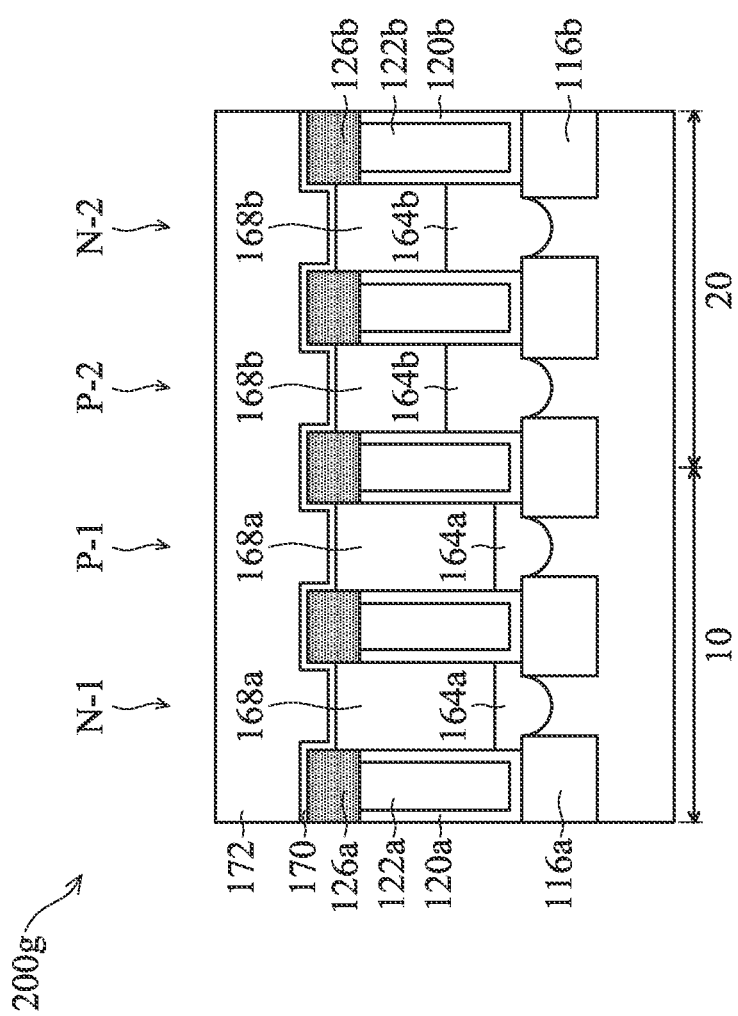
Figure 12A:
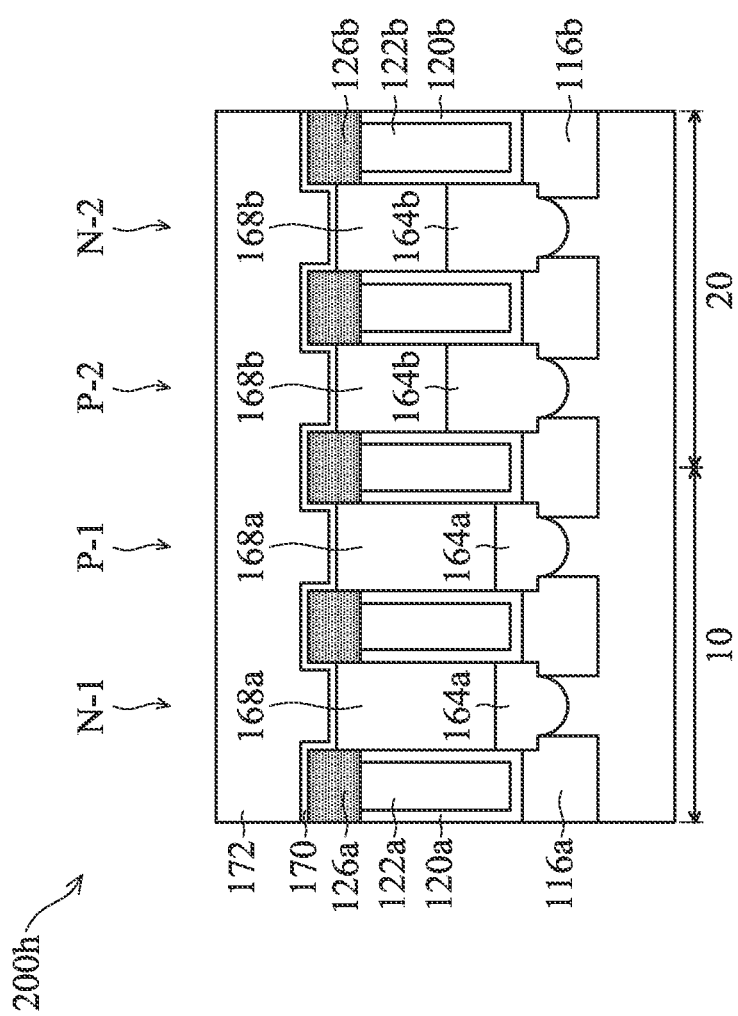

FIG. 12A-1 shows a cross-sectional representation of the semiconductor device structure 200g, in accordance with some embodiments. The semiconductor device structure 200g includes the transistor N-1 and the transistor P-1 over the first region 10, and the transistor N-2 and transistor P-2 over the second region 20.

The transistor N-1 and transistor N-2 are similar to, or the same as, the semiconductor structure 100a of FIG. 3P-1, where like reference numerals refer to like elements. The semiconductor device structure 200g of FIG. 12A-1 illustrate embodiments in which no first bottom layer 158a is in the first region 10, and no second bottom layer 158b is in the second region 20. In addition, the first insulating layer 164a extends from a first position to a second position, the first position being lower than the top surface of the first gate structure 186a, and the second position being higher than the bottommost one of the second semiconductor layers 108a. The second insulating layer 164b extends from the first position to the second position, the first position being lower than the top surface of the second gate structure 186b, and the second position being higher than the bottommost one of the second semiconductor layers 108b.

FIG. 12A-2 shows a cross-sectional representation of the semiconductor device structure 200g of FIG. 12A-1 along line Y-Y' shown in FIG. 2K, in accordance with some embodiments of the disclosure. FIG. 12A'-2 shows a cross-sectional representation of forming the semiconductor device structure 200h.

As shown in FIG. 12A-2, the transistor N-1 and P-1 both have the first insulating layer 164a in the first region 10, and the transistor N-2 and P-2 both have the second insulating layer 164b in the second region 20. In addition, the top surface of the second insulating layer 164b is higher than the top surface of the first insulating layer 164a.

As shown in FIG. 12A'-2 is similar to, or the same as, FIG. 12A-2, wherein FIG. 12A'-2 illustrates that the first bottom layer 158a has the extending portion and the second bottom layer 158b has the extending portion.

FIG. 13A-1 to 13E-2 show cross-sectional representations of various stages of forming the semiconductor device structure 200i. Figures labeled with a suffix of "-1" are along line $X_1$-$X_1$' and $X_2$-$X_2$' shown in FIG. 2K, and figures labeled with a suffix of "-2" are along line Y-Y' shown in FIG. 2K, in accordance with some embodiments of the disclosure. Furthermore, figures designated with a tick (e.g., A', B', etc.) show cross-sectional representations of various stages of forming the semiconductor device structure 200j.

Figures 1, 13A:
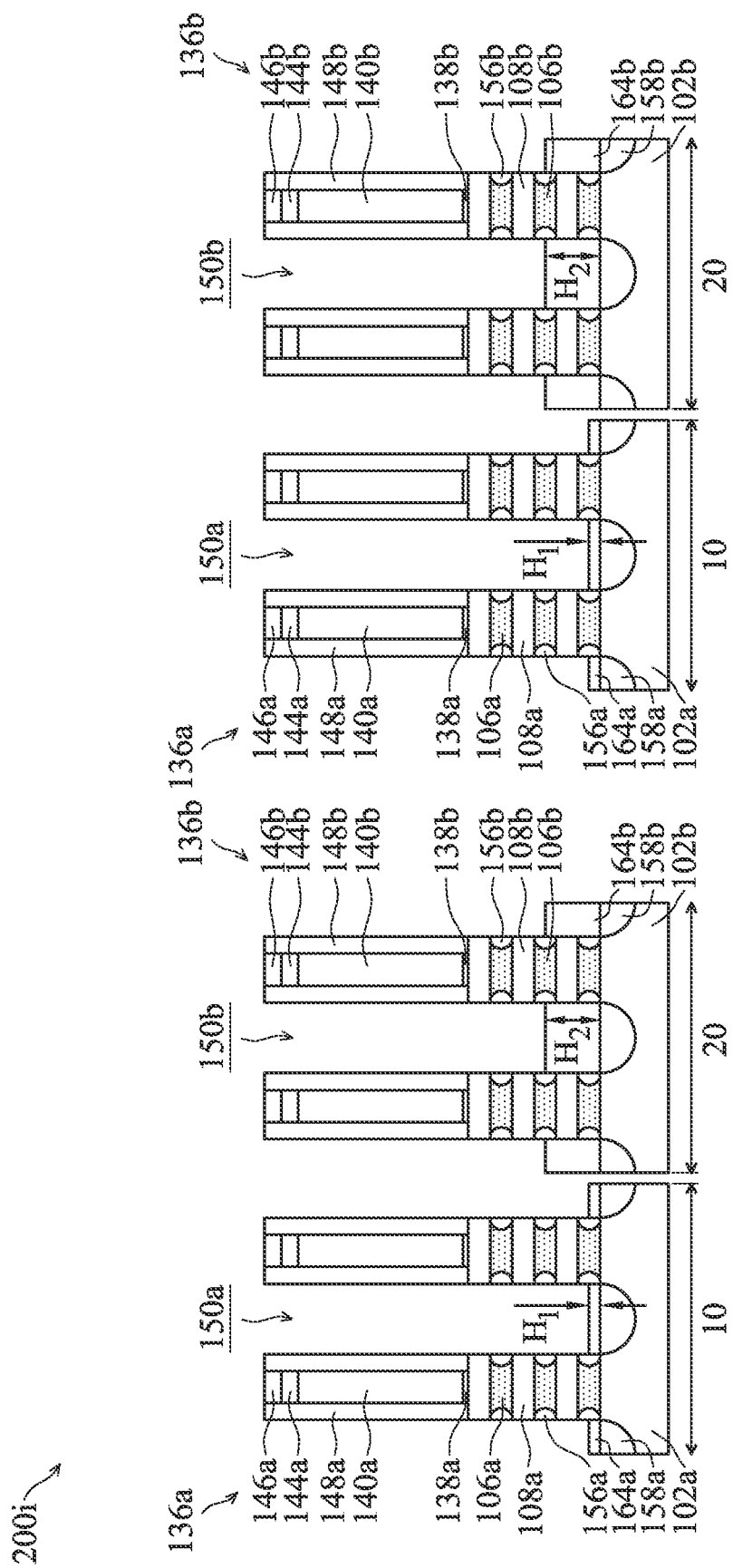
Figures 2, 13A:
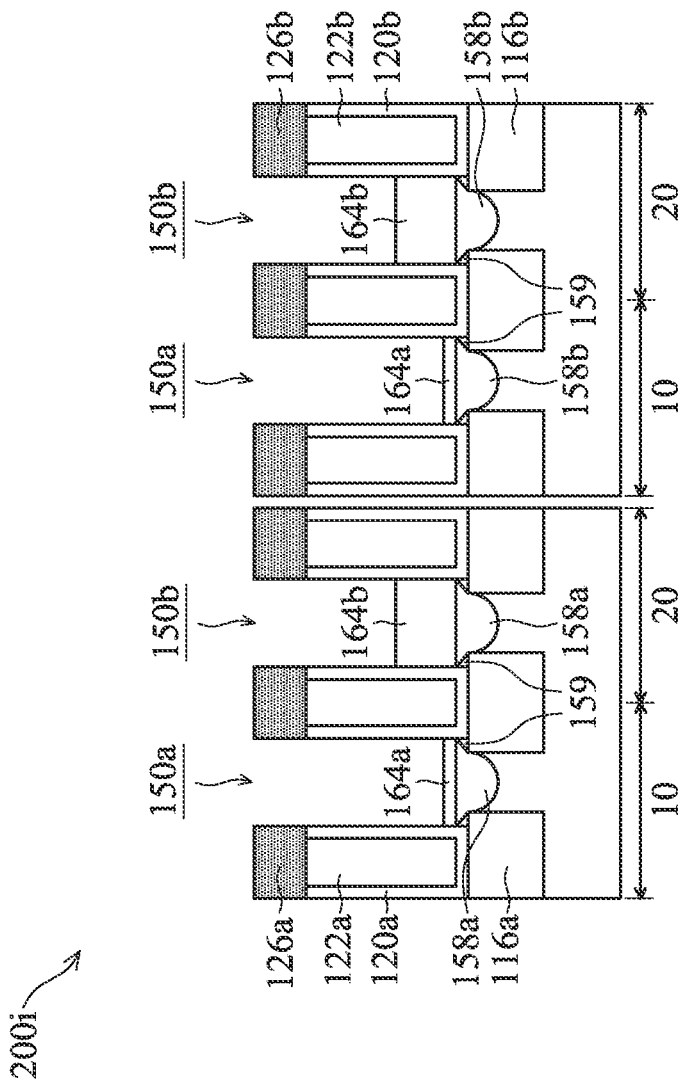
Figure 13A:
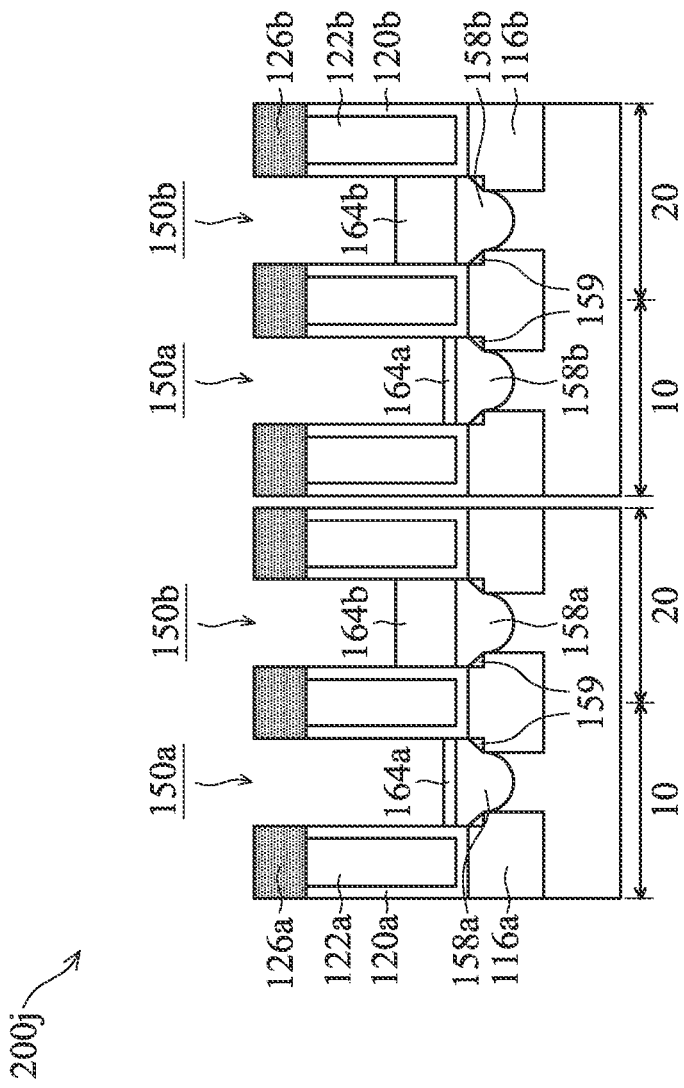

FIG. 13A-1 includes elements similar to, or the same as, elements of FIG. 3K-1, where like reference numerals refer to like elements. FIG. 13A-2 includes elements similar to, or the same as, elements of FIG. 3K-2, and FIG. 13A'-2 includes elements similar to, or the same as, elements of FIG. 3K'-2, where like reference numerals refer to like elements.

Figures 1, 13B:
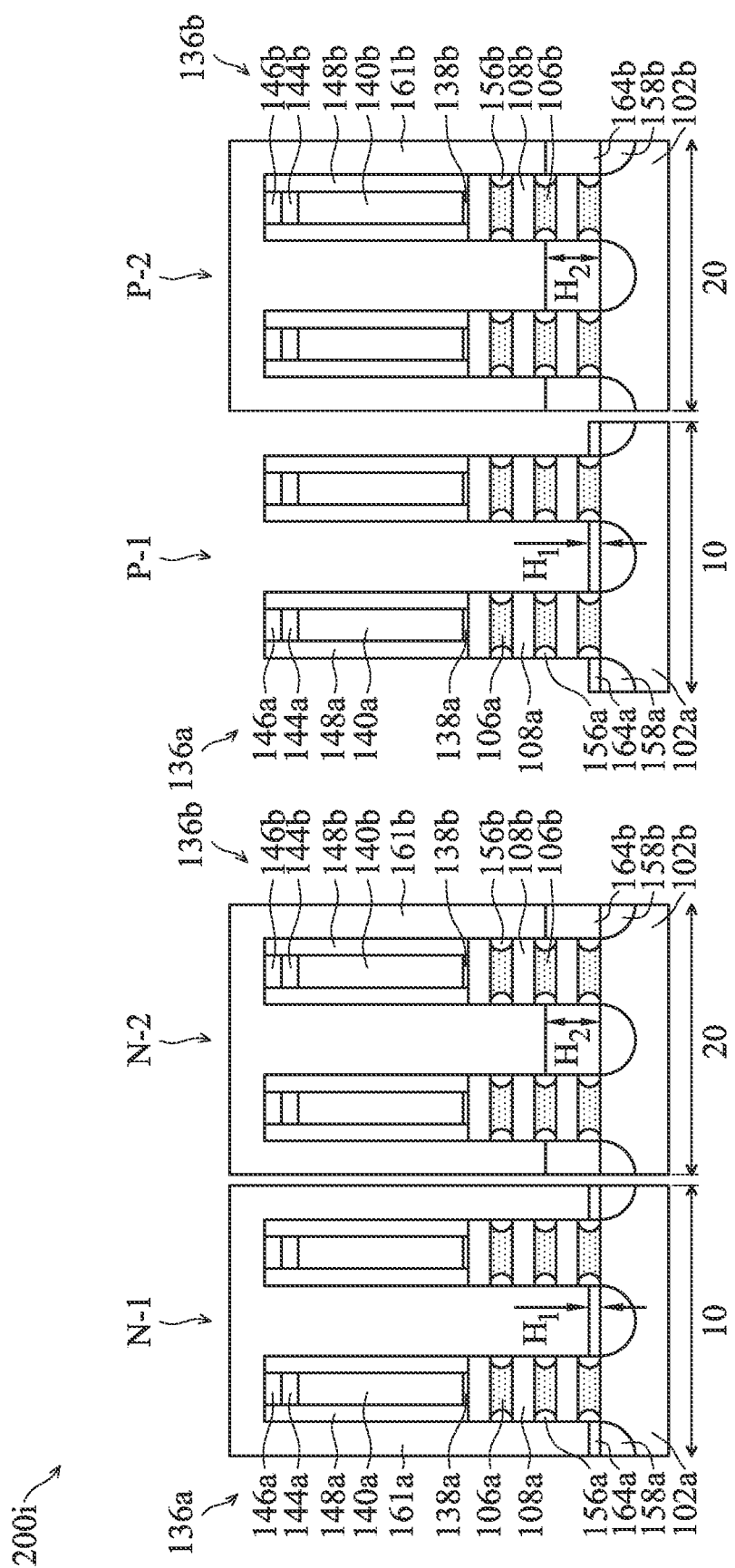
Figures 2, 13B:
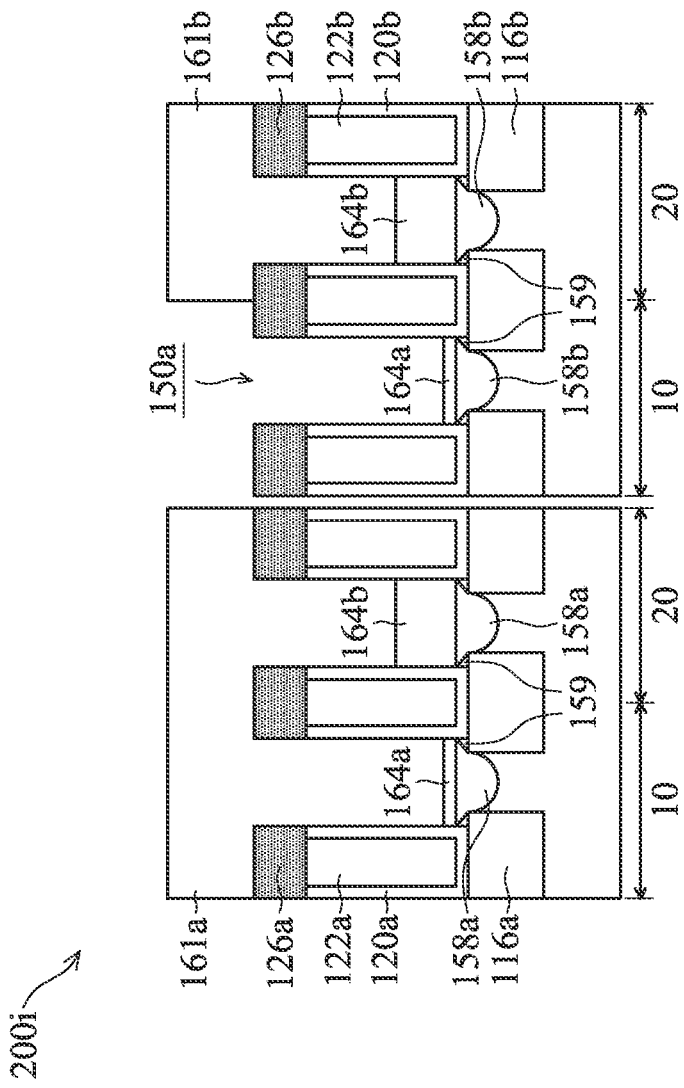
Figure 13B:
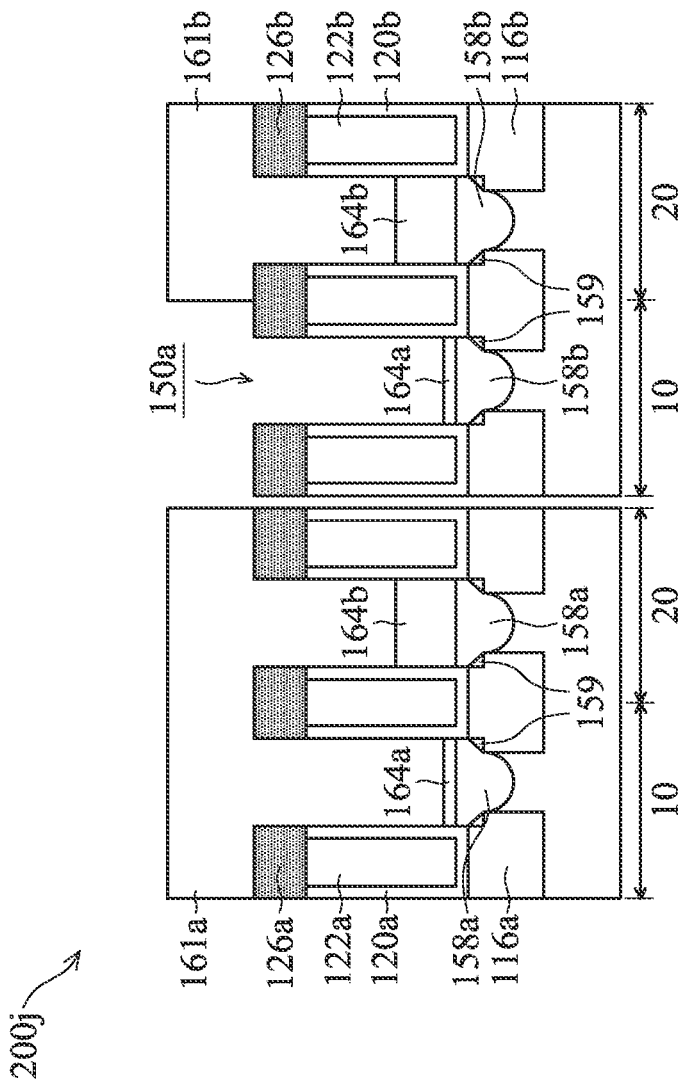

Next, as shown in FIG. 13B-1, a mask layer 161a is formed and patterned to cover transistor N-1, transistor N-2, and transistor P-2, while exposing transistor P-1. The mask layer is referred to as mask layer 161a in the first region 10 and as mask layer 161b in the second region 20 for ease of reference. In some embodiments, the mask layer 161a is a patterned photoresist layer. In some embodiments, the materials of the mask layer 161a and the mask layer 161b is the same. In some embodiments, the mask layer 161a and the mask layer 161b are formed simultaneously.

FIG. 13B-2 shows the mask layer 161b is formed to cover the second insulating layer 164b over the second region 20.

FIG. 13B'-2 includes elements similar to, or the same as, elements of FIG. 11B-2 (where like reference numerals refer to like elements), wherein FIG. 11B'-2 illustrates that the first bottom layer 158a and the second bottom layer 158b may have extending portions extends into the first isolation structure 116a and the second isolation structure 116b, respectively.

Figures 1, 13C:
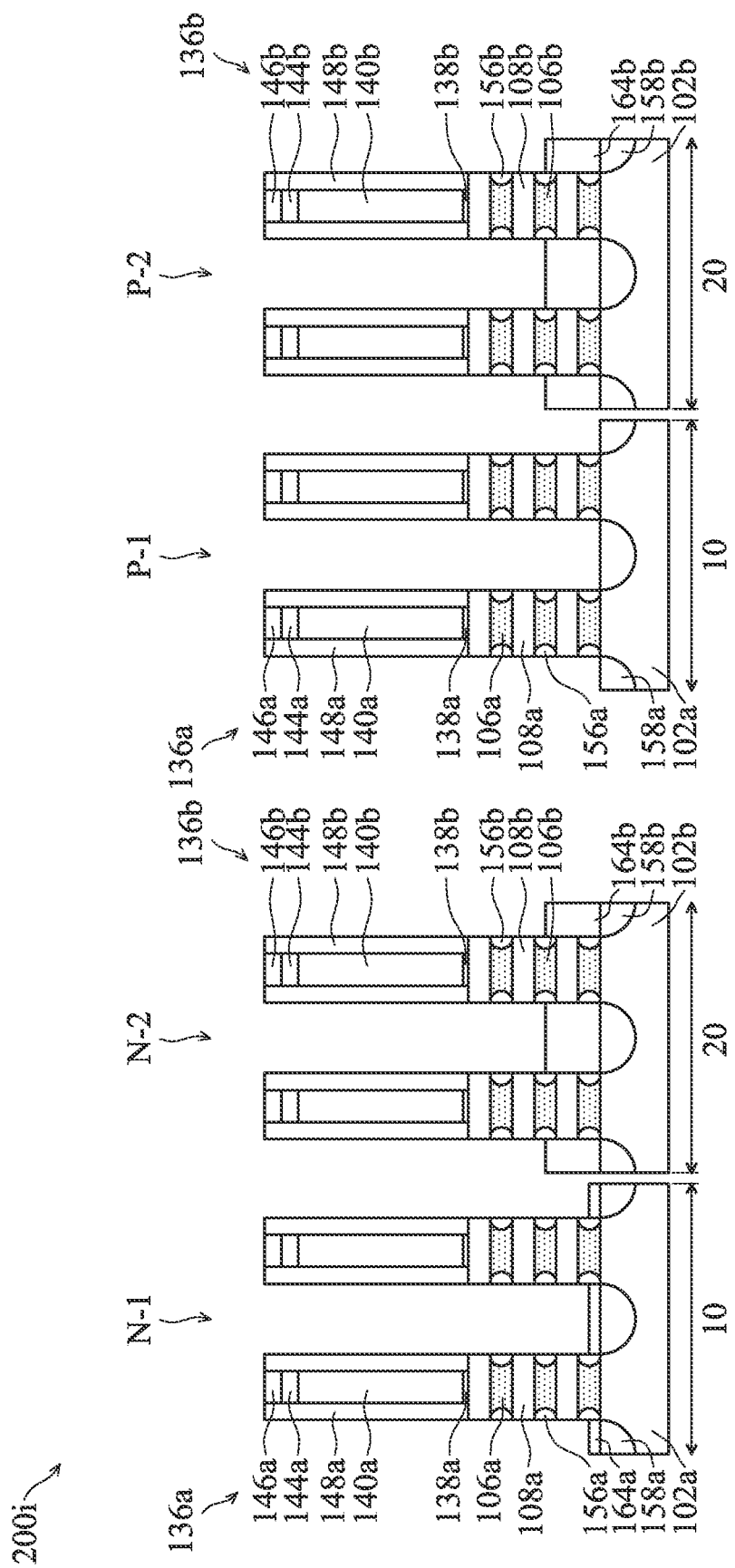
Figures 2, 13C:
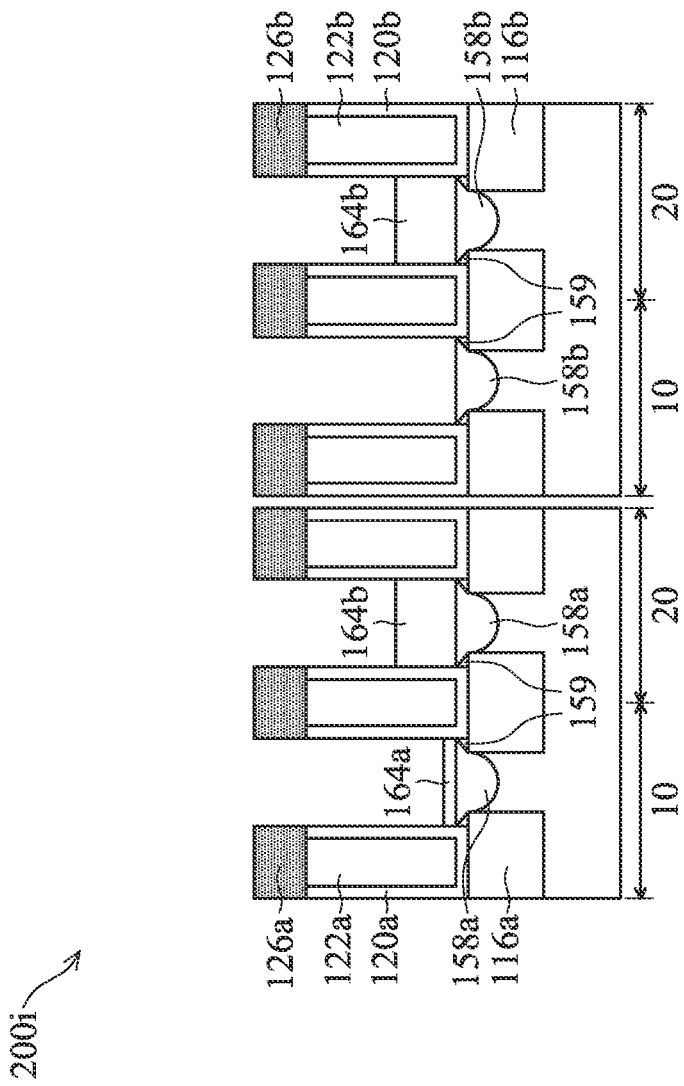
Figure 13C:
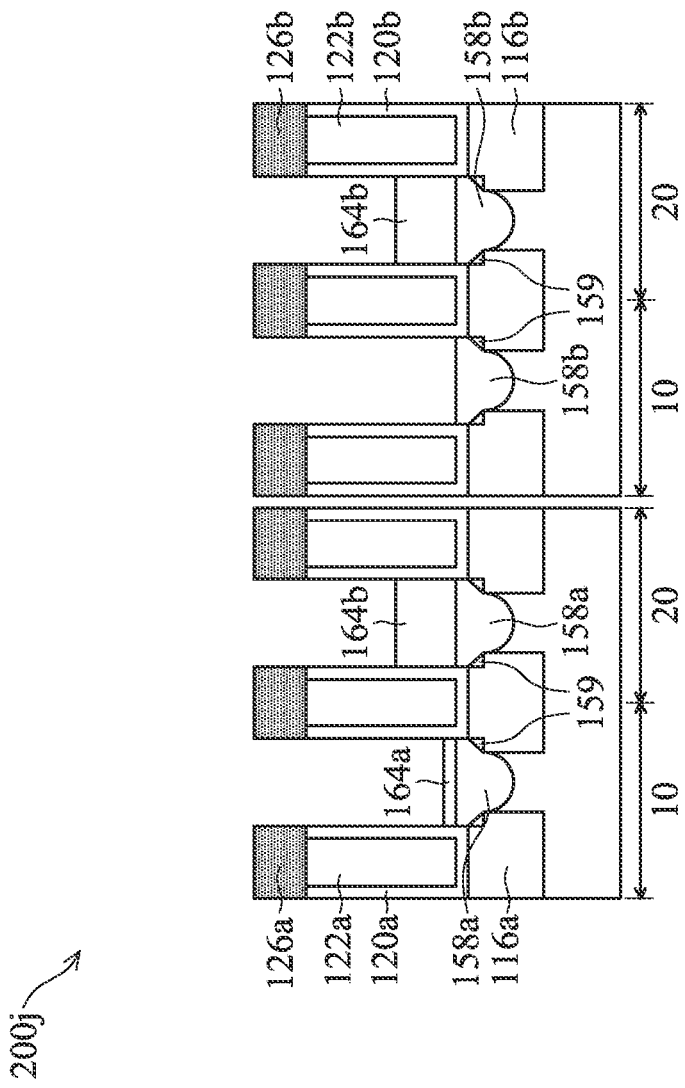

Next, as shown in FIG. 13C-1, the first insulating layer 164a in the transistor P-1 is removed, in accordance with some embodiments of the disclosure. In order to improve the crystal quality of the first S/D structure, the first insulating layer 164a in the transistor P-1 is removed. Therefore, the first bottom layer 158a will be in direct contact with the first S/D structure (formed later). Since the lattice constant of the first S/D structure is close to the lattice constant of the first bottom layer 158a than that of the first insulating layer 164a, the first bottom layer 158a can provide a better base to facilitate the formation of the first S/D structure. Accordingly, the crystal quality of the first S/D structure is improved by directly contacting with the first dummy bottom layer 158a.

As shown in FIG. 13C-2, the exposed first insulating layer 164a of P-1 is removed, in accordance with some embodiments of the disclosure.

FIG. 13C'-2 includes elements similar to, or the same as, elements of FIG. 13C-2 (where like reference numerals refer to like elements), wherein FIG. 13C'-2 illustrates that the first bottom layer 158a and the second bottom layer 158b may have extending portions that extends into the first isolation structure 116a and the second isolation structure 116b, respectively.

Figures 1, 13D:
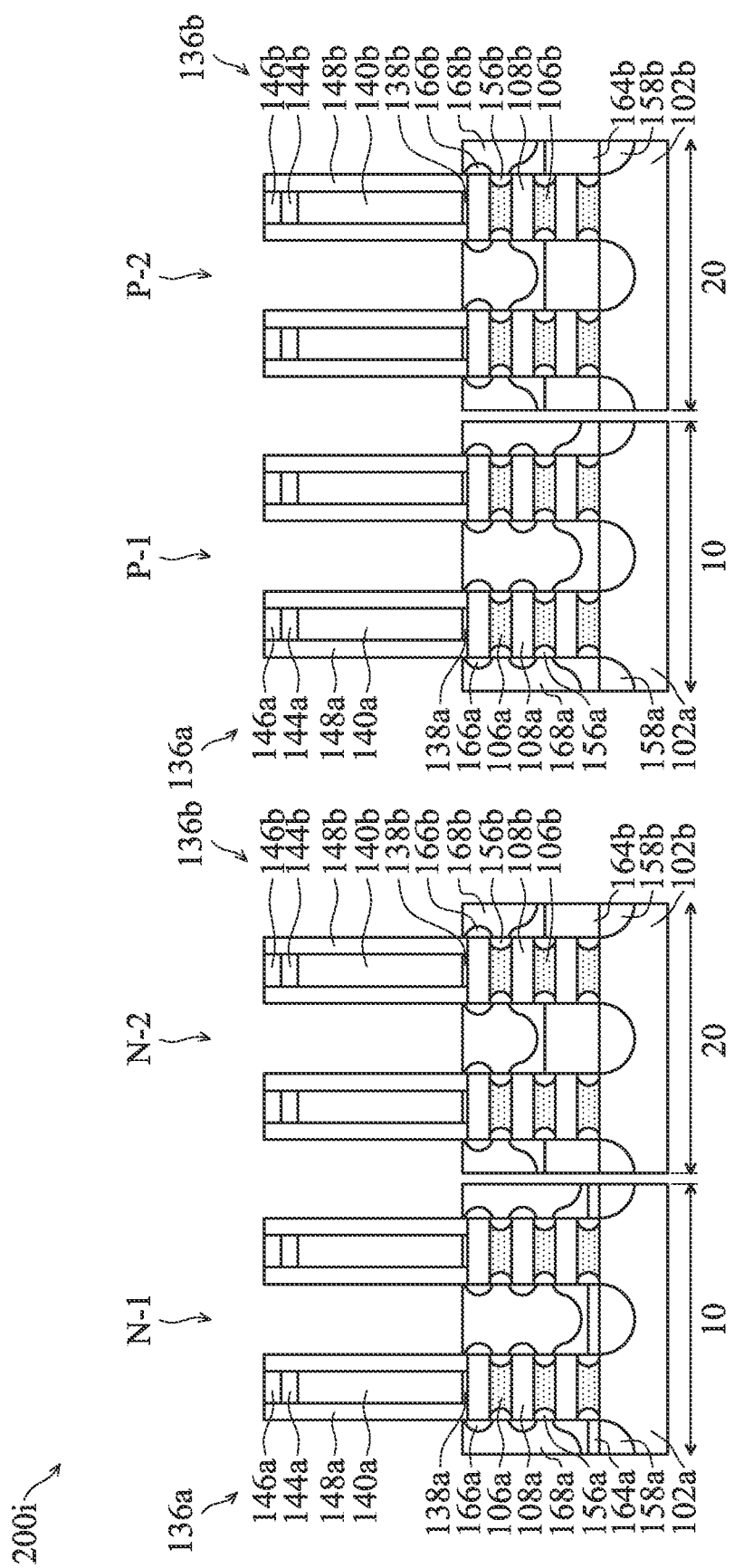
Figures 2, 13D:
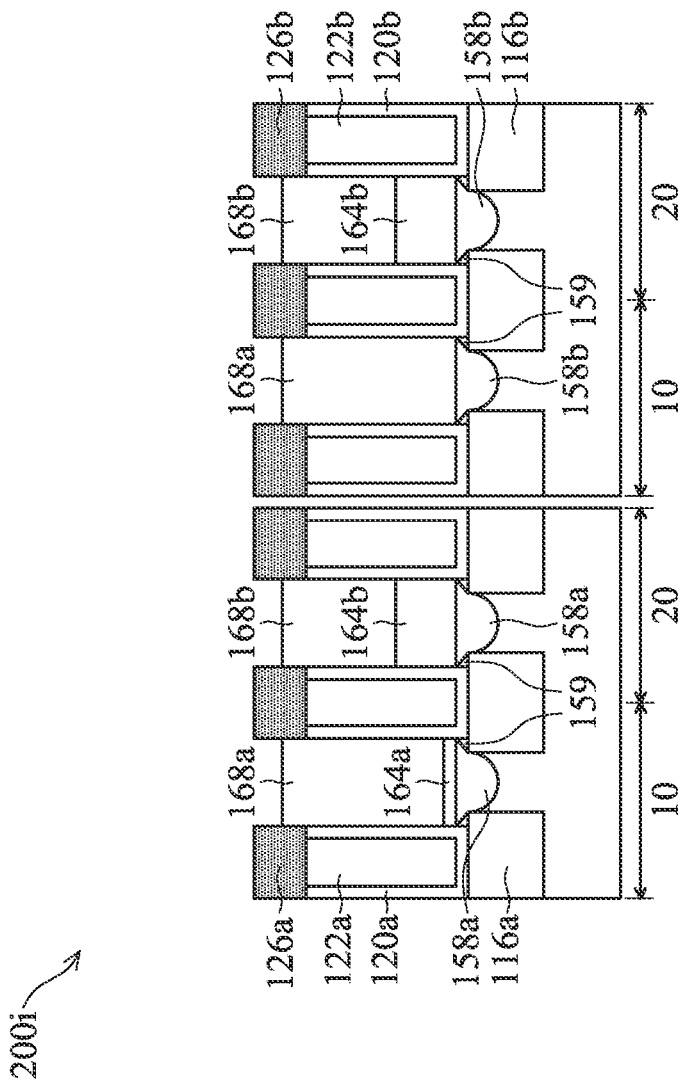
Figure 13D:
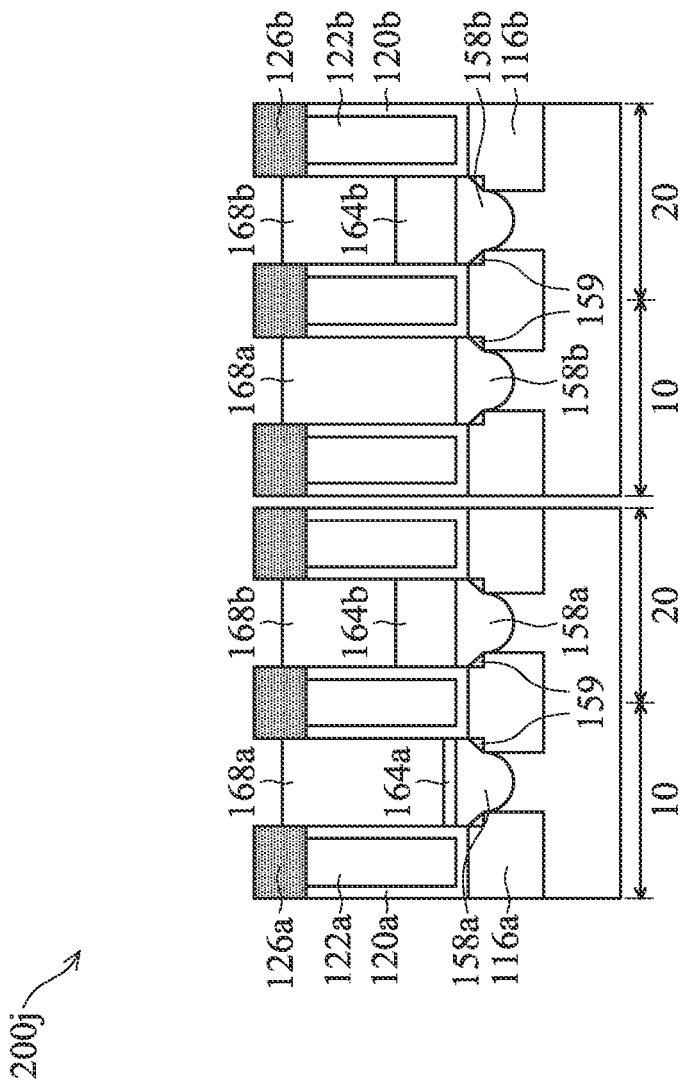

Afterwards, as shown in FIG. 13D-1, first S/D structures are formed over the first insulating layer 164a, and second S/D structures are formed over the second insulating layer 164b, in accordance with some embodiments of the disclosure. Note that since the first insulating layer 164a in the transistor P-1 is removed, the first S/D structures are directly formed on the first bottom layer 158a. In some embodiments, the first S/D structures includes the sub-portion 166a and the sub-portion 168a which are made of the same materials but have different doping concentrations. In some other embodiments, the sub-portion 166a and the sub-portion 168a of the first S/D structures are made of different materials. In some embodiments, the second S/D structures includes the sub-portion 166b and the sub-portion 168b which are made of the same materials but have different doping concentrations. In some other embodiments, the sub-portion 166b and the sub-portion 168b of the second S/D structures are made of different materials.

As shown in FIG. 13D-2, the first S/D structure is formed over the first insulating layer 164a in the transistor N-1 and the second S/D structure is formed over the second insulating layer 164b in the transistors N-2 and P-2; the first S/D structure in transistor P-1 is formed over the first dummy bottom layer 158b in the transistor P-1. The top surface of the first S/D structure is lower than the top surface of the first cap layer 126a and higher than the top surface of the first filling layer 122a. In other words, the top surface of the first cap layer 126a is higher than the top surface of the first S/D structure. The top surface of the second S/D structure is lower than the top surface of the second cap layer 126b and higher than the top surface of the second filling layer 122b.

FIG. 13D'-2 includes elements similar to, or the same as, elements of FIG. 13D-2 (where like reference numerals refer to like elements), wherein FIG. 13D'-2 illustrates that the first insulating layer 164a may be formed over the first bottom layer 158a with the extending portion, and the second insulating layer 164b may be formed over the second bottom layer 158b with the extending portion.

Figures 1, 13E:
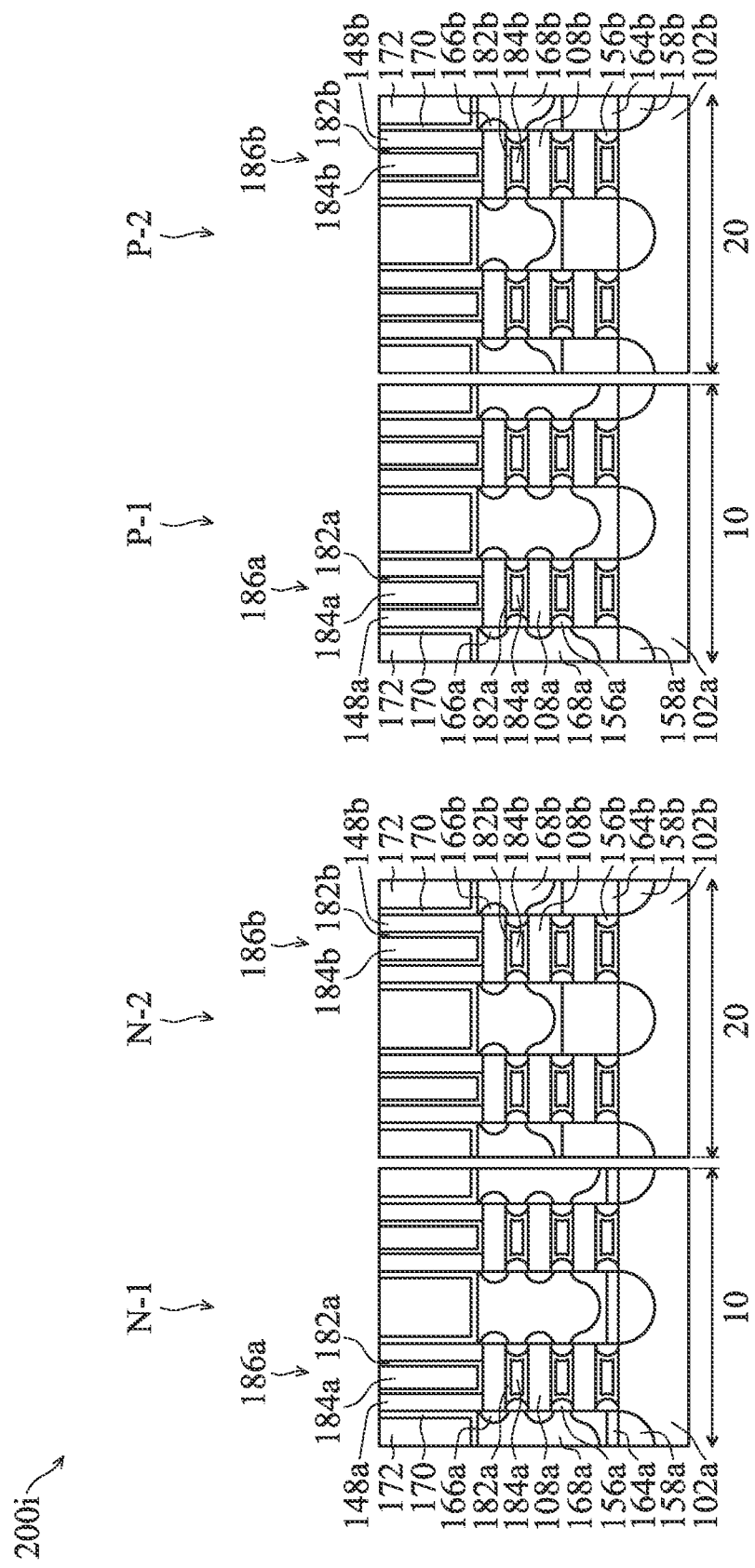
Figures 2, 13E:
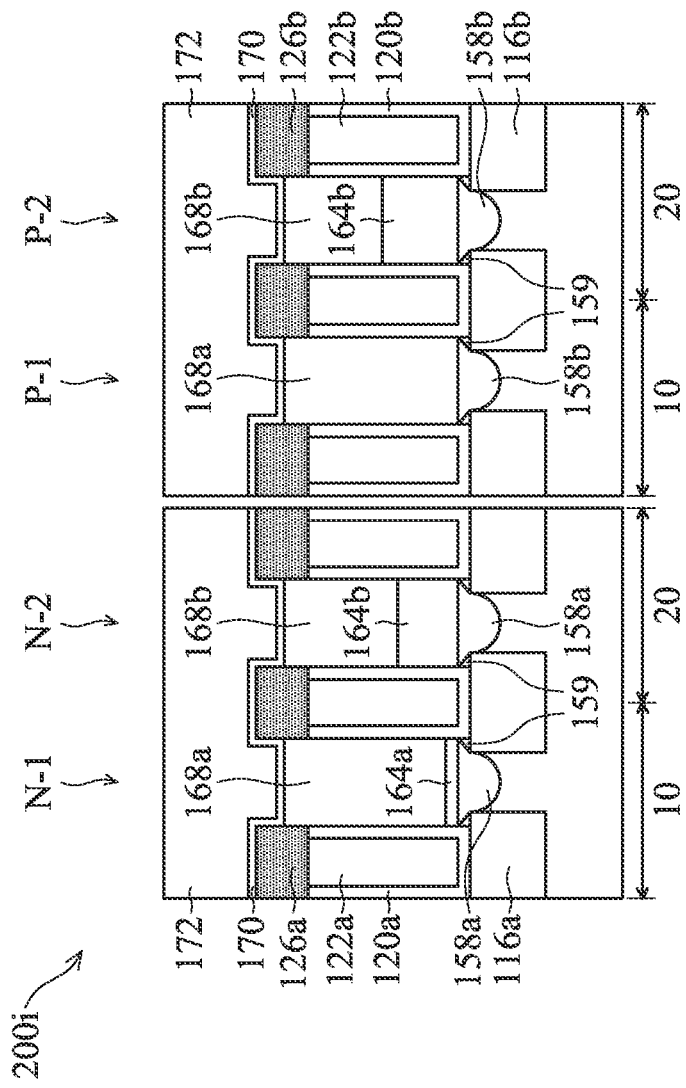
Figure 13E:
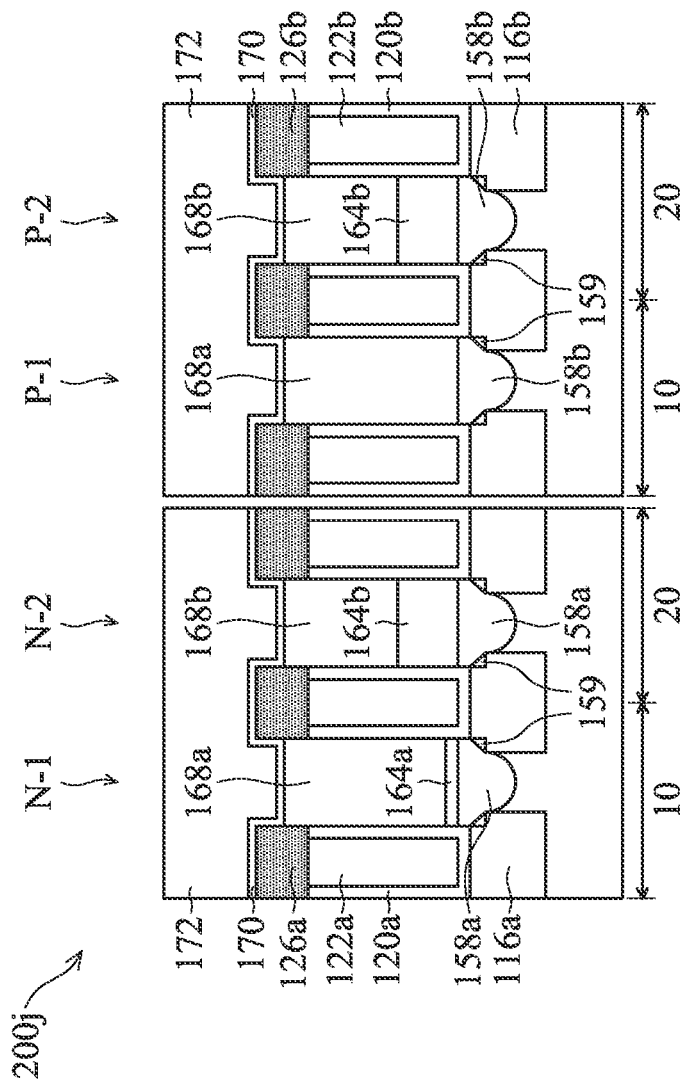

Next, as shown in FIG. 13E-1, the CESL 170 is formed over the first S/D structure and the second S/D structure, and ILD layer 172 is formed over the CESL 170, in accordance with some embodiments. Next, the first gate structure 186a is formed in the first trench (not shown) and the first gaps (not shown) over the first region 10, and the second gate structure 186b is formed in the second trench (not shown) and the second gaps (not shown) over the second region 20.

As shown in FIG. 13E-2, the CESL 170 is formed over the first cap layer 126a and the second cap layer 126b, and the ILD layer 172 is formed over the CESL 170, in accordance with some embodiments.

FIG. 13E'-2 includes elements similar to, or the same as, elements of FIG. 13E-2 (where like reference numerals refer to like elements), wherein FIG. 13E'-2 illustrates that the first insulating layer 164a may be formed over the first bottom layer 158a with the extending portion, and the second insulating layer 164b may be formed over the second bottom layer 158b with the extending portion.

Figures 1, 14A:
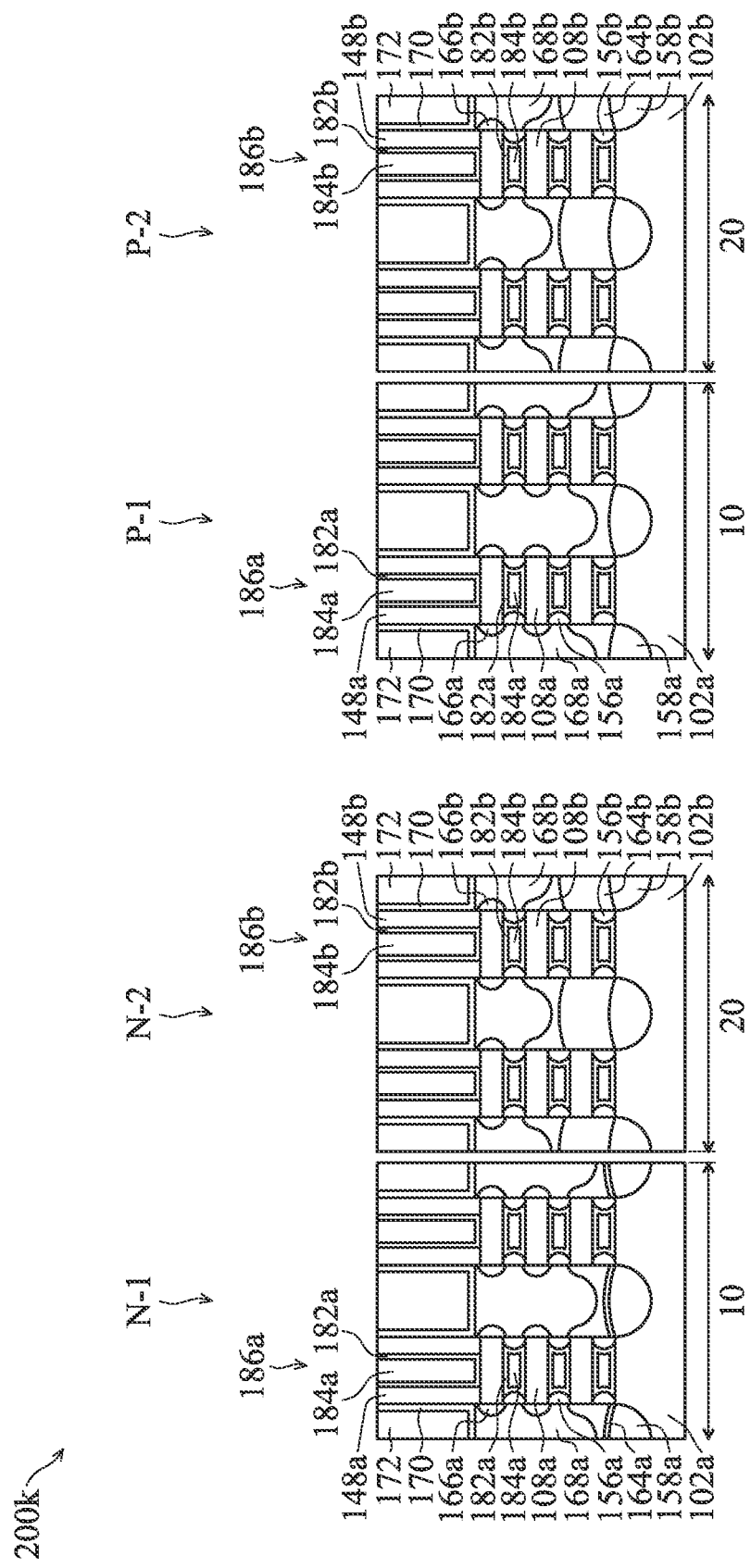
Figures 2, 14A:
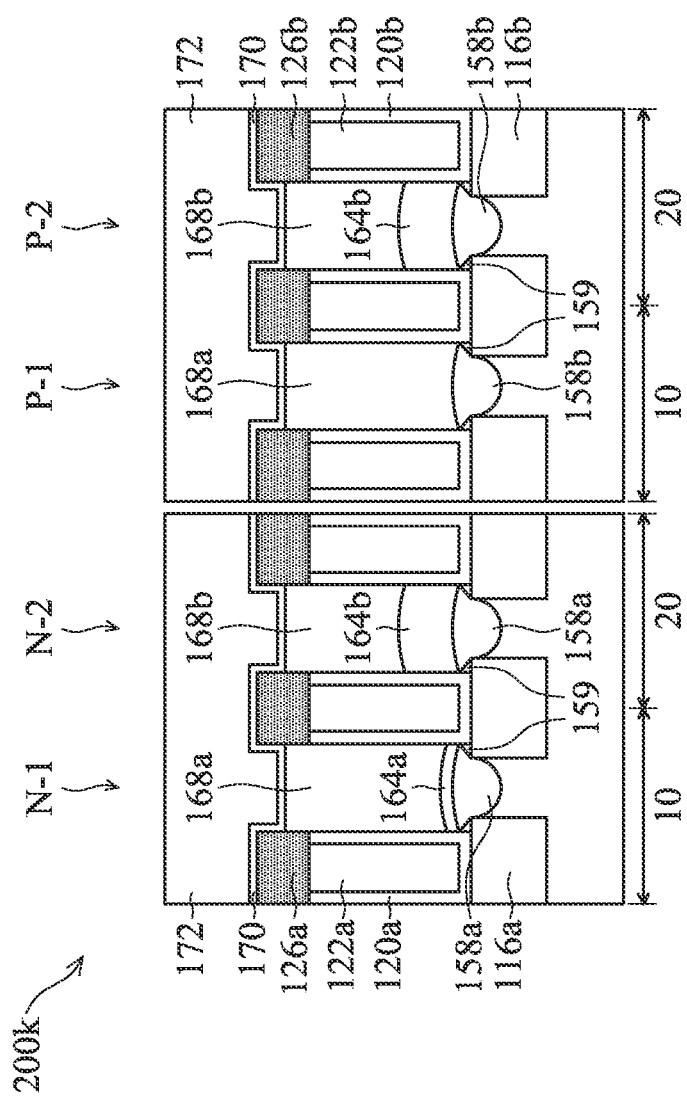
Figure 14A:
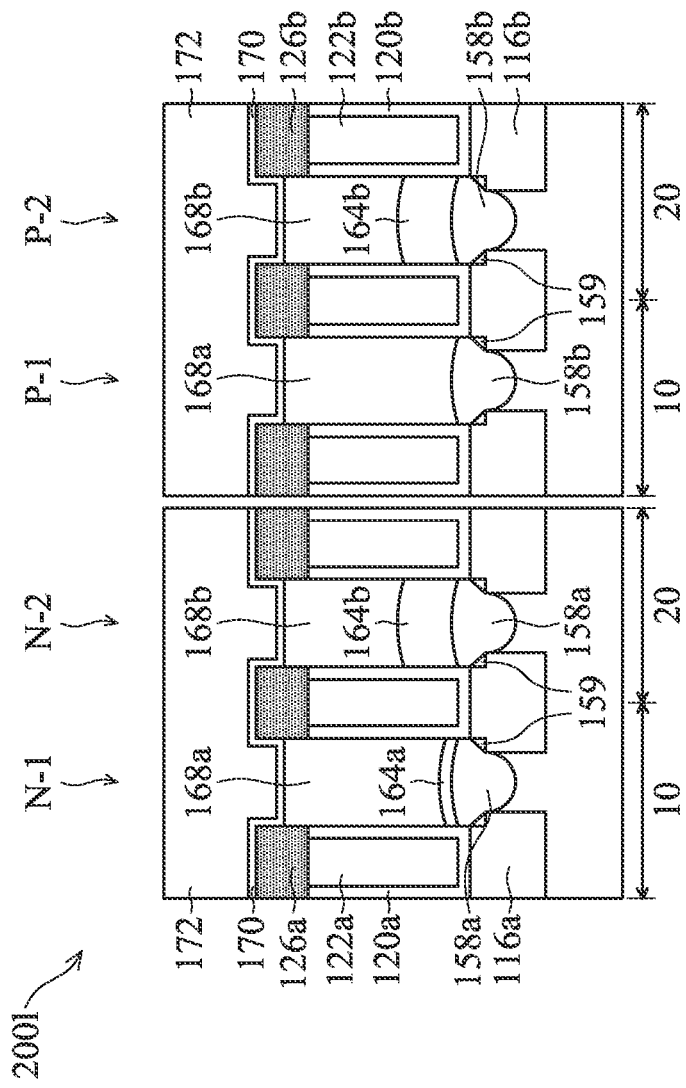

FIG. 14A-1 show a cross-sectional representation of the semiconductor device structure 200k along line $X_1$-$X_1$' and $X_2$-$X_2$' shown in FIG. 2K, in accordance with some embodiments of the disclosure. FIG. 14A-2 shows a cross-sectional representation of the semiconductor device structure 200k along line Y-Y' shown in FIG. 2K, in accordance with some embodiments of the disclosure. FIG. 14A'-2 shows a cross-sectional representation of forming the semiconductor device structure 200l.

The semiconductor structure 200k of FIG. 14A-1 includes elements similar to, or the same as, elements of the semiconductor structure 100a of FIG. 3P-1 (where like reference numerals refer to like elements), wherein FIG. 14A-1 illustrates that the first bottom layer 158*a* may have a curved top surface, and the first insulating layer 164*a* may have a curved top surface. In some embodiments, the top surface of the first insulating layer 164*a* is convex since the top surface of the first bottom layer 158*a* is convex. In addition, the second insulating layer 164*b* is also a curved top surface, and the top surface of the second insulating layer 164*b* is convex since the top surface of the second bottom layer 158*b* is convex.

As shown in FIG. 14A-2, the convex top surface of the first insulating layer 164*a* is lower than the convex top surface of the second insulating layer 164*b*.

FIG. 14A'-2 includes elements similar to, or the same as, elements of FIG. 14A-2 (where like reference numerals refer to like elements), wherein FIG. 14A'-2 illustrates that the first bottom layer 158*a* has the extending portion and the second bottom layer 158*b* has the extending portion.

Figures 1, 15A:
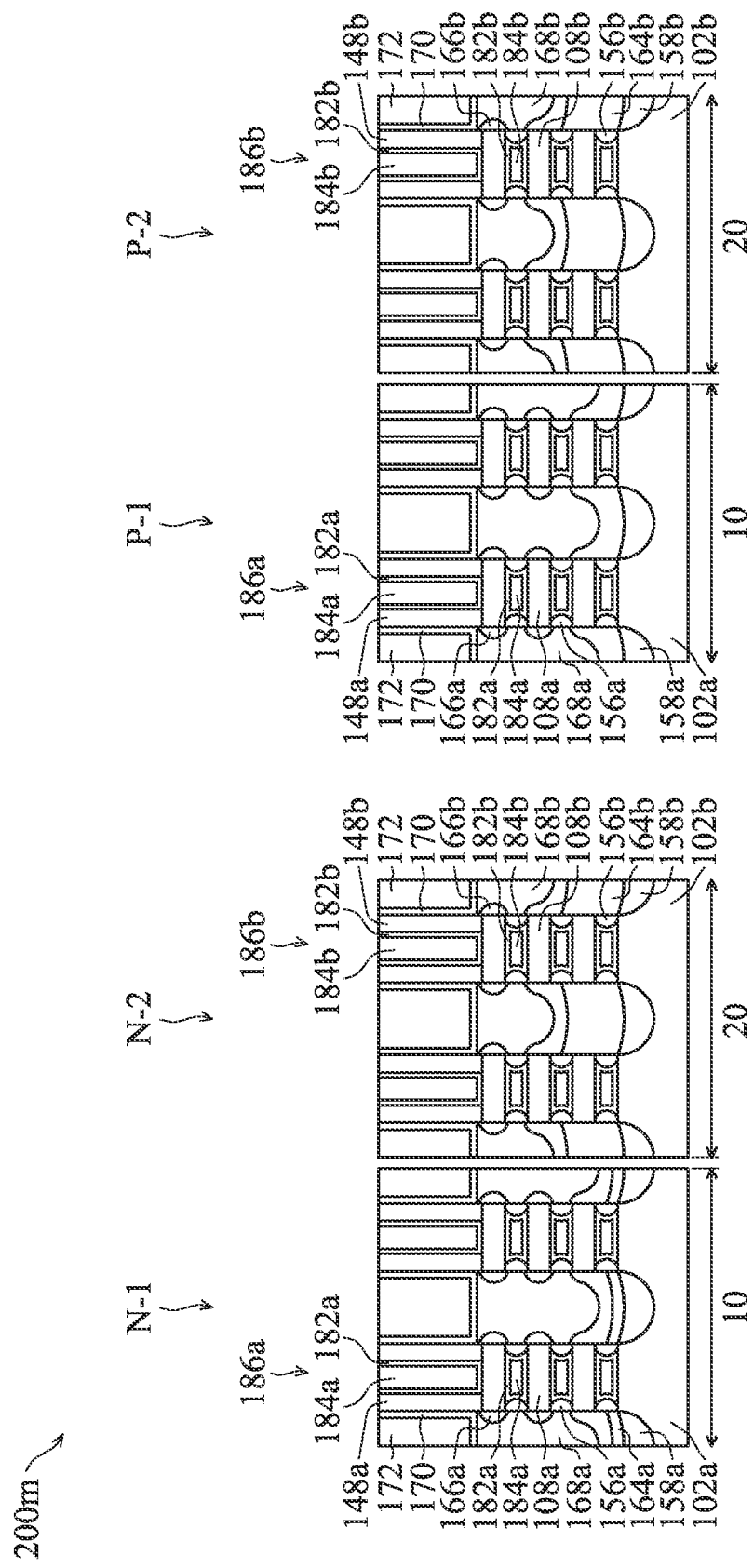
Figures 2, 15A:
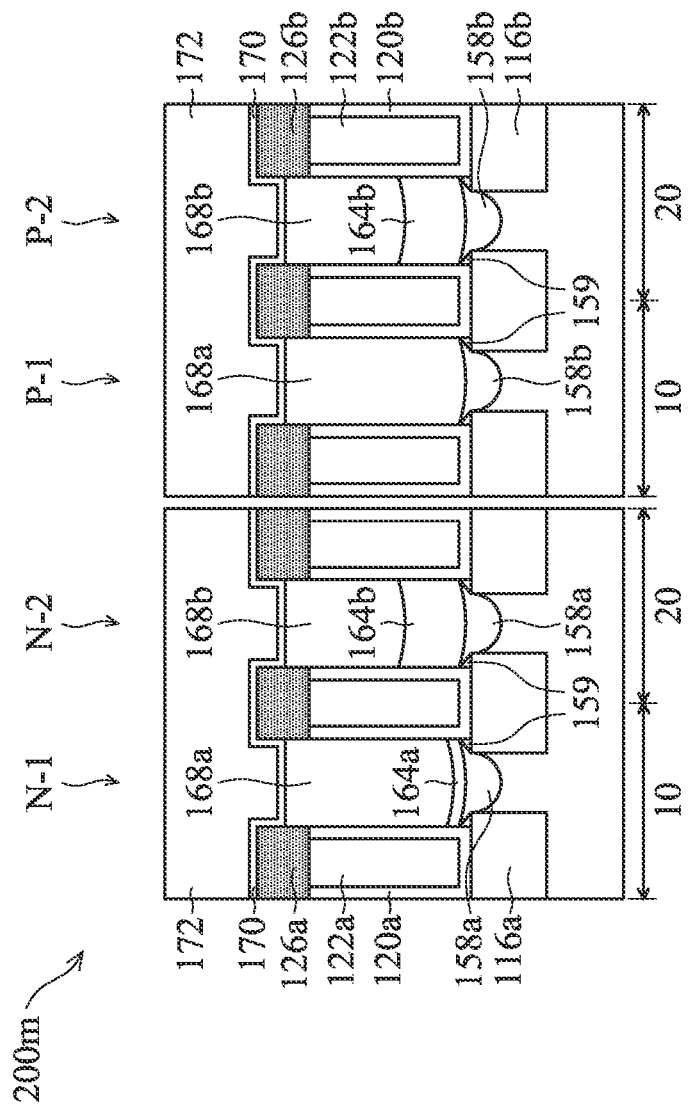
Figure 15A:
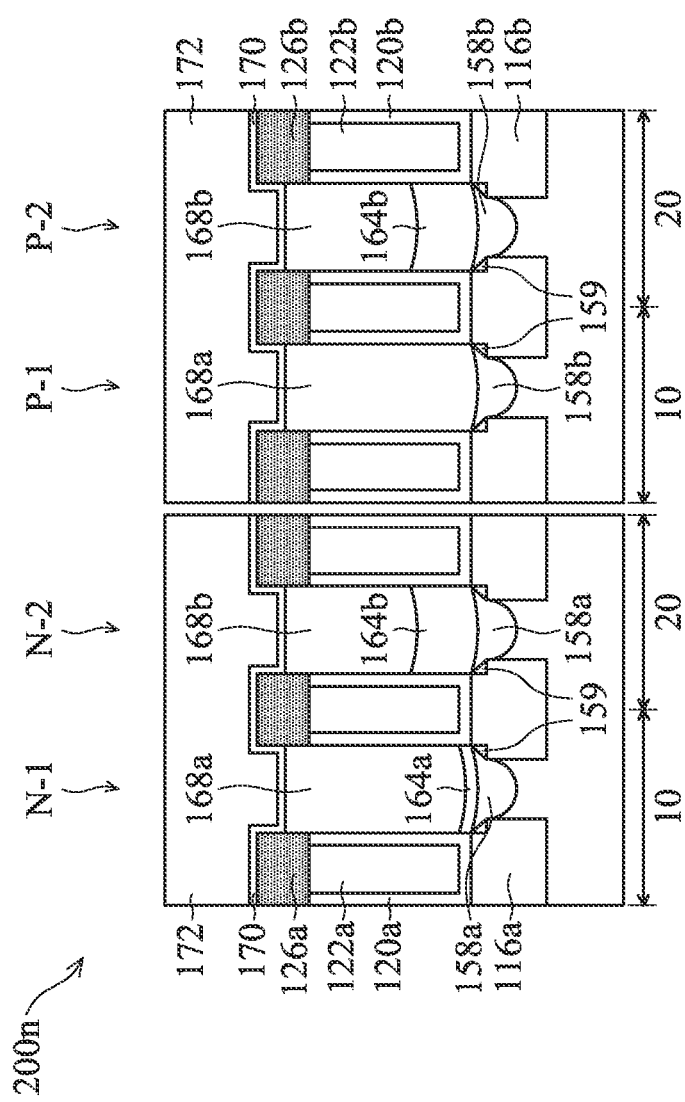

FIG. 15A-1 shows a cross-sectional representation of the semiconductor device structure 200*m* along line X$_1$-X$_1$' and X$_2$-X$_2$' shown in FIG. 2K, in accordance with some embodiments of the disclosure. FIG. 15A-2 shows a cross-sectional representation of the semiconductor device structure 200*m* along line Y-Y' shown in FIG. 2K, in accordance with some embodiments of the disclosure. FIG. 15A'-2 shows a cross-sectional representation of forming the semiconductor device structure 200*n*.

The semiconductor structure 200*m* of FIG. 15A-1 includes elements similar to, or the same as, elements of the semiconductor structure 100*a* of FIG. 3P-1 (where like reference numerals refer to like elements), wherein FIG. 15A-1 illustrates that the first bottom layer 158*a* may have a curved top surface, and the first insulating layer 164*a* may have a curved top surface. In some embodiments, the top surface of the first insulating layer 164*a* is concave since the top surface of the first bottom layer 158*a* is concave. In addition, the second insulating layer 164*b* is also has a curved top surface, and the top surface of the second insulating layer 164*b* is concave since the top surface of the second bottom layer 158*b* is concave As shown in FIG. 15A-2, the concave top surface of the first insulating layer 164*a* is lower than the concave top surface of the second insulating layer 164*b*.

FIG. 15A'-2 includes elements similar to, or the same as, elements of FIG. 15A-2 (where like reference numerals refer to like elements), wherein FIG. 15A'-2 illustrates that the first bottom layer 158*a* may have the extending portion and the second bottom layer 158*b* has the extending portion.

The first bottom layer 158*a* and the first insulating layer 164*a* are formed to reduce leakage current and to define the location of the active nanostructure (the second semiconductor layer 108*a*) in the transistor N-1. The first S/D structure is isolated from the first bottom layer 158*a* by the first insulating layer 164*a*. In addition, the second bottom layer 158*b* and the second insulating layer 164*b* are formed to reduce leakage current and to define the location of the active nanostructure (the second semiconductor layer 108*b*) in the transistors N-2 and P-2. The top surface of the second insulating layer 164*b* is higher than the bottommost one of the nanostructure, and therefore the bottommost nanostructure becomes a dummy nanostructure. Therefore, the effective (or active) nanostructure is controlled by the location and size of the second insulating layer 164*b*.

Embodiments for forming a semiconductor device structure and method for formation of the same are provided. In some embodiments the first fin structure formed over a substrate, and the first fin structure includes a number of nanostructures. A first bottom layer adjacent to the first fin structure, and a first insulating layer formed over the first layer. A second insulating layer formed over the second bottom layer. The second insulating layer is higher than a bottommost nanostructure, and therefore the effective (or active) nanostructure is controlled by the location of the second insulating layer. The multi-nanostructures co-exist by controlling the location of the first insulating layer. More effective (or active) nanostructures can improve the speed of the semiconductor device structure, and fewer effective (or active) nanostructures can increase the power efficiency. Therefore, the semiconductor device structure can include more effective (or active) nanostructures in a region for speed performance consideration and fewer effective (or active) nanostructures in another region for power efficiency consideration. Therefore, the performance of semiconductor device structure is improved.

In some embodiments, a semiconductor device structure is provided. The semiconductor device structure includes a first fin structure formed over a substrate, and the first fin structure includes a plurality of first nanostructures stacked in a vertical direction. The semiconductor device structure includes a first bottom layer formed adjacent to the first fin structure, and a first insulating layer formed over the first bottom layer. The semiconductor device structure includes a first source/drain (S/D) structure formed over the first insulating layer, and the first insulating layer is in direct contact with one of the first nanostructures.

In some embodiments, a semiconductor device structure is provided. The semiconductor device structure includes a substrate, and the substrate includes a first region and a second region. The semiconductor device structure includes a first fin structure formed over the first region, and the first fin structure includes a plurality of first nanostructures stacked in a vertical direction. The semiconductor device structure includes a second fin structure formed over the second region, and the second fin structure includes a plurality of second nanostructures stacked in a vertical direction. The semiconductor device structure includes a first insulating layer formed adjacent to the first fin structure, and a first S/D structure formed over the first insulating layer. The semiconductor device structure includes a second insulating layer formed adjacent to the second fin structure. The semiconductor device structure includes a second S/D structure formed over the second insulating layer, and a top surface of the second insulating layer is higher than a top surface of the first insulating layer.

In some embodiments, a method for forming a semiconductor device structure is provided. The method includes forming a first fin structure and a second fin structure over a substrate, the first fin structure includes a plurality of first semiconductor layers and a plurality of second semiconductor layers stacked in a vertical direction, and the second fin structure includes a plurality of first semiconductor layers and a plurality of second semiconductor layers stacked in a vertical direction. The method includes forming a dummy gate structure over the first fin structure and the second fin structure, and removing a portion of the first fin structure and a portion of the second fin structure to form a first recess and a second recess. The method also includes forming a first insulating layer in the first recess and adjacent to the first fin structure. The method includes forming a second insulating layer in the second recess and adjacent to the second fin structure, and forming a first source/drain (S/D) structure over the first insulating layer. The method includes forming a second S/D structure over the second insulating layer. The method further includes removing another portion of the first fin structure and another portion of the second fin structure to form a plurality of first nanostructure and a plurality of second nanostructures, wherein a top surface of the second insulating layer is higher than a bottommost one of the second nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, the method comprising:
    forming a first fin structure and a second fin structure over a substrate, wherein the first fin structure comprises a first plurality of first semiconductor layers and a first plurality of second semiconductor layers stacked in a vertical direction, and the second fin structure comprises a second plurality of the first semiconductor layers and a second plurality of the second semiconductor layers stacked in the vertical direction;
    forming a first dummy gate structure over the first fin structure and a second dummy gate structure over the second fin structure;
    removing a first portion of the first fin structure and a first portion of the second fin structure to form a first recess and a second recess, respectively;
    forming a first insulating layer in the first recess and adjacent to the first fin structure;
    forming a second insulating layer in the second recess and adjacent to the second fin structure;
    forming a first source/drain (S/D) structure over the first insulating layer;
    forming a second S/D structure over the second insulating layer;
    removing a second portion of the first fin structure to form a first plurality of first nanostructures; and
    removing a second portion of the second fin structure to form a second plurality of second nanostructures, wherein a top surface of the second insulating layer is higher than a top surface of a bottommost second nanostructure of the second plurality of second nanostructures.

2. The method of claim 1, further comprising:
    forming a first bottom layer in the first recess and a second bottom layer in the second recess, wherein forming the first insulating layer comprises forming the first insulating layer on the first bottom layer, and wherein forming the second insulating layer comprises forming the second insulating layer on the second bottom layer.

3. The method of claim 2, wherein the first bottom layer is a semiconductor material layer.

4. The method of claim 3, wherein the first bottom layer is undoped silicon.

5. The method of claim 1, further comprising:
    after forming the first recess, removing a portion of each of the first plurality of first semiconductor layers to form a third recess; and
    forming an inner spacer in the third recess, wherein forming the first insulating layer comprises forming the first insulating layer adjacent to the inner spacer, wherein the first insulating layer is in direct contact with the inner spacer.

6. The method of claim 1, wherein a top surface of the second insulating layer is higher than a top surface of the first insulating layer.

7. The method of claim 1, further comprising:
    forming a dielectric feature between the first fin structure and the second fin structure, wherein the dielectric feature comprises a liner layer and a filling layer formed over the liner layer, wherein the first insulating layer is in direct contact with the liner layer of the dielectric feature.

8. The method of claim 1, wherein forming the first insulating layer comprises:
    depositing a dielectric layer along sidewalls and a bottom surface of the first recess;
    performing a treatment on the dielectric layer to modify an etch rate of the dielectric layer on the bottom surface of the first recess; and
    removing portions of the dielectric layer along sidewalls of the first recess to form the first insulating layer.

9. A method for forming a semiconductor device structure, the method comprising:
    forming a first fin structure over a substrate, wherein the first fin structure comprises a first semiconductor strip, a second semiconductor strip over the first semiconductor strip, and a third semiconductor strip over the second semiconductor strip;
    forming a first dummy gate structure over the first fin structure;
    removing a first portion of the first fin structure adjacent to the first dummy gate structure to form a first recess;
    after removing the first portion of the first fin structure, depositing a first insulating layer along a bottom of the first recess, the first insulating layer being a solid dielectric material;
    after depositing the first insulating layer, forming a first source/drain structure over the first insulating layer, wherein a bottom surface of the first source/drain structure directly contacts an upper surface of the first insulating layer; and
    forming a first gate structure around the second semiconductor strip and the third semiconductor strip.

10. The method of claim 9, further comprising:
    prior to forming the first insulating layer, forming an undoped semiconductor layer along the bottom of the first recess, wherein forming the first insulating layer comprises forming the first insulating layer over the undoped semiconductor layer.

11. The method of claim 10, wherein the undoped semiconductor layer is an undoped silicon layer.

12. The method of claim 10, wherein the first source/drain structure is electrically isolated from the undoped semiconductor layer by the first insulating layer.

13. The method of claim 9, wherein an upper surface of the first insulating layer is lower than a bottom surface of the first semiconductor strip, the first semiconductor strip being a closest semiconductor strip to the substrate.

14. The method of claim 9, wherein the first insulating layer completely covers a sidewall of the first semiconductor strip.

15. The method of claim 9, further comprising:
    forming a second fin structure over the substrate, wherein the second fin structure comprises a fourth semiconductor strip, a fifth semiconductor strip over the fourth semiconductor strip, and a sixth semiconductor strip over the fifth semiconductor strip;

forming a second dummy gate structure over the second fin structure;

removing a first portion of the second fin structure to form a second recess;

forming a second insulating layer along a bottom of the second recess, wherein a thickness of the first insulating layer is different than a thickness of the second insulating layer;

forming a second source/drain (S/D) structure over the second insulating layer; and forming a second gate structure around the fifth semiconductor strip and sixth semiconductor strip.

16. A method for forming a semiconductor device structure, the method comprising:

forming a first fin structure and a second fin structure over a substrate, wherein the first fin structure comprises a first plurality of semiconductor layers stacked in a vertical direction, and the second fin structure comprises a second plurality of the semiconductor layers stacked in the vertical direction;

forming a first dummy gate structure over the first fin structure and a second dummy gate structure over the second fin structure;

removing a first portion of the first fin structure adjacent to the first dummy gate structure to form a first recess;

removing a first portion of the second fin structure adjacent to the second dummy gate structure to form a second recess;

after removing the first portion of the first fin structure, depositing a first semiconductor layer in the first recess;

after removing the first portion of the second fin structure, forming a second semiconductor layer in the second recess;

forming a first insulating layer over the first semiconductor layer in the first recess;

forming a second insulating layer over the second semiconductor layer in the second recess;

forming a first source/drain structure over the first insulating layer;

forming a second source/drain structure over the second insulating layer;

forming a first gate structure around one or more of the semiconductor layers of the first plurality of semiconductor layers; and forming a second gate structure around one or more of the semiconductor layers of the second plurality of semiconductor layers.

17. The method of claim 16, wherein the first semiconductor layer and the second semiconductor layer are undoped silicon.

18. The method of claim 16, wherein an upper surface of the first semiconductor layer is lower than a lower surface of a lowermost semiconductor layer of the first plurality of semiconductor layers, wherein an upper surface of the second semiconductor layer is lower than a lower surface of a lowermost semiconductor layer of the second plurality of semiconductor layers.

19. The method of claim 18, wherein a thickness of the first insulating layer is different than a thickness of the second insulating layer.

20. The method of claim 16, wherein at least one of the semiconductor layers of the first plurality of semiconductor layers is a dummy channel layer.

* * * * *